United States Patent
Okamoto

(10) Patent No.: US 7,422,984 B2
(45) Date of Patent: *Sep. 9, 2008

(54) METHOD OF MANUFACTURING A SEMICONDUCTOR DEVICE

(75) Inventor: Satoru Okamoto, Kanagawa (JP)

(73) Assignee: Semiconductor Energy Laboratory Co., Ltd., Atsugi-Shi, Kanagawa-Ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/876,737

(22) Filed: Jun. 28, 2004

(65) Prior Publication Data

US 2005/0042785 A1    Feb. 24, 2005

Related U.S. Application Data

(63) Continuation of application No. 10/287,588, filed on Nov. 5, 2002, now Pat. No. 6,773,944.

(30) Foreign Application Priority Data

Nov. 7, 2001    (JP)    ............... 2001-342212

(51) Int. Cl.
H01L 21/335    (2006.01)
H01L 29/786    (2006.01)
H01L 21/3065    (2006.01)

(52) U.S. Cl. ............ 438/720; 438/151; 438/161

(58) Field of Classification Search .......... 438/30, 438/151, 154, 155, 161, 166, 711, 715, 720, 438/149

See application file for complete search history.

(56) References Cited

U.S. PATENT DOCUMENTS 5,604,139 A    2/1997    Codama et al.

(Continued)

FOREIGN PATENT DOCUMENTS

EP    1071124 A2    1/2001

(Continued)

OTHER PUBLICATIONS

Hatano et al.; "A Novel Self-aligned Gate-overlapped LDD Poly-Si TFT with High Reliability and Performance"; *International Electron Devices Meeting 1997*; pp. 523-526; Dec. 7-10, 1997.

*Primary Examiner*—Zandra Smith
*Assistant Examiner*—Pamela E Perkins
(74) *Attorney, Agent, or Firm*—Fish & Richardson P.C.

(57) ABSTRACT

A semiconductor device is provided which is constituted by semiconductor devices including a thin film transistor with a GOLD structure, the GOLD structure thin film transistor being such that: a semiconductor layer, a gate insulating film, and a gate electrode are formed in lamination from the side closer to a substrate; the gate electrode is constituted of a first-layer gate electrode and a second-layer gate electrode shorter in the size than the first-layer gate electrode; the first-layer gate electrode corresponding to the region exposed from the second-layer gate electrode is formed into a tapered shape so as to be thinner toward the end portion; a first impurity region is formed in the semiconductor layer corresponding to the region with the tapered shape; and a second impurity region having the same conductivity as the first impurity region is formed in the semiconductor layer corresponding to the outside of the first-layer gate electrode, which is characterized in that a dry etching process consisting of one step or two steps is applied to the formation of the gate electrode.

42 Claims, 21 Drawing Sheets

U.S. PATENT DOCUMENTS

| | | | |
|---|---|---|---|
| 5,773,333 A | 6/1998 | Jo | 438/179 |
| 5,955,850 A | 9/1999 | Yamaguchi et al. | 313/495 |
| 6,004,831 A | 12/1999 | Yamazaki et al. | 438/30 |
| 6,030,667 A | 2/2000 | Nakagawa et al. | |
| 6,093,457 A | 7/2000 | Okumura et al. | |
| 6,316,297 B1 | 11/2001 | Matsuda | 438/174 |
| 6,365,917 B1 * | 4/2002 | Yamazaki | 257/72 |
| 6,475,836 B1 | 11/2002 | Suzawa et al. | |
| 6,515,336 B1 | 2/2003 | Suzawa et al. | |
| 6,596,598 B1 | 7/2003 | Krivokapic et al. | 438/301 |
| 6,605,497 B2 | 8/2003 | Yamazaki et al. | 438/166 |
| 6,653,216 B1 | 11/2003 | Shimomaki et al. | 438/608 |
| 6,706,544 B2 | 3/2004 | Yamazaki et al. | |
| 6,773,944 B2 * | 8/2004 | Okamoto | 438/30 |
| 2001/0030322 A1 | 10/2001 | Yamazaki et al. | |
| 2001/0049197 A1 | 12/2001 | Yamazaki et al. | |
| 2001/0052950 A1 | 12/2001 | Yamazaki et al. | |
| 2001/0055841 A1 | 12/2001 | Yamazaki et al. | |
| 2002/0006705 A1 | 1/2002 | Suzawa et al. | |
| 2002/0013022 A1 | 1/2002 | Yamazaki et al. | |
| 2002/0016028 A1 | 2/2002 | Arao et al. | |
| 2002/0017685 A1 | 2/2002 | Kasahara et al. | |
| 2002/0044124 A1 * | 4/2002 | Yamazaki et al. | 345/92 |
| 2002/0110941 A1 | 8/2002 | Yamazaki et al. | |
| 2005/0056934 A1 | 3/2005 | Suzawa et al. | |

FOREIGN PATENT DOCUMENTS

| | | |
|---|---|---|
| JP | 07-202210 | 8/1995 |
| JP | 07-226518 | 8/1995 |
| JP | 08-274336 | 10/1996 |
| JP | 9-279367 | 10/1997 |
| JP | 09-293600 | 11/1997 |
| JP | 11-307777 | 11/1999 |
| JP | 2001-035808 | 2/2001 |
| JP | 2001-281704 | 10/2001 |
| JP | 2002-108243 | 4/2002 |

* cited by examiner (DRY ETCHING CONDITIONS OF ONE-STEP PROCESS)

MATERIAL TO BE ETCHED : W FILM (370 nm), TaN FILM (30 nm)
ETCHING GAS (GAS FLOW RATE) : SF6 (24 sccm), Cl2 (12 sccm),
                               O2 (24 sccm)
CHAMBER PRESSURE : 1.3 Pa
ICP POWER (ICP POWER DENSITY) : 700 W (1.427 W/cm2)
BIAS POWER (BIAS POWER DENSITY) : 10 W (0.064 W/cm2)

FIG. 2A

END PORTIONS OF INITIAL RESIST PATTERN

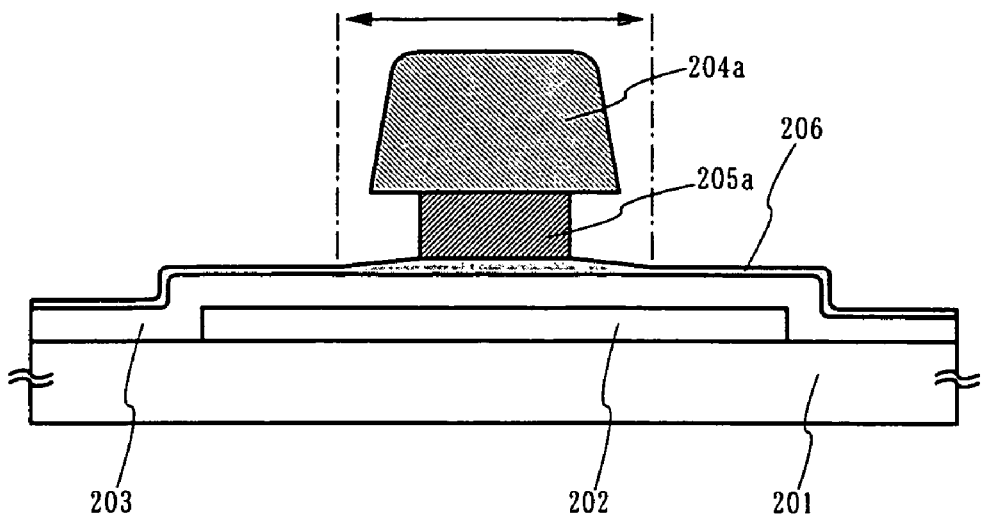

FIG. 2B

END PORTIONS OF INITIAL RESIST PATTERN

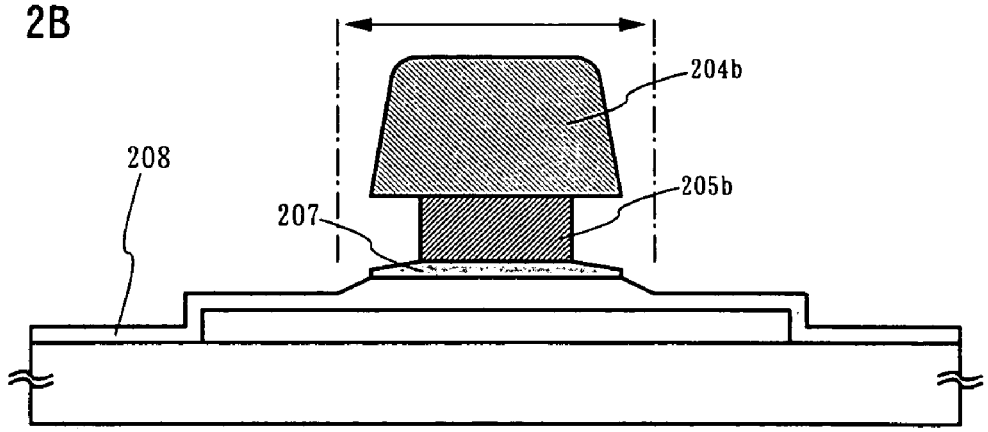

(DRY ETCHING CONDITIONS OF TWO-STEP PROCESS)

(1) 1st STEP
MATERIAL TO BE ETCHED : W FILM (370 nm)
ETCHING GAS (GAS FLOW RATE) : SF6(24 sccm), Cl2 (12 sccm), O2 (30 sccm)
CHAMBER PRESSURE : 1.3 Pa
ICP POWER (IPC POWER DENSITY : 700 W (1.427 W/cm2)
BIAS POWER (BIAS POWER DENSITY) : 10 W (0.064 W/cm2)

(2) 2nd STEP
MATERIAL TO BE ETCHED : TaN FILM (30 nm)
ETCHING GAS (GAS FLOW RATE) : Cl2 (60 sccm)
CAHMBER PRESSURE: 1.0 Pa
ICP POWER (IPC POWER DENSITY : 350 W (0.713 W/cm2)
BIAS POWER (BIAS POWER DENSITY) : 20 W (0.128 W/cm2)

701: PIXEL TFFT (LDD STRUCTURE)   702: N-CH DRIVER CIRCUIT (GOLD STRUCTURE)   703: P-CH DRIVER CIRCUIT (GOLD STRUCTURE)

701: PIXEL TFT
(LDD STRUCTURE)

702: N-CH DRIVER CIRCUIT
(GOLD STRUCTURE)

703: P-CH DRIVER CIRCUIT
(GOLD STRUCTURE)

901: PIXEL TFT (LDD STRUCTURE)     902: N-CH DRIVER CIRCUIT (GOLD STRUCTURE)     903: P-CH DRIVER CIRCUIT (GOLD STRUCTURE)

901: PIXEL TFT (LDD STRUCTURE)   902: N-CH DRIVER CIRCUIT (GOLD STRUCTURE)   903: P-CH DRIVER CIRCUIT (GOLD STRUCTURE)

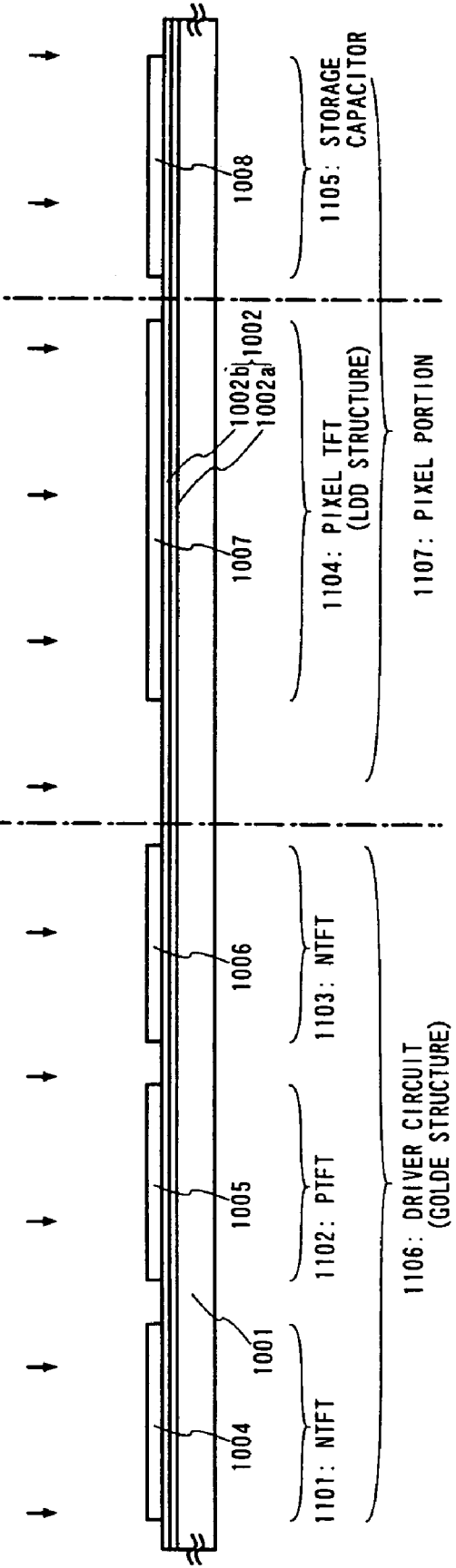

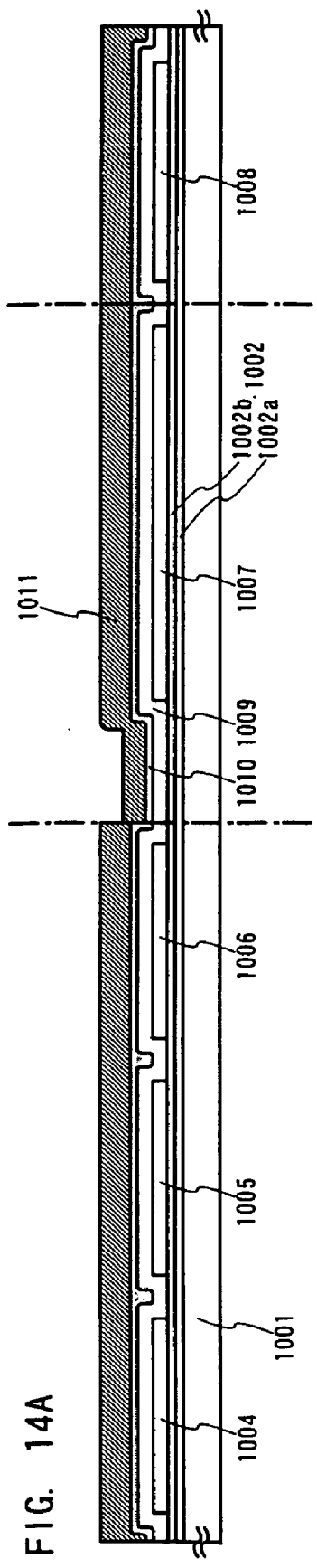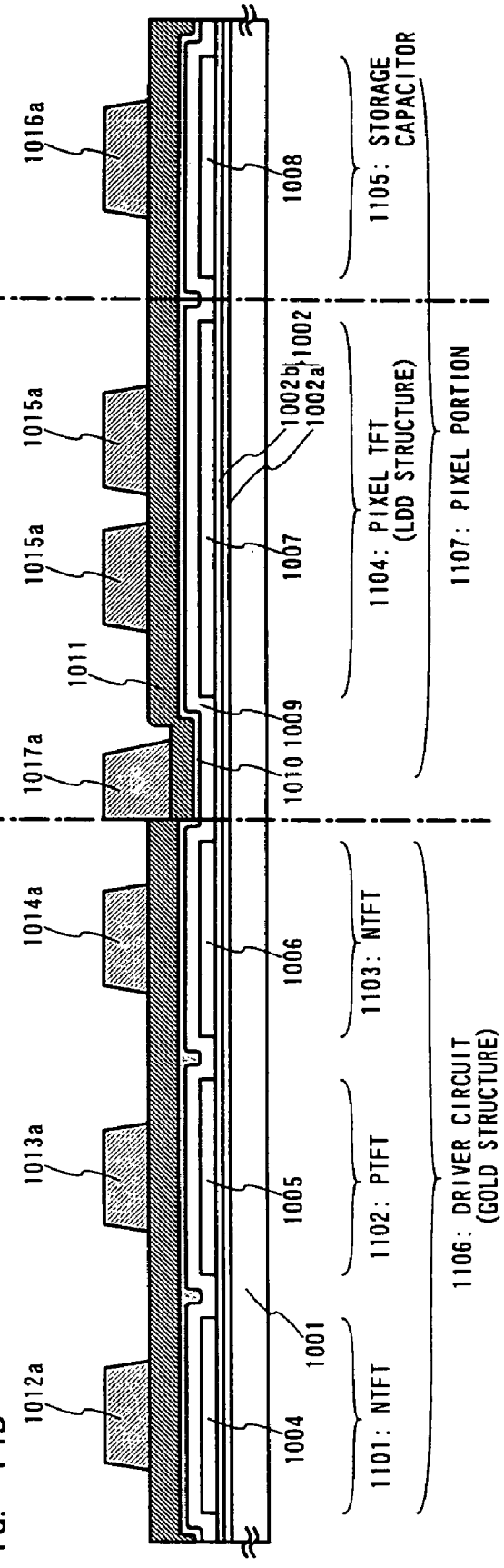
FIG. 14A
FIG. 14B

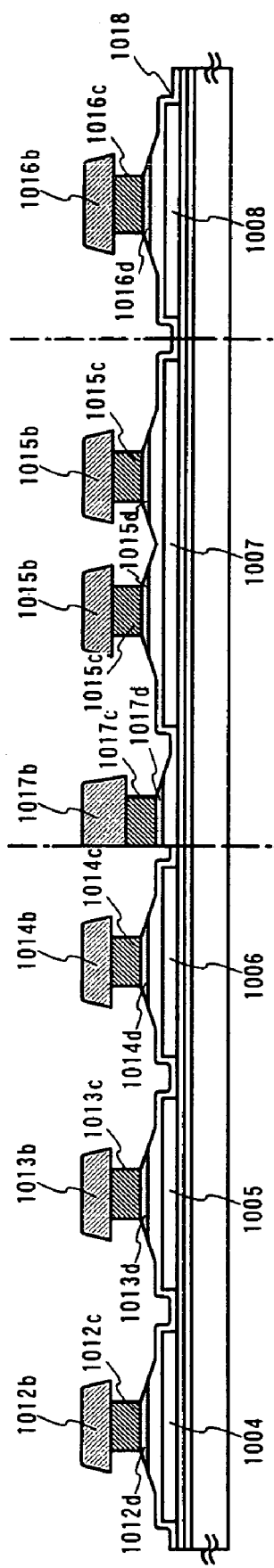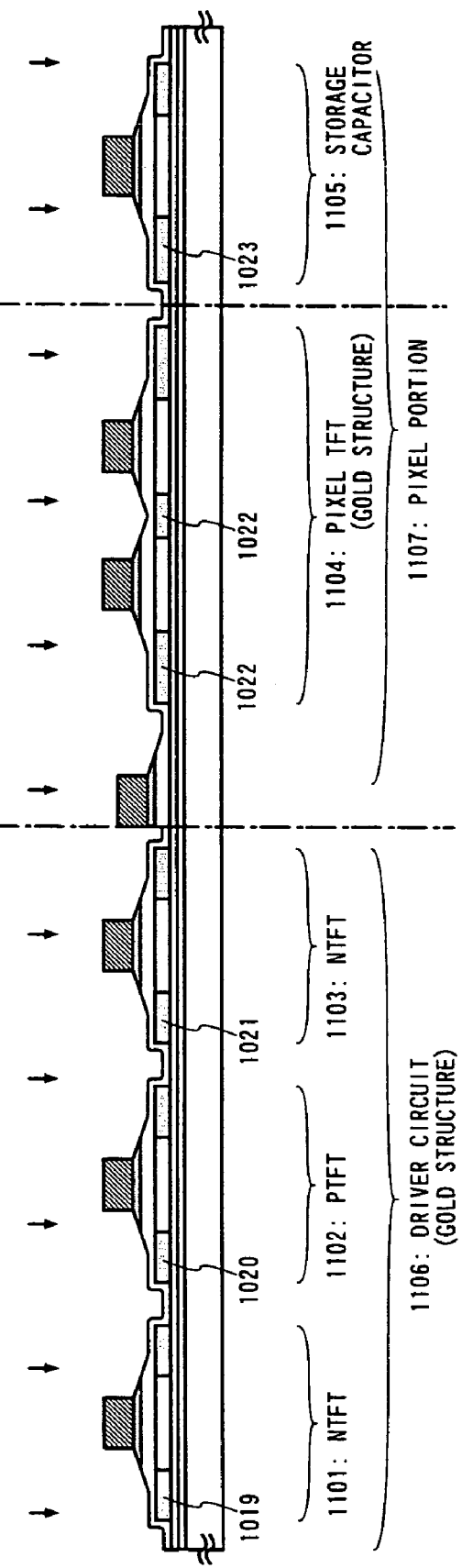
FIG. 15A
FIG. 15B

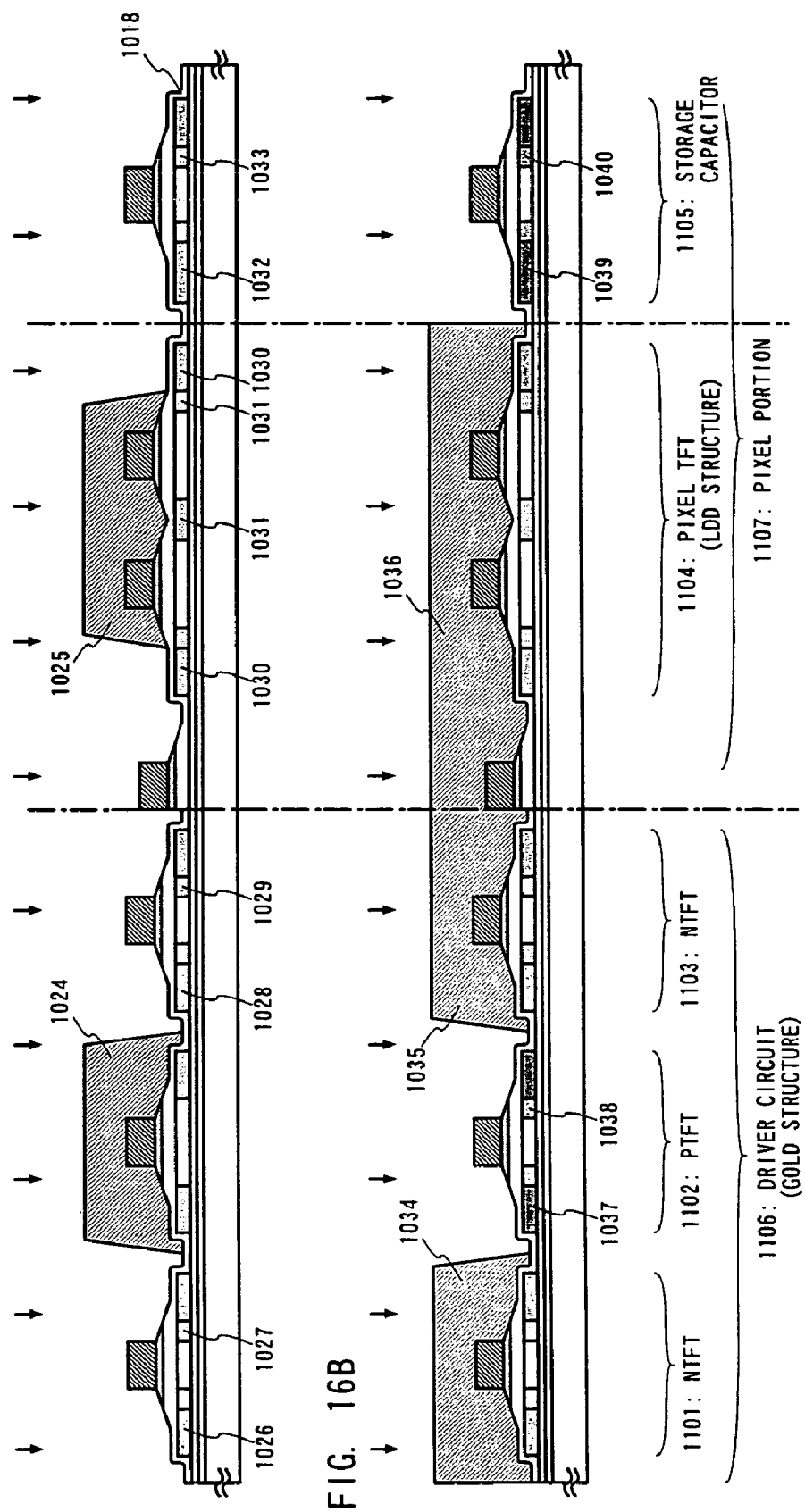

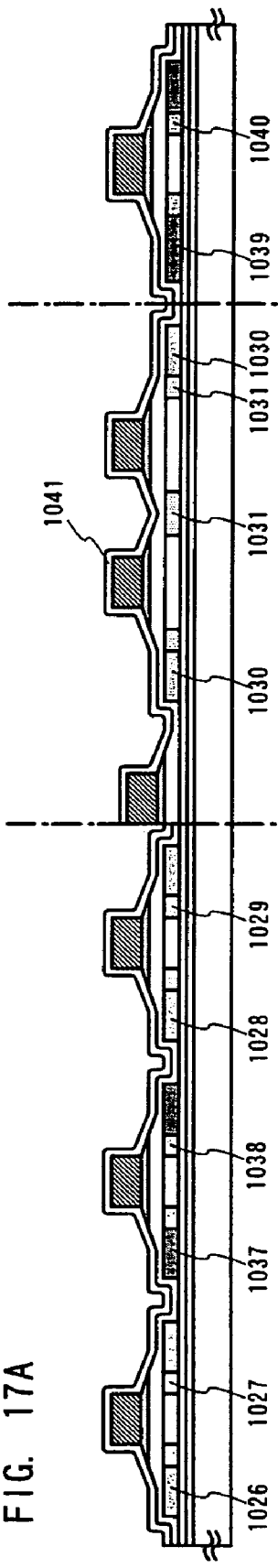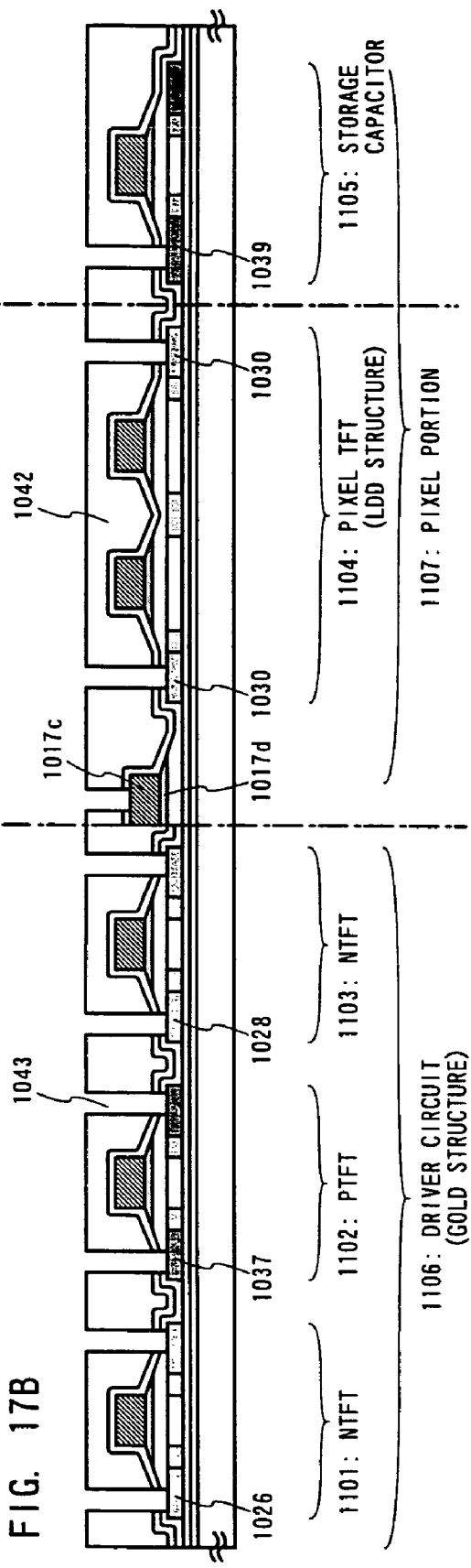

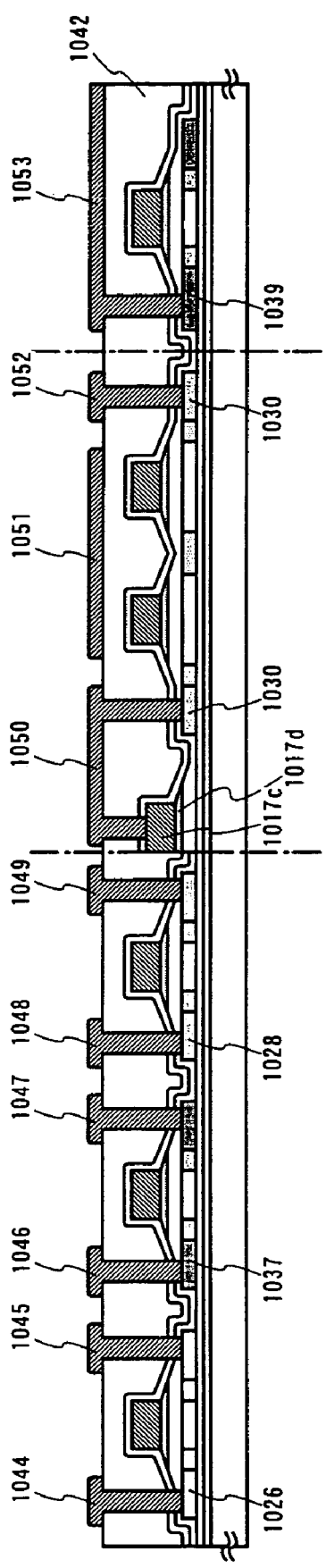
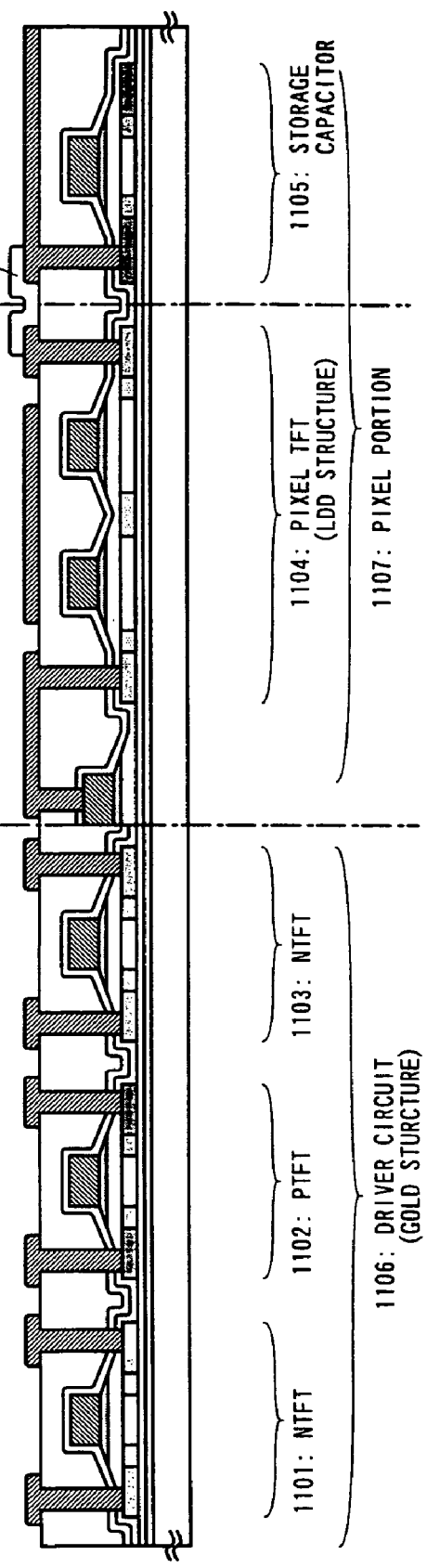
FIG. 18A
FIG. 18B

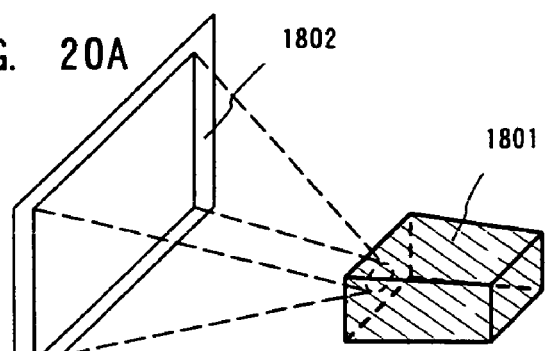
FIG. 20A
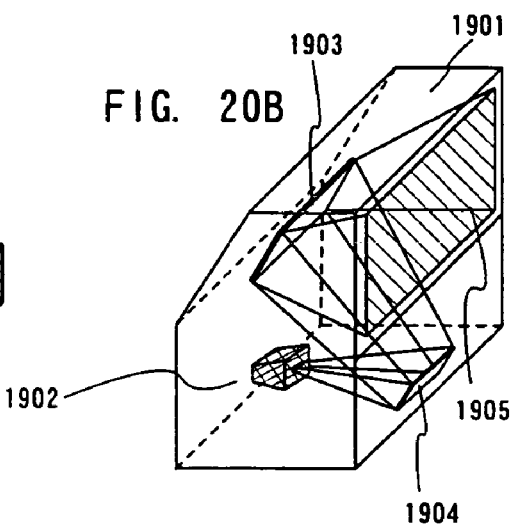
FIG. 20B
FIG. 20C
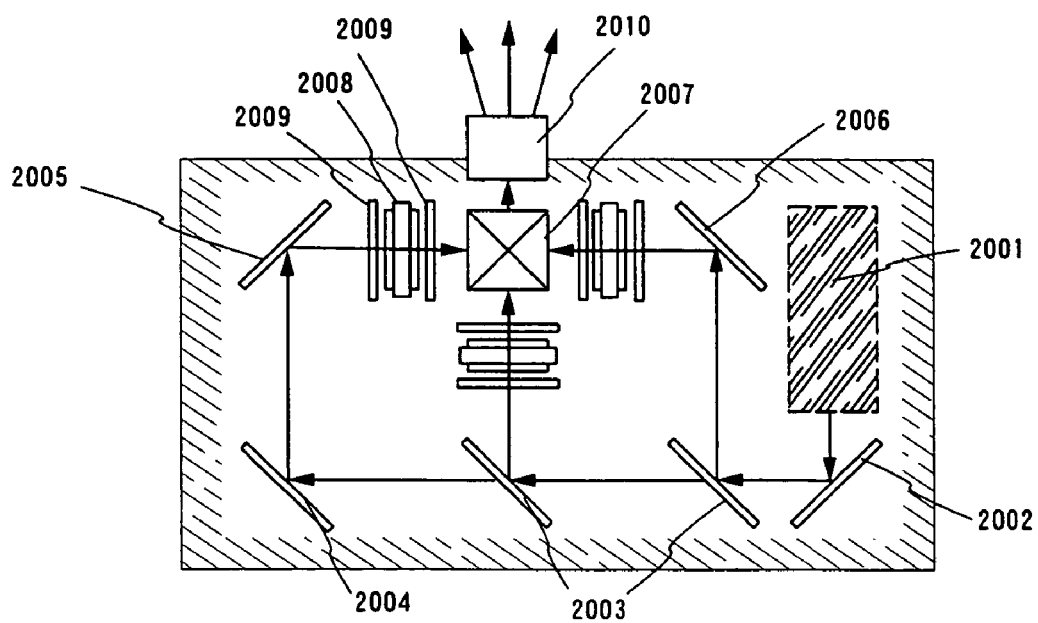
FIG. 20D
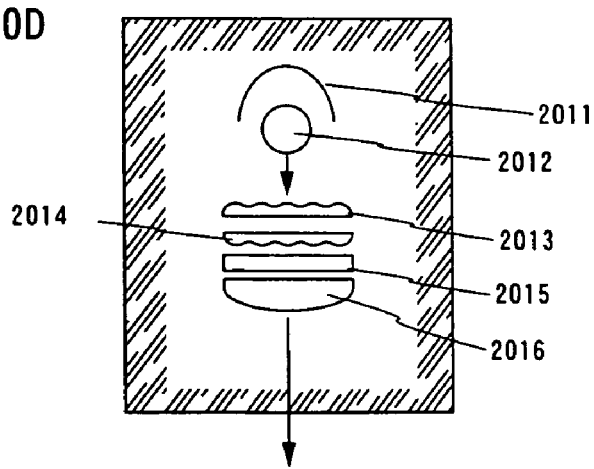

METHOD OF MANUFACTURING A SEMICONDUCTOR DEVICE

CROSS-REFERENCE TO RELATED APPLICATIONS

This application is a continuation (and claims the benefit of priority under 35 USC 120) of U.S. application Ser. No. 10/287,588, filed Nov. 5, 2002, now U.S. Pat. No. 6,773,944, which, under 35 USC 119, claims the benefit of a foreign priority application filed in Japan as Serial No. 2001-342212 on Nov. 7, 2001. This application claims priority to both of these applications, and both of these applications are incorporated by reference.

BACKGROUND OF THE INVENTION

1. Field of the Invention

The present invention relates to a semiconductor device and a method of manufacturing the same, and particularly to a thin film transistor (hereinafter referred to as TFT) with a GOLD (abbreviated form of "gate-overlapped-LDD") structure and a method of manufacturing the same. Note that the semiconductor device in this specification indicates semiconductor devices in general the circuit of which is configured by semiconductor devices including a TFT with a GOLD structure. For example, semiconductor display devices such as an active matrix liquid crystal display device and an organic EL (abbreviated form of "electro-luminescence") display device are included in the category of the semiconductor device.

2. Description of the Related Art

In semiconductor display devices, such as an active matrix liquid crystal display device and an organic EL display device, the circuit of which is configured by TFTs on a transparent insulating substrate such as a glass substrate, a polycrystalline silicon TFT having a high field-effect mobility has attracted attention. A polycrystalline silicon film applied to the polycrystalline silicon TFT has a higher field-effect mobility of an electron or hole than a conventional amorphous silicon film, and thus has an advantage that integration of not only a pixel transistor but also a driver circuit as a peripheral circuit can be realized. Therefore, each company has been advancing the development of an active matrix semiconductor display device the circuit of which is configured by polycrystalline silicon TFTs.

In the polycrystalline silicon TFT, it has a high field-effect mobility, but on the other hand, there is observed deterioration phenomena such as lowering of the field-effect mobility or an ON current (current that flows in an ON state) and increase in an OFF current (current that flows in an OFF state) when the polycrystalline silicon TFT is continuously driven. These have been problems in terms of reliability. The deterioration phenomenon is called a hot carrier phenomenon, and is known to be caused by hot carriers generated due to a high electric field in the vicinity of a drain.

The hot carrier phenomenon is one first discovered in a MOS (abbreviated form of "metal oxide semiconductor") transistor which is manufactured on a semiconductor substrate, and it has been found that the cause of the phenomenon is the high electric field in the vicinity of a drain. Various basic examinations have been made for measures against hot carriers. The MOS transistor with a design rule of 1.5 μm or less adopts an LDD (abbreviated form of "lightly doped drain") structure. In the LDD structure, an n-type or p-type low concentration impurity region ($n^-$ region or $p^-$ region) is formed in a drain end portion by utilizing a gate side wall that is comprised of an insulating film, and a gradient is imparted to an impurity concentration of a drain junction, thereby relaxing an electric field concentration in the vicinity of a drain. Here, an n-type low concentration impurity region and an n-type high concentration impurity region are respectively called an $n^-$ region and an $n^+$ region, and a p-type low concentration impurity region and a p-type high concentration impurity region are respectively called a $p^-$ region and a $p^+$ region.

However, in the LDD structure, the resistance of the low concentration impurity region ($n^-$ region or $p^-$ region) is large while a drain withstand voltage is improved much compared with a single drain structure. Thus, the LDD structure has a defect that a drain current decreases. Further, there has been the problem of a deterioration mode peculiar to the LDD in which: a high electric field region exists just under the side wall; impact ionization becomes maximum there; hot electrons are implanted into the side wall; and thus, the low concentration impurity region ($n^-$ region or $p^-$ region) is depleted, and the resistance is further increased. The above-mentioned problem has been tangible along with the reduction of a channel length. Thus, as to the MOS transistor with a design rule of 0.5 μm or less, the GOLD structure is developed in which a low concentration impurity region ($n^-$ region or $p^-$ region) is formed so as to overlap with an end portion of a gate electrode as a structure for overcoming the above-mentioned problem, and the application of the structure to mass production has been advancing.

Under the above-mentioned background, as to the polycrystalline silicon TFT manufactured on a transparent insulating substrate such as a glass substrate as well, the development of the LDD structure or GOLD structure has been progressing with the purpose of relaxing a high electric field in the vicinity of a drain, similar to the MOS transistor. The LDD structure is such that an n-type or p-type low concentration impurity region ($n^-$ region or $p^-$ region) that functions as an electric field relaxation region is formed in a semiconductor layer comprised of a polycrystalline silicon film corresponding to the outside of a gate electrode, and a high concentration impurity region ($n^+$ region or $p^+$ region) with the same conductivity as a source region or drain region is formed outside thereof. The LDD structure concerned has an advantage that an OFF current is small and a disadvantage that a hot carrier suppression effect due to relaxation of an electric field in the vicinity of a drain is small. On the other hand, in the GOLD structure, a low concentration impurity region ($n^-$ region or $p^-$ region) is formed so as to overlap with an end portion of a gate electrode. Thus, the GOLD structure has an advantage that a hot carrier suppression effect is large and a disadvantage that an OFF current increases, in comparison with the LDD structure.

As described above, each of the LDD structure and the GOLD structure has good points and bad points. Thus, in the actual semiconductor display device, from the viewpoint of quality improvement of the semiconductor display device, there is examined the effective combination in circuit configuration of a low OFF current characteristic of the LDD structure and a high hot carrier resistance of the GOLD structure. Specifically, in the case of a pixel TFT in a pixel region, the gate structure is preferable in which importance is placed on reduction in an OFF current value rather than high reliability to a hot carrier, and thus, the LDD structure having a low OFF current characteristic is suitable. On the other hand, in the case of a peripheral circuit consisting of a driver circuit, the gate structure is preferable in which importance is placed on high reliability to a hot carrier rather than a low OFF current characteristic, and thus, the GOLD structure having high hot carrier resistance is suitable. Therefore, the recent semiconductor display device the circuit of which is configured by a polycrystalline silicon TFT has a tendency that a pixel TFT in a pixel region is comprised of an LDD structure TFT, and a peripheral circuit is comprised of a GOLD structure TFT.

Note that, as to a known example on an n-channel polycrystalline silicon GOLD structure TFT, the structure and basic characteristics of the n-channel GOLD structure TFT are disclosed in Mutsuko Hatano, Hajime Akimoto, and Takeshi Sakai, IEDM97 TECHNICAL DIGEST, p523-526, 1997. In the structure of the GOLD structure TFT examined here, a gate electrode and a side wall for LDD are formed of polycrystalline silicon, an n-type low concentration impurity region (n⁻ region) that functions as an electric filed relaxation region is formed in an active layer (formed of polycrystalline silicon) just under the side wall for LDD, and a high concentration impurity region (n⁺ region) with the same conductivity which functions as a source region or drain region is formed outside thereof. As to the basic characteristics, a large drain current is obtained together with relaxation of a drain electric field, and a large suppression effect against a drain-avalanche-hot-carrier is obtained in comparison with the general LDD structure TFT.

Further, as to another example on the GOLD structure TFT, there are disclosed in JP 7-202210A, "a thin film transistor with an LDD structure which is characterized in that a gate electrode takes a structure of two layers having different widths, the upper layer of which has a smaller width than that of the lower layer" and "a method of manufacturing a thin film transistor with an LDD structure which is characterized in that: there is formed a gate electrode with a structure of two layers having different widths, the upper layer of which has a smaller width than that of the lower layer; and then, ions are implanted in a region that serves as a source or a drain using the gate electrode as a mask". In JP 7-202210A concerned, there is described that "an acceleration voltage and an ion implantation amount at the time of ion implantation are appropriately selected, whereby an n⁺ region (or p⁺ region) in a region with no gate electrode, an n⁻ region (or p⁻ region) in a region only with a layer of a gate electrode, and an intrinsic (state with no ion implantation) region in a region with two layers of a gate electrode are simultaneously formed at the time of ion implantation". There is provided a structure in which an n⁻ region (or p⁻ region) that is an electric field relaxation region overlaps with an end portion of a gate electrode, and therefore, the invention relating to the GOLD structure TFT is substantially disclosed.

In JP 2001-281704A, there is disclosed a method of manufacturing a GOLD structure TFT, including forming a gate electrode with a laminate structure of two layers and performing a dry etching process consisting of a large number of process steps comprising taper etching and anisotropic etching.

In JP 7-226518A, there is disclosed the invention in which: a film formed of a material constituting a gate electrode is formed; a mask is formed on the film formed of a material constituting the gate electrode; side etching is performed to the film formed of a material constituting the gate electrode to form a gate electrode having a smaller width than that of the mask; and an impurity is introduced into a semiconductor film to form an LDD region.

The development of the GOLD structure TFT excellent in hot-carrier resistance is being progressed in out company as well, and the structure of a typical GOLD structure TFT is described below with reference to FIGS. 3A and 3B. FIG. 3A is a sectional view of a GOLD structure TFT only having the Lov region. FIG. 3B is a sectional view of a GOLD structure TFT having both an Lov region and an Loff region. Note that, in this specification, an electric field relaxation region that overlaps with a gate electrode is referred to as an Lov region, and an electric field relaxation region that does not overlap with a gate electrode is referred to as an Loff region.

In the structure of the GOLD structure TFT only having an Lov region (FIG. 3A), on a transparent insulating substrate 301, an island-like semiconductor layer 302, a gate insulating film 303, and a gate electrode 304 are laminated from the side closer to the substrate 301, and a source region 305 and a drain region 306 are formed in the island-like semiconductor layer 302 outside the gate electrode 304. The above GOLD structure TFT is characterized in that: the gate electrode 304 is constituted of a first-layer gate electrode 304a and a second-layer gate electrode 304b; the first-layer gate electrode 304a is formed longer in size in a channel direction than the second-layer gate electrode 304b; electric field relaxation regions, that is, Lov regions 307 are formed in the island-like semiconductor layer 302 corresponding to the regions of the first-layer gate electrode 304a which are exposed from the second-layer gate electrode 304b; and the source region 305 and the drain region 306 are formed in the island-like semiconductor layer 302 corresponding to the outside of the gate electrode 304.

In the GOLD structure TFT with the above structure, the Lov region 307 is an electric field relaxation region formed so as to overlap with an end portion of the first-layer gate electrode 304a, and consists of an n-type or p-type low concentration impurity region (n⁻ region or p⁻ region). The Lov region 307 has a concentration gradient the impurity concentration of which gradually increases toward the source region 305 or the drain region 306 which is an n-type or p-type high concentration impurity region (n⁺ region or p⁺ region), and has a characteristic that electric field concentration in a depletion layer in the vicinity of the drain region 306 is further effectively relaxed. The concentration gradient of the Lov region 307 is formed by a method including accelerating an n-type or p-type impurity element in an electric field and making the impurity element pass through a laminate film of the first-layer gate electrode 304a corresponding to the region that is exposed from the second-layer gate electrode 304b and the gate insulating film 303 to be implanted into the island-like semiconductor layer 302 (through-doping method). The formation of the concentration gradient arises from the fact that the first-layer gate electrode 304a (the gate insulating film 303 is irrelevant because it does not change in thickness) which is the upper layer film of the island-like semiconductor layer 302 becomes thinner toward the end portion in implanting the impurity to the island-like semiconductor layer 302 with the through-doping method. Note that, in this specification, a doping method in which an impurity is made to pass through a certain substance layer positioned as the upper layer of an object substance layer to be implanted thereto is referred to as "through-doping method" for the sake of convenience.

Further, in the structure of the GOLD structure TFT having both an Lov region and an Loff region (FIG. 3B), on a transparent insulating substrate 401, an island-like semiconductor layer 402, a gate insulating film 403, and a gate electrode 404 are laminated from the side closer to the substrate 401, and a source region 405 and a drain region 406 are formed in the island-like semiconductor layer 402 outside the gate electrode 404. The above GOLD structure TFT is characterized in that: the gate electrode 404 is constituted of a first-layer gate electrode 404a and a second-layer gate electrode 404b; the first-layer gate electrode 404a is formed longer in size in a channel direction than the second-layer gate electrode 404b;

first electric field relaxation regions, that is, Lov regions 407 are formed in the island-like semiconductor layer 402 corresponding to the regions of the first-layer gate electrode 404a which are exposed from the second-layer gate electrode 404b; and second electric field relaxation regions, that is, Loff regions 408 and the source region 405 and the drain region 406 are formed in the island-like semiconductor layer 402 corresponding to the outside of the gate electrode 404 so as to be adjacent to each other from the side closer to the gate electrode 404.

In the GOLD structure TFT with the above structure, the Lov region 407 is the first electric field relaxation region formed so as to overlap with an end portion of the first-layer gate electrode 404a, and consists of an n-type or p-type low concentration impurity region ($n^{--}$ region or $p^{--}$ region). The Lov region 407 has a concentration gradient the impurity concentration of which gradually increases toward the Loff region 408. Further, the Loff region 408 is the second electric field relaxation region formed so as not to overlap with the first-layer gate electrode 404a, and consists of an n-type or p-type low concentration impurity region ($n^{-}$ region or $p^{-}$ region). The Loff region 408 has a concentration gradient the impurity concentration of which gradually increases toward the source region 405 or the drain region 406 which is an n-type or p-type high concentration impurity region ($n^{+}$ region or $p^{+}$ region). Note that the concentration gradient of the Lov region 407 arises from the fact that the first-layer gate electrode 404a (the gate insulating film 403 is irrelevant because it does not change in thickness) which is the upper layer film of the island-like semiconductor layer 402 becomes thinner toward the end portion in implanting the impurity to the island-like semiconductor layer 402 with the through-doping method. Similarly, the concentration gradient of the Loff region 408 arises from the fact that the gate insulating film 403 that is the upper layer film of the island-like semiconductor layer 402 becomes thinner away from the gate electrode 404.

By the way, the gate electrodes 304, 404 of the GOLD structure TFTs shown in FIGS. 3A and 3B are constituted of the first-layer gate electrodes 304a, 404a and the second-layer gate electrodes 304b, 404b, respectively. The first-layer gate electrodes 304a, 404a are formed longer in size in a channel direction than the second-layer gate electrodes 304b, 404b, respectively. Then, the region of each of the first-layer gate electrodes 304a, 404a which is exposed from each of the second-layer gate electrodes 304b, 404b has a thin tapered shape, and thus, has a thinner thickness toward the end portion. A dry etching method that utilizes high density plasma which is capable of independently controlling a plasma density and a bias voltage applied to a substrate is suitable for processing of the gate electrodes 304, 404 with the above structure. As a specific dry etching method, a dry etching method is known which utilizes a microwave or inductively-coupled-plasma (hereinafter abbreviated to ICP). However, our company employs a dry etching apparatus of an ICP system. This is because the ICP dry etching apparatus enables easy control of plasma, and thus, has an advantage that a larger-scale processing substrate can be easily realized.

In the case where the gate electrodes 304, 404 are processed using the ICP dry etching apparatus, it is necessary to perform a dry etching process consisting of a large number of process steps in combination of taper etching and anisotropic etching. Here, in one process step, an etching process is performed under predetermined etching conditions. Note that the etching conditions mentioned here indicate a chamber pressure, an ICP power density, a bias power density, and a flow ratio of gases constituting etching gas.

For example, in the dry etching step of the gate electrode 304 of the GOLD structure TFT only having an Lov region (see FIG. 3A), the dry etching process consisting of three steps is performed, and thus, a changeover of the etching gas needs to be performed twice. The changeover of the etching gas requires a time until the pressure of an etching chamber is stabilized at the time of the changeover, which leads to the problem of reduction in throughput of the dry etching step. Moreover, there is required the etching gas that is flown until the pressure of the etching chamber is stabilized. Thus, there is also the problem of rise of the process cost due to consumption amount increase of the etching gas. Furthermore, in addition to the above problems, the complication of the dry etching step leads to the process defect and the increase of the number of troubles, and also involves the problem of reduction of yield of a semiconductor device.

Note that the above problems are not limited to the manufacturing steps of the GOLD structure TFT, and are found in the manufacturing steps of the LDD structure TFT as well. This is because the gate electrode is processed through the same dry etching step in either the GOLD structure TFT or the LDD structure TFT.

SUMMARY OF THE INVENTION

The present invention has been made in order to solve the above-mentioned problems in the prior art, and therefore has an object to provide a semiconductor device manufactured by applying a dry etching method including a small number of process steps for processing of a gate electrode and a method of manufacturing the semiconductor device. Note that the semiconductor device in this specification indicates semiconductor devices in general the circuit of which is configured by semiconductor devices including a TFT with a GOLD structure. For example, semiconductor display devices such as an active matrix liquid crystal display device and an organic EL display device are included in the category of the semiconductor device.

[Examination of Reduction of the Number of Process Steps in Dry Etching Step]

(Structure of ICP Dry Etching Apparatus)

An ICP dry etching apparatus used in this examination will be explained below. The ICP dry etching apparatus adopts a method in which a high frequency power is applied to a portion consisting of a plurality of spiral coils through an impedance matching device as a means for conducting a plasma process with high precision to thereby produce plasma. Here, the length of a coil is set to one fourth of a high frequency wavelength, and also, a high frequency power is independently applied to a lower electrode that holds an object to be processed, to thereby be applied with a bias voltage. Note that the details of the ICP plasma etching apparatus concerned are disclosed in JP 9-293600A.

FIGS. 4A and 4B are schematic diagrams of the ICP dry etching apparatus concerned. An antenna coil 502 is arranged on a quartz plate 501 provided above a reaction space, and is connected to a first high frequency power source 504 through a matching box 503. The first high frequency power source 504 supplies a high frequency power of 6 to 60 MHz, typically 13.56 MHz. Further, a lower electrode 506 that holds a substrate 505 as an object to be processed is connected to a second high frequency power source 508 through a matching box 507. The second high frequency power source 508 supplies a high frequency power of 100 KHz to 60 MHz, for example, 6 to 29 MHz. When the high frequency power is applied to the antenna coil 502, a high frequency current J flows to the antenna coil 502 in a θ direction, a magnetic field B (Formula 1) is generated in a Z direction, and an induction field E (Formula 2) is generated in the θ direction in accordance with the law of electromagnetic induction of Faraday (see FIG. 4A).

$$\mu_0 J = \text{rot } B \quad \text{[Formula 1]}$$

$$-\frac{\partial B}{\partial t} = \text{rot } E \quad \text{[Formula 2]}$$

Electrons are accelerated in the θ direction to collide with gas molecules in the induction filed E, thereby producing plasma. Since the direction of the induction field E is the θ direction, the probability that charged particles collide with an inner wall of a reaction chamber and the substrate 505 to lose energy is small. Further, the magnetic field B hardly affects the portion below the antenna coil 502, and thus, a high density plasma region that is expanded in a flat plate shape is produced. Then, the high frequency power applied to the lower electrode 506 is adjusted, whereby the plasma density and the bias voltage applied to the substrate 505 can be independently controlled. Further, the frequency of the high frequency power to be applied can be changed in accordance with a substance to be etched.

In order to generate high density plasma with the ICP system, the high frequency current J that flows through the antenna coil needs to be flown at a low loss, and the inductance needs to be lowered. In view of this point, a method in which the antenna coil is divided is effective. FIG. 4B is a schematic diagram showing such a structure. A portion consisting of a plurality of spiral coils 510 is arranged on a quartz substrate 509, and is connected to a first high frequency power source 512 through a matching box 511. In this case, when the length of one coil is set to an integral multiple of ¼ of a high frequency wavelength, a standing wave occurs in the coil portion, and a peak value of the generated voltage can be increased.

A dry etching step that is a processing step of the gate electrode of the GOLD structure TFT is performed by using the ICP dry etching apparatus with the above structure, but there is a problem in that the dry etching step includes a large number of process steps. Thus, the reduction of the number of process steps is examined.

(Substrate Structure and Etching Gas)

First, the structure of a substrate used in this examination will be described. The substrate used here has a structure in which, on a square glass substrate (regular square 12.5 cm on a side) such as a Corning 1737 substrate, a silicon oxide film with a thickness of 200 nm, a TaN film with a thickness of 30 nm, and a W film with a thickness of 370 nm are laminated in order from the side closer to the substrate. Briefly, there is used a substrate with the structure written in the W film (thickness of 370 nm)/TaN film (thickness of 30 nm)/silicon oxide film (thickness of 200 nm)/glass substrate. In the substrate with the above structure, a metallic laminate film with a two-layer structure consisting of the W film (thickness of 370 nm)/TaN film (thickness of 30 nm), which is laminated on the silicon oxide film with a thickness of 200 nm, corresponds to substances to be etched. Note that, as to the examination of an etching rate of each film, there is used a substrate in which a single layer film comprised of the W film (thickness of 370 nm), TaN film (thickness of 30 nm), or silicon oxide film (thickness of 200 nm) is deposited on the glass substrate.

By using the substrate with the above structure, the metallic laminate film consisting of the W film (thickness of 370 nm)/TaN film (thickness of 30 nm) is subjected to a dry etching process using a resist pattern with a thickness of 1.5 μm as a mask. In the prior art, the dry etching process consisting of a large number of process steps comprised of taper etching and anisotropic etching is performed, a mixed gas of $CF_4$, $Cl_2$, and $O_2$ is used in the process step of taper etching, and a mixed gas of $SF_6$, $Cl_2$, and $O_2$ is used in the process step of anisotropic etching. In this examination, the etching gas to be used is limited to the mixed gas of $SF_6$, $Cl_2$, and $O_2$, and the examination of the reduction of the number of process steps is made. Note that, a fluorine-based gas is standardized to $SF_6$ from $CF_4$ in the etching gas comprised of a mixed gas because the increase of the etching rate of the W film (thickness of 370 nm) and the following improvement of the selection ratio of the W film to the silicon oxide film (thickness of 200 nm) can be expected by increasing an existence ratio of a fluoride element.

Note that, hereinafter, description will be made using $SF_6$ as the gluorine-based gas from the above-mentioned reason, but the present invention is not limited to this. $SF_6$ is the most preferable but other fluorine-based gas (for example, $CF_4$) may also be used. Further, a Cl-based gas may be used instead of $Cl_2$.

In this specification, the metallic laminate film is described with the laminate structure of the combination of the W film and the TaN film, but the present invention is not limited to this. The combination of the W film and the TaN film is the most preferable. However, a metal compound containing W as a main constituent or WN (tungsten nitride) may be used instead of W, and Ta may be used instead of TaN.

(Experiment 1)

An evaluation was made on ICP power dependence of an etching rate of each of the W film, TaN film, and silicon oxide film using the ICP dry etching apparatus, substrate, and etching gas which are mentioned above. As to the etching conditions except the ICP power, the gas flow rates of $SF_6$ and $Cl_2$, which correspond to the etching gas, are 40 sccm and 20 sccm, respectively (In this case, the gas flow rate of $O_2$ is 0 sccm.), the chamber pressure is 1.3 Pa, and the bias power is 20 W (bias power density: 0.128 $W/cm^2$). Under the above conditions, an experiment was made with respect to 500 W (ICP power density: 1.019 $W/cm^2$), 700 W (ICP power density: 1.427 $W/cm^2$), and 900 W (ICP power density: 1.834 $W/cm^2$) in ICP power. Note that the bias power indicates the power applied to the substrate 505 from the second high frequency power source 508, and the bias power density indicates a value obtained by dividing the bias power by the area of the substrate 505 (regular square 12.5 cm on a side). Further, the ICP power indicates the power applied to the portion consisting of a plurality of spiral coils 510 from the first high frequency power source 512, and the ICP power density indicates a value obtained by dividing the ICP power by the area of the portion consisting of a plurality of spiral coils 510 (circular region with a diameter of 25 cm) (see FIGS. 4A and 4B).

The results of this experiment are shown in FIGS. 5A and 5B. As understood from FIG. 5A, it was found that, along with the increase of the ICP power, while the etching rates of the TaN film and the silicon oxide film were hardly increased, the etching rate of the W film was increased. FIG. 5B shows the results of the evaluation of the selection ratios of the W film to the TaN film and to the silicon oxide film based on the results of the etching rates. As understood from FIG. 5B, the rise of the selection ratio of the W film to the TaN film and the rise of the selection ratio of the W film to the silicon oxide film are found due to the increase of the ICP power. From the results of this experiment, it is found that the increase of the ICP power is preferable from the viewpoint of the etching rate and the selection ratio of the W film. However, the ICP power of the dry etching apparatus has the maximum value of 1 kW, and a load applied to the dry etching apparatus is concerned when the apparatus is used with the ICP power of about 1 kW. Therefore, the results of this experiment and the load applied to the dry etching apparatus are compared and considered, and as a result, it is judged that an ICP power of about 700 W is suitable.

(Experiment 2)

Next, in the state in which the gas flow rates of $SF_6$ and $Cl_2$ which correspond to the etching gas and the total gas flow rate are fixed to $SF_6:Cl_2=2:1$ and 60 sccm, respectively, an evaluation is made on the oxygen addition amount dependence of the respective etching rates of the W film, the TaN film, and the silicon oxide film with the addition amount of oxygen ($O_2$) gas being changed from 0 to 60%. As to the etching conditions except the gas flow rate, the chamber pressure is 1.3 Pa, and the bias power is 10 W (bias power density: 0.064 W/cm$^2$). Then, under the condition of the ICP power of 500 W (ICP power density: 1.019 W/cm$^2$), the evaluation of the etching rates was made with the oxygen addition amount being changed to 20, 40, and 60%. At the same time, an evaluation is made on the case where the ICP power is 700 W (ICP power density: 1.427 W/cm$^2$) and the oxygen addition amount is 40%. Note that Table 1 shows the details of the dry etching conditions of this experiment for reference.

TABLE 1

| Oxygen addition amount (%) | Gas flow rate (sccm) | | | Pressure (Pa) | ICP power (W) | Bias power (W) |
| --- | --- | --- | --- | --- | --- | --- |
| | $SF_6$ | $Cl_2$ | $O_2$ | | | |
| 0 | 40 | 20 | 0 | 1.3 | 500 | 10 |
| 20 | 32 | 16 | 12 | 1.3 | 500 | 10 |
| 40 | 24 | 12 | 24 | 1.3 | 500 | 10 |
| 60 | 16 | 8 | 36 | 1.3 | 500 | 10 |
| 40 | 24 | 12 | 24 | 1.3 | 700 | 10 |

FIGS. 6A and 6B show results of this experiment. As understood from FIG. 6A, it is found that, in the case of an ICP power of 500 W, the etching rate of the W film becomes maximum when the oxygen addition amount is 40%. On the other hand, there is found a tendency that the etching rate of the TaN film lowers along with the increase of the oxygen addition amount. Further, as to the etching rate of the silicon oxide film, there is found no particular tendency except the point that the etching rate lowers when the oxygen addition amount is 0%. FIG. 6B shows the result of the evaluation of the selection ratios of the W film to the TaN film and to the silicon oxide film based on the results of the etching rates. As understood from FIG. 6B, there is found a tendency that the selection ratio of the W film to the TaN film increases along with the increase of the oxygen addition amount. Further, there is found a tendency that the selection ratio of the W film to the silicon oxide film contrary lowers. It is considered that an ICP power of about 700 W is suitable from the results of FIGS. 5A and 5B, and that the oxygen addition amount of 40% is the most suitable from the results of this experiment (FIGS. 6A and 6B). Thus, the etching rate and the selection ratio are similarly evaluated with respect to the case of the ICP power of 700 W and the oxygen addition amount of 40%, and the results are shown in the right ends of FIGS. 6A and 6B.

From the results concerned, under the etching conditions of: respective gas flow rates of $SF_6$, $Cl_2$, and $O_2$ as etching gas of 24, 12, and 24 sccm (corresponding to the oxygen addition amount of 40%), a chamber pressure of 1.3 Pa, an ICP power of 700 W, and a bias power of 10 W, the etching rate of the W film of 227 nm, the etching rate of the TaN film of 32 nm, and the etching rate of the silicon oxide film of 34 nm can be obtained, and the selection ratio of the W film to the TaN film of 7.1 and the selection ratio of the W film to the silicon oxide film of 6.8 can be obtained.

(Experiment 3)

Dry etching conditions are set to the following conditions in Table 2. Then, a substrate with the structure consisting of a W film (thickness of 370 nm)/silicon oxide film (thickness of 200 nm)/glass substrate and a substrate with the structure consisting of a W film (thickness of 370 nm)/TaN film (thickness of 30 nm)/silicon oxide film (thickness of 200 nm)/glass substrate are each subjected to a dry etching process using a resist pattern with a thickness of 1.5 μm as a mask.

TABLE 2

| Flow rates of etching gases | $SF_6$: 24 sccm |
| --- | --- |
| | $Cl_2$: 12 sccm |
| | $O_2$: 24 sccm |
| Chamber pressure | 1.3 Pa |
| ICP power | 700 W |
| ICP power density | 1.427 W/cm$^2$ |
| Bias power | 10 W |
| Bias power density | 0.064 W/cm$^2$ |

FIG. 7A shows an SEM photograph in the case where the dry etching process is performed to the substrate with the structure consisting of a W film (thickness of 370 nm)/silicon oxide film (thickness of 200 nm)/glass substrate, and also in the case where over etching is performed from the end point of etching of the W film for about 20 seconds. As understood from FIG. 7A, it is found that the W film has undergone side etching by about 0.2 to 0.3 μm in the state in which the silicon oxide film, which is a base film of the W film, is exposed. Further, FIG. 7C shows an SEM photograph in the case where the dry etching process is performed to the substrate with the structure consisting of a W film (thickness of 370 nm)/TaN film (thickness of 30 nm)/silicon oxide film (thickness of 200 nm)/glass substrate, and also in the case where over etching is performed from the end point of etching of the W film for about 30 seconds. As understood from FIG. 7C, it is not found that the W film has undergone side etching in the state in which the TaN film, which is a base film of the W film, is exposed. From the above, it is understood that there is a casual relationship between side etching of the W film and the exposure of the silicon oxide film in over etching. In the case where the silicon oxide film is exposed in over etching, oxygen emission from the silicon oxide film is considered, and the existence of the emitted oxygen is considered to be a direct cause of side etching of the W film. Taking this point into consideration, the dry etching process is performed to the substrate with the structure consisting of a W film (thickness of 370 nm)/TaN film (thickness of 30 nm)/silicon oxide film (thickness of 200 nm)/glass substrate, and over etching is performed from the end point of etching of the TaN film for a predetermined time. As a result, as shown in an SEM photograph of FIG. 7B, an etching shape with side etching of about 0.2 to 0.3 μm can be obtained in the W film in the state in which the silicon oxide film, which is the base film of the TaN film, is exposed. Further, it is confirmed that the region of the TaN film which is exposed from the W film gradually becomes thinner toward the end portion.

(Construction of Process Step Reduction Process)

It is considered that a metal laminate pattern consisting of the W film/TaN film in which the W film has undergone side etching, which is shown in the SEM photograph of FIG. 7C, can be applied to the gate electrode of the GOLD structure TFT (also including the LDD structure TFT). This is because the gate electrode of the GOLD structure TFT (also including the LDD structure TFT) developed by our company is characterized in that: it is constituted of the TaN film as the first-layer gate electrode and the W film as the second-layer gate electrode; the first-layer gate electrode (TaN film) is larger in channel direction size than the second-layer gate electrode (W film); and the region of the first-layer gate electrode which is exposed from the second-layer gate electrode becomes thinner toward the end portion, and because the gate electrode has substantially the same shape as the metal laminate pattern in FIG. 7B. Therefore, it is considered that the gate electrode of the GOLD structure TFT (also including the LDD structure TFT) can be formed by a one-step dry etching process under the dry etching conditions for a one-step process in Table 2. The substrate sectional views showing the dry etching process in this case are shown in FIGS. 1A and 1B.

Here, the one-step dry etching process indicates that an etching process is conducted once under predetermined etching conditions, and the etching conditions indicate a chamber pressure, an ICP power density, a bias power density, and a flow rate of respective gases constituting etching gas. Further, the dry etching conditions for the one-step process in Table 2 show preferable values, and thus, the present invention is not limited to these values.

The substrate sectional view of FIG. 1A shows the first half of the one-step dry etching process, in which a second-layer gate electrode 105 comprised of a W film and a first-layer gate electrode 106 comprised of a TaN film are subjected to anisotropic etching with a resist pattern 104 as a mask. In this case, the resist pattern 104 is slightly retreated from end portions of the initial resist pattern due to etching, a gate insulating film 103 that is a base silicon oxide film is exposed, and the reduction in thickness progresses in the region outside the end portions of the initial resist pattern. Note that the gate insulating film 103 corresponding to the region inside the end portion of the initial resist pattern is formed into a tapered shape along with the-retreat of the end portion of the resist pattern 104 due to etching, and becomes thinner away from an end portion of the first-layer gate electrode 106. Further, FIG. 1B shows a substrate sectional view in the latter half of the dry etching process, in which reduction in thickness of the silicon oxide film that is a base gate insulating film 109 is further progressed as a whole, and side etching of the W film that is a second-layer gate electrode 107 is progressed with an influence of oxygen emitted from the silicon oxide film. In this case, the region of a first-layer gate electrode 108 which is exposed from the second-layer gate electrode 107 is etched into a tapered shape, and becomes thinner toward the end portion. Further, the gate insulating film 109 corresponding to the region inside the end portion of the initial resist pattern is entirely thinned while maintaining the same tapered shape as that in the first half step of the dry etching process.

Note that the silicon oxide film is used as the gate insulating film here, and is the most preferable one. However, the present invention is not limited to this. As described above, it is considered that the silicon oxide film is exposed in over etching, and that oxygen emitted from the silicon oxide film causes side etching of the W film. Therefore, it is considered that the same effect can be obtained with a film other than the silicon oxide film as long as the film is an oxide film.

Further, it is expected that side etching of the W film, which is the second-layer gate electrode, can be promoted without exposure of the base silicon oxide film by increasing the oxygen addition amount based on the findings of the dry etching conditions of the above one-step process. Thus, the dry etching process was performed for a predetermined time under the dry etching conditions in which the oxygen addition amount is increased from 24 sccm to 30 sccm. FIG. 2A is a sectional view showing a substrate after the dry etching process, in which isotropic etching can be performed to a W film that is a second-layer gate electrode 205a in the state in which a TaN film 206 remains. In this case, an end portion of the resist pattern 204a is retreated from the initial resist pattern end portion due to etching, whereby etching proceeds in the TaN film 206 such that the region inside the initial resist pattern end portion has a tapered shape. The TaN film 206 becomes thinner away from an end portion of the second-layer gate electrode (W film) 205a, and thus, has a given residual film thickness in the region outside the initial resist pattern end portion. FIG. 2B is a substrate sectional view after the dry etching process for a predetermined time under the dry etching conditions of a gas flow rate of $Cl_2$, which is etching gas, of 60 sccm, a chamber pressure of 1.0 Pa, an ICP power of 350 W (ICP power density: 0.713 $W/cm^2$), and a bias power of 20 W (bias power density: 0.128 $W/cm^2$), which is performed for anisotropic etching to the TaN film 206. At this time, a first-layer gate electrode 207 formed through anisotropic etching of the TaN film 206 gradually becomes thinner away from an end portion of a second-layer gate electrode (W film) 205b, and suddenly comes to the end at an end portion thereof due to the combination of taper etching and anisotropic etching. Further, etching proceeds in a gate insulating film 208 comprised of a silicon oxide film such that the region inside the initial resist pattern end portion has a tapered shape. The gate insulating film 208 becomes thinner away from the end portion of the first-layer gate electrode 207, and thus, has a given residual film thickness in the region outside the initial resist pattern end portion (refer to FIG. 2B).

From the above results, it is considered that the two-step dry etching process conditions can be applied to the dry etching step of the gate electrode of the GOLD structure TFT (also including the LDD structure TFT). The details of the two-step dry etching process conditions are described in Table 3.

Here, the two-step dry etching process indicates that a dry etching process for the first step is performed under predetermined etching conditions, and a dry etching process for the second step is performed under predetermined etching conditions different from those in the first step. Note that the two-step dry etching process conditions in Table 3 show preferable values, but the present invention is not limited to these values.

TABLE 3

| (1) 1st step | |
| --- | --- |
| Flow rates of etching gases | $SF_6$: 24 sccm |
|  | $Cl_2$: 12 sccm |
|  | $O_2$: 30 sccm |
| Chamber pressure | 1.3 Pa |
| ICP power | 700 W |
| ICP power density | 1.427 $W/cm^2$ |
| Bias power | 10 W |
| Bias power density | 0.064 $W/cm^2$2 |
| (2) 2nd step | |
| Flow rate of etching gas | $Cl_2$: 60 sccm |
| Chamber pressure | 1.0 Pa |

TABLE 3-continued

| ICP power | 350 W |
| ICP power density | 0.713 W/cm² |
| Bias power | 20 W |
| Bias power density | 0.128 W/cm² |

From the above results, the substrate with the structure consisting of a W film (thickness of 370 nm)/TaN film (thickness of 30 nm)/silicon oxide film (thickness of 200 nm)/glass substrate is subjected to the dry etching process under the one-step dry etching process conditions (see Table 2) or the two-step dry etching process conditions (see Table 3), whereby the gate electrode of the GOLD structure TFT (also including the LDD structure TFT) can be processed. Therefore, the dry etching process is performed under the one-step dry etching process conditions or the two-step dry etching process conditions, whereby it is considered that the problems in the prior art in the processing step of the gate electrode of the GOLD structure TFT (also including the LDD structure TFT) can be solved.

[Semiconductor Device and Method of Manufacturing the Same]

Description will be made of the structure of the invention relating to a semiconductor device and a method of manufacturing the same in the case where the dry etching process consisting of one step or two steps is applied to the dry etching process of the gate electrode of the GOLD structure TFT (also including the LDD structure TFT).

(Structure of the Invention relating to Semiconductor Device)

The structure of the present invention relating to the semiconductor device relates to the semiconductor device the circuit of which is configured by a plurality of TFTs including a GOLD structure TFT formed on a principal surface of a transparent insulating substrate, the GOLD structure TFT being such that: a semiconductor layer, a gate insulating film, and a gate electrode are formed in lamination from the side closer to the transparent insulating substrate; the gate electrode is constituted of a first-layer gate electrode and a second-layer gate electrode that is shorter in size in a channel direction than the first-layer gate electrode; the first-layer gate electrode corresponding to the region exposed from the second-layer gate electrode is formed into a tapered shape so as to gradually become thinner toward the end portion thereof; a first impurity region having one conductivity is formed in the semiconductor layer corresponding to the region of the first-layer gate electrode which is exposed from the second-layer gate electrode; and a second impurity region having the same conductivity as the first impurity region is formed in the semiconductor layer corresponding to the outside of the first-layer gate electrode, which is characterized in that: a dry etching process consisting of one step or two steps is applied to the formation of the gate electrode; the second-layer gate electrode is formed by isotropic etching through the dry etching process; and the first-layer gate electrode corresponding to the region exposed from the second-layer gate electrode is formed by taper etching through the dry etching process.

In the structure of the above invention, the transparent insulating substrate may be any one as long as it is a transparent substrate having insulating property. For example, a glass substrate or a quartz substrate may be used. Further, the semiconductor layer indicates an island-like semiconductor layer functioning as an active layer of a TFT, and includes a polycrystalline silicon film having semiconductor characteristics or a crystalline silicon film formed through crystallization by utilizing a catalytic element. The thickness range of the polycrystalline silicon film or crystalline silicon film is suitably about 20 to 200 nm, more preferably about 30 to 70 nm. Note that, in this specification, the polycrystalline silicon film formed by utilizing a catalytic element is referred to as a crystalline silicon film in order to distinguish it from a general polycrystalline silicon film. Here, the reason why "crystalline" is used for the silicon film instead of "polycrystalline" is that since the crystalline silicon film has characteristics that the crystal grains are orientated in substantially the same direction and that it has a high field-effect mobility in comparison with the general polycrystalline silicone film, the crystalline silicon film is distinguished from the general polycrystalline silicon film.

Further, in the structure of the above invention, the gate insulating film is comprised of a silicon oxide film or a silicon oxynitride film, and has a tapered shape so as to be thinner away from the end portion of the gate electrode at a given distance from the end portion of the gate electrode. Note that the thickness of the gate insulating film at the film deposition is suitably about 30 to 200 nm, more preferably about 80 to 130 nm. The reason why the thickness of about 80 to 130 nm is preferable is that a thickness of 80 nm or more is required in order to prevent electrical characteristics of a TFT from being affected due to a stress from the upper layer gate electrode (laminate gate electrode of W film/TaN film).

Further, in the structure of the above invention, the gate electrode is constituted of the first-layer gate electrode comprised of a TaN film with a thickness of about 5 to 50 nm, preferably about 20 to 40 nm and the second-layer gate electrode comprised of a W film with a thickness of about 200 to 600 nm, preferably about 300 to 500 nm, more preferably about 350 to 500 nm. The first-layer gate electrode corresponding to the region exposed from the second-layer gate electrode is formed into a tapered shape so as to gradually become thinner toward the end portion thereof. Note that the thickness range of the TaN film is determined in accordance with a good balance between controllability of the thickness in the tapered shape region in dry etching and implantation characteristics in implantation of an impurity element through the TaN film with a through-doping method. Further, the thickness range of the W film is determined by a good balance between prevention of a channeling phenomenon of the W film in implantation of an impurity element and electric resistance of the W film. The channeling phenomenon is a phenomenon in which part of implantation ions enter the semiconductor layer in the lower portion without colliding with W atoms. It is known that a thickness of at least 340 nm or more is required in order to prevent the channeling phenomenon.

Further, in the structure of the above invention, the first impurity region indicates a low concentration impurity region having n-type or p-type conductivity (n⁻ region, p⁻ region), and functions as an electric field relaxation region for relaxing an electric field in a channel horizontal direction. Further, the second impurity region indicates a high concentration impurity region having the same conductivity as the first impurity region (n⁺ region, p⁺ region), and functions as a source region or a drain region. Note that the first impurity region has a concentration gradient the impurity concentration of which gradually increases away from an end portion of the second-layer gate electrode. Further, the second impurity region has a concentration gradient in a region at a given distance from the end portion of the first-layer gate electrode, and the impurity concentration gradually increases away from the end portion of the first-layer gate electrode.

According to the invention structured as described above, the gate electrode of the semiconductor device the circuit of which is configured by a plurality of TFTs including the GOLD structure TFT can be processed by the dry etching process consisting of one step or two steps. Accordingly, there can be solved the problems in the prior art in the dry etching process, that is, reduction in throughput of the dry etching process, rise of the process cost that follows consumption amount increase of etching gas, and further, reduction of yield of a semiconductor device which follows complication of the dry etching process.

(Structure of the Invention relating to Method of Manufacturing Semiconductor Device)

The structure of the present invention relating to a method of manufacturing a semiconductor device relates to a method of manufacturing a semiconductor device, including: a first step of forming a semiconductor layer on a principal surface of a transparent insulating substrate; a second step of depositing a gate insulating film to cover the semiconductor layer; a third step of depositing a first-layer gate electrode film on the gate insulating film; a fourth step of depositing a second-layer gate electrode film on the first-layer gate electrode film; a fifth step of forming a resist pattern for formation of a gate electrode; a sixth step of performing a dry etching process to a laminate film constituted of the first-layer gate electrode film and the second-layer gate electrode film to form a gate electrode constituted of a first-layer gate electrode and a second-layer gate electrode shorter in size in a channel direction than the first-layer gate electrode with the resist pattern as a mask; a seventh step of removing the resist pattern; and an eighth step of forming a first impurity region in the semiconductor layer corresponding to the region of the first-layer gate electrode which is exposed from the second-layer gate electrode and at the same time, forming a second impurity region in the semiconductor layer corresponding to the outside of the first-layer gate electrode by implantation of an impurity element having one conductivity, which is characterized in that: the gate electrode is formed by a dry etching process consisting one step or two steps; the second-layer gate electrode is formed by isotropic etching through the dry etching process; and the first-layer gate electrode corresponding to the region exposed from the second-layer gate electrode is formed by taper etching through the dry etching process.

In the structure of the above invention, the transparent insulating substrate may be any one as long as it is a transparent substrate having insulating property. For example, a glass substrate or a quartz substrate may be used. Further, the semiconductor layer is an island-like semiconductor layer that functions as an active layer of a TFT, and is comprised of a polycrystalline silicon film or a crystalline silicon film (silicon semiconductor film crystallized by utilizing a catalytic element) having semiconductor characteristics with a thickness of about 20 to 200 nm, preferably about 30 to 70 nm. Further, either a silicon oxide film or a silicon oxynitride film may be applied to the gate insulating film, and the thickness range is suitably about 30 to 200 nm, more preferably about 80 to 130 nm. Further, a TaN film with a thickness of about 5 to 50 nm, preferably about 20 to 40 nm is applied to the first-layer gate electrode film, and a W film with a thickness of about 200 to 600 nm, preferably about 300 to 500 nm, more preferably about 350 to 500 nm is applied to the second-layer gate electrode film.

Further, in the structure of the above invention, a metallic laminate film constituted of the first-layer gate electrode film and the second-layer gate electrode film is subjected to a dry etching process consisting of one step or two steps with the resist pattern as a mask, thereby forming the gate electrode. In this case, since the second-layer gate electrode is formed by isotropic dry etching, the second-layer gate electrode is shorter in size in a channel direction than the fist-layer gate electrode. Further, the first-layer gate electrode corresponding to the region exposed from the second-layer gate electrode is formed into a tapered shape so as to be gradually thinner toward the end portion by taper etching. Further, a dry etching method with the use of high density plasma, which is capable of independently controlling a plasma density and a bias voltage applied to a subject substrate, is appropriate for the dry etching process, and for example, an ICP dry etching apparatus is suitable.

Specific dry etching conditions of the ICP dry etching apparatus are the dry etching conditions described in Tables 2 and 3 as standards. The dry etching conditions in Tables 2 and 3 correspond to a square substrate 12.5 cm on a side. It is considered that, in the case of the actual large-scale square substrate, for example, a large-scale substrate about 1 m on a side, a gas flow rate of etching gas greatly differs along with the increase of the volume in an etching chamber. Therefore, a regulation needs to be placed on not a gas flow rate but a gas flow ratio in order to provide the dry etching conditions with versatility. Further, it is considered that respective parameters in the dry etching conditions slightly change when a different apparatus is used even if it is the same model ICP dry etching apparatus. Moreover, the dry etching conditions need to be regulated in consideration of a degree of room in process in the dry etching process. In view of the above points, a numerical range needs to be introduced for each parameter in the dry etching conditions, and Tables 4 and 5 show the dry etching conditions in which the numerical range is introduced for each parameter. Here, Table 4 corresponds to the dry etching conditions adapted for a one-step process, and Table 5 corresponds to the dry etching conditions adapted for a two-step process. An etching process may be performed with a predetermined value in the numerical range shown in Table 4 or Table 5. Note that, in Tables 4 and 5, parameters of a gas flow ratio, an ICP power density, and a bias power density are regulated with the purpose of avoiding the influence of a substrate size of a subject substrate.

TABLE 4

| Gas flow rate | $SF_6/Cl_2/O_2 = 2/1/2$ |
|---|---|
| Chamber pressure | 1.0~1.6 Pa |
| ICP power density | 1.02~2.04 W/cm$^2$ |
| Bias power density | 0.03~0.19 W/cm$^2$ |

TABLE 5

| 1st step process | |
|---|---|
| Gas flow rate | $SF_6/Cl_2/O_2 = 4/2/5$ |
| Chamber pressure | 1.0~1.6 Pa |
| ICP power density | 1.02~2.04 W/cm$^2$ |
| Bias power density | 0.03~0.19 W/cm$^2$ |
| 2nd step process | |
| Gas: $Cl_2$ | $SF_6/Cl_2/O_2 = 0/1/0$ |
| Chamber pressure | 0.8~1.2 Pa |
| ICP power density | 0.51~1.02 W/cm$^2$ |
| Bias power density | 0.03~0.32 W/cm$^2$ |

Further, in the structure of the above invention, as to the impurity element having one conductivity, an n-type impurity typified by a phosphorous element may be implanted, or a p-type impurity typified by a boron element may be implanted. Through implantation of the above impurity elements, the first impurity region is formed in the semiconductor layer corresponding to the region of the first-layer gate electrode which is exposed from the second-layer gate electrode by a through-doping method, and at the same time, the second impurity region is formed in the semiconductor layer corresponding to the outside of the first-layer gate electrode by the through-doping method. At this time, since the impurity regions are simultaneously formed by the through-doping method, the impurity concentrations of the first impurity region and the second impurity region are determined depending on an acceleration voltage and a dosage at the time of implantation of the impurity elements and further on the kind and thickness of the upper layer film of each of the impurity regions. For example, in the first impurity region, the first-layer gate electrode constituted of the gate insulating film and the TaN film exists as the upper layer film, an ion blocking ability of the upper layer film is large, and thus, a low concentration impurity region ($n^-$ region, $p^-$ region) having n-type or p-type conductivity is formed. In this case, since the first-layer gate electrode comprised of the TaN film, which is a part of the upper layer film, is formed into a tapered shape by taper etching, the first impurity region is imparted with a concentration gradient the impurity concentration of which gradually increases toward the second impurity region. On the other hand, in the second impurity region, only the gate insulating film exists as the upper layer film, the ion blocking ability of the upper layer film is not so large, and thus, a high concentration impurity region ($n^+$ region, $p^+$ region) having n-type or p-type conductivity is formed. In this case as well, since a tapered shape region exists in a specific region of the gate insulating film that is the upper layer film, the second impurity region is imparted with a concentration gradient in a region at a given distance from the end portion of the first-layer gate electrode. Note that the first impurity region has a function as an electric field relaxation region for relaxing an electric field in a channel horizontal direction, and the second impurity region is formed so as to have a function of a source region or a drain region.

According to the present invention structured as described above, the gate electrode of the semiconductor device the circuit of which is configured by a plurality of TFTs including the GOLD structure TFT can be processed by the dry etching process consisting of one step or two steps. Accordingly, there can be solved the problems in the prior art in the dry etching process, that is, reduction in throughput of the dry etching process, rise of the process cost that follows consumption amount increase of etching gas, and further, reduction of yield of a semiconductor device which follows complication of the dry etching process.

By the way, the structure of the present invention is similar to the disclosed technique in JP 7-202210A described as a known example, but the structure of the invention differs between both the sides in the following basic points. In the disclosed technique in JP 7-202210A, an example of wet etching or a combination of anode oxidization and wet etching is described in a step of forming a second gate electrode shorter in the dimension in a channel direction than a first-layer gate electrode. In this case, in the formation step of the second-layer gate electrode, the region of the first-layer gate electrode which is exposed from the second-layer gate electrode is hardly reduced in thickness, and thus, the formation of the first-layer gate electrode having a rectangular shape is expected. Also, in the sectional view showing a manufacturing step, the rectangular first-layer gate electrode is shown. On the contrary, the structure of the present invention is characterized in that a first-layer gate electrode corresponding to the region exposed from a second-layer gate electrode is formed into a tapered shape so as to be gradually thinner toward the end portion thereof. Thus, a first impurity region that is an electric field relaxation region is imparted with a concentration gradient in implanting an impurity element by a through-doping method. The concentration gradient promotes an electric field relaxing effect of the first impurity region, and is extremely effective in preventing a hot carrier phenomenon. Accordingly, it is considered that matters for invention specification essentially differ between the present invention and the known example.

BRIEF DESCRIPTION OF THE DRAWINGS

In the accompanying drawings:

FIGS. 2A and 2B are substrate sectional views showing a two-step dry etching process;

FIGS. 13A and 13B are sectional views showing manufacturing steps of an active matrix liquid crystal display device;

FIGS. 14A and 14B are sectional views showing manufacturing steps of an active matrix liquid crystal display device;

FIGS. 15A and 15B are sectional views showing manufacturing steps of an active matrix liquid crystal display device;

FIGS. 16A and 16B are sectional views showing manufacturing steps of an active matrix liquid crystal display device;

FIGS. 17A and 17B are sectional views showing manufacturing steps of an active matrix liquid crystal display device;

FIGS. 18A and 18B are sectional views showing manufacturing steps of an active matrix liquid crystal display device;

FIGS. 20A to 20D are schematic diagrams showing examples of electronic devices each of which is incorporated with a semiconductor display device.

DETAILED DESCRIPTION OF THE PREFERRED EMBODIMENTS

Figure 1A:
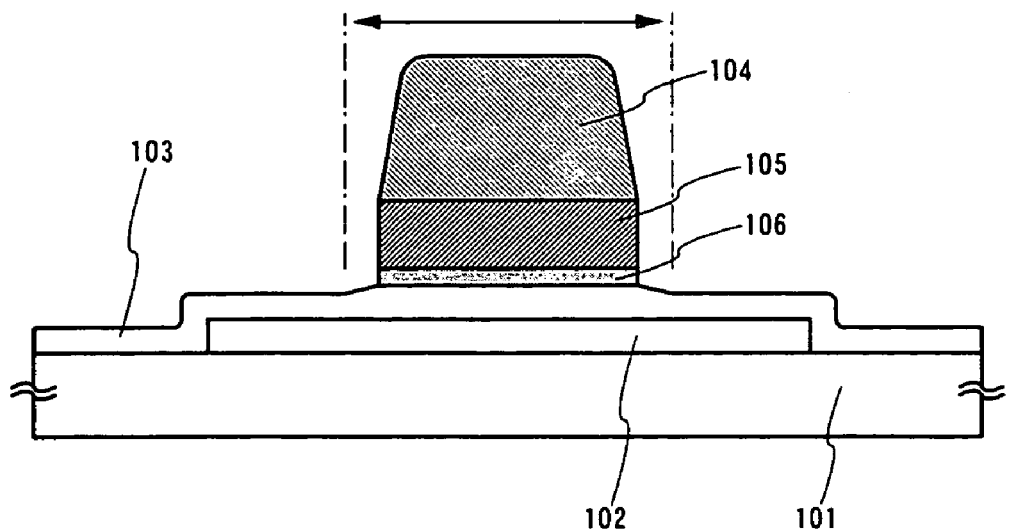
FIGS. 1A and 1B are substrate sectional views showing a one-step dry etching process.
Figure 1B:
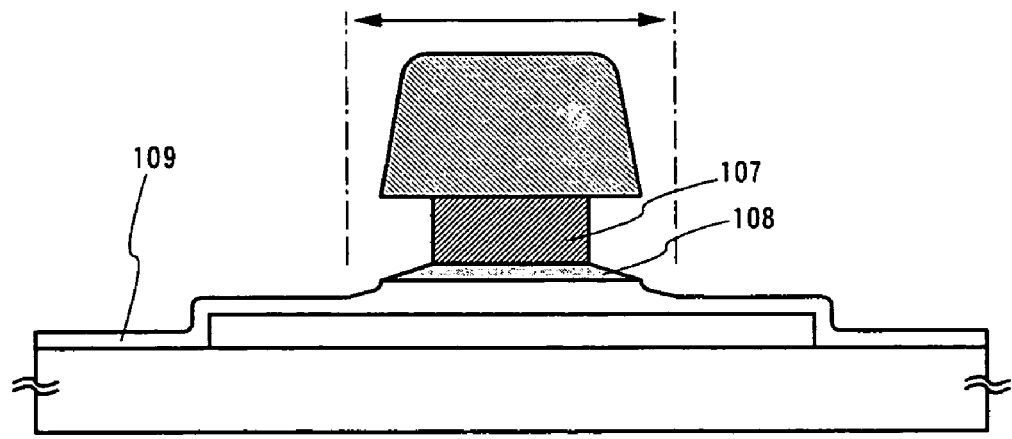
Figure 3A:
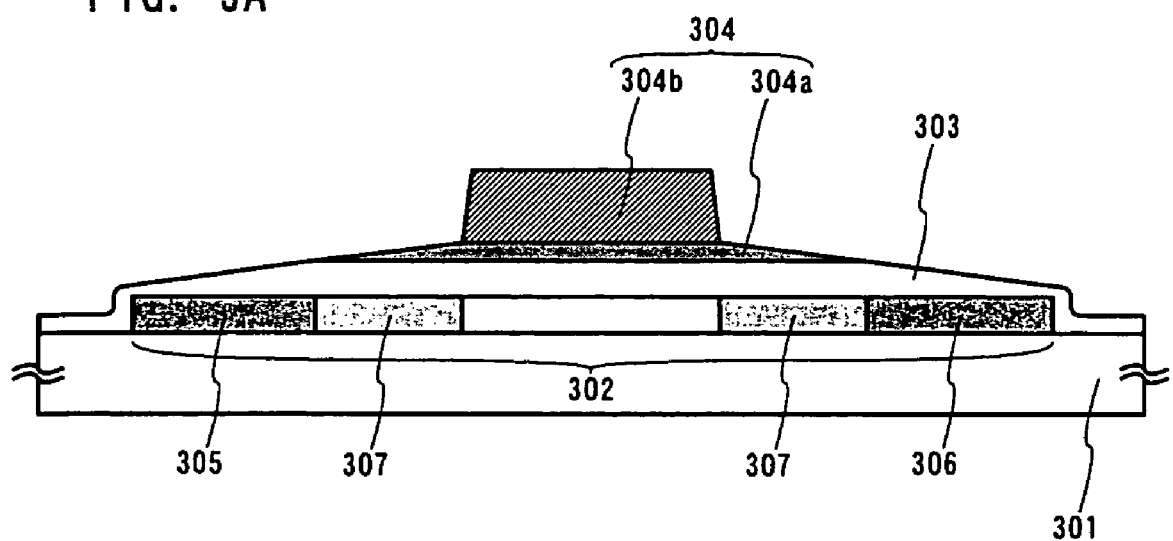
FIGS. 3A and 3B show examples of sectional views each showing a GOLD structure TFT developed by our company.
Figure 3B:
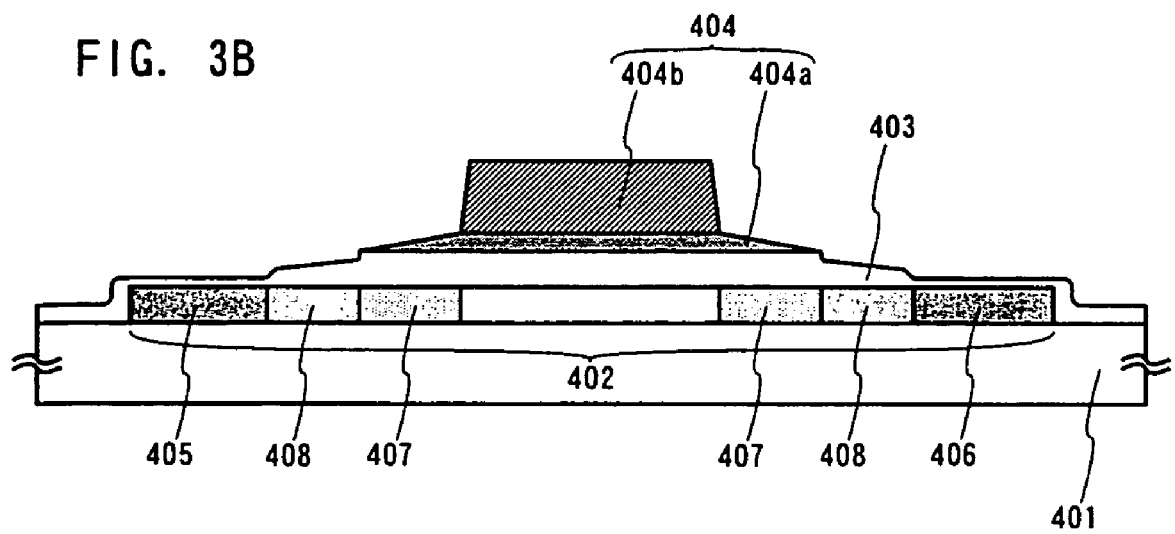
Figure 4A:
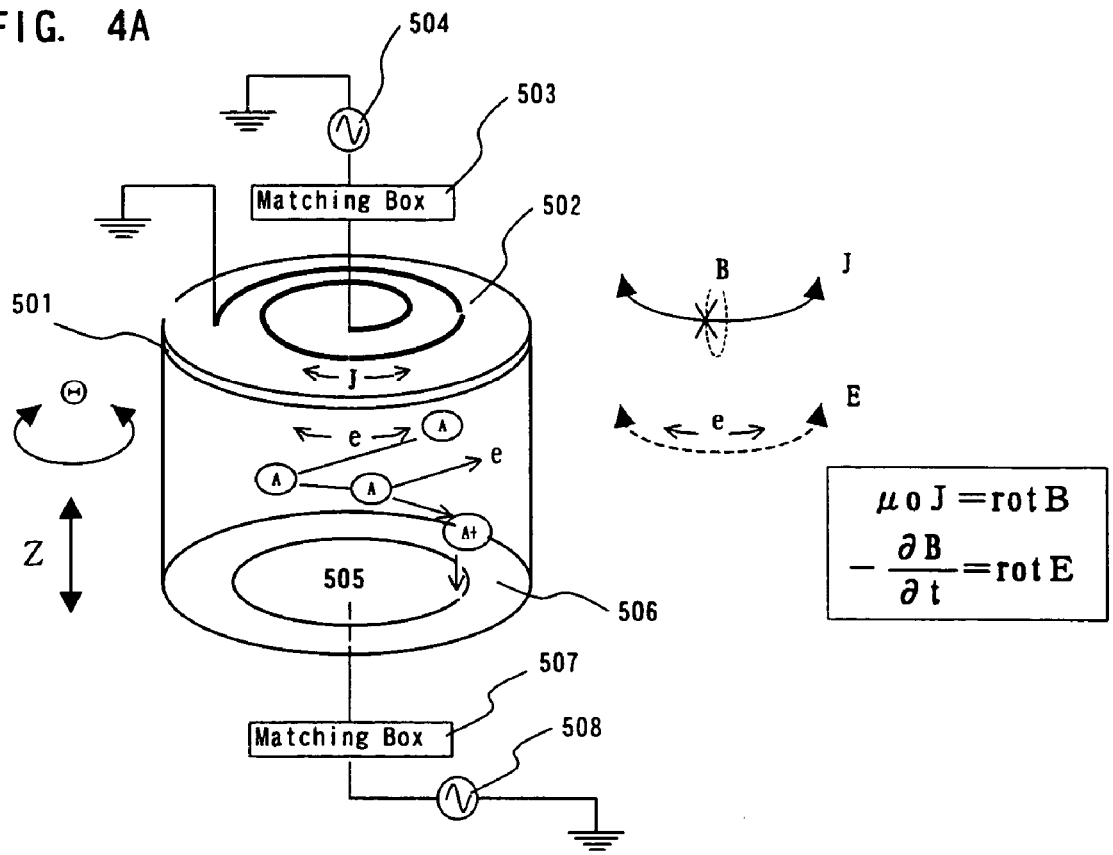
FIGS. 4A and 4B are schematic diagrams of an ICP dry etching apparatus.
Figure 4B:
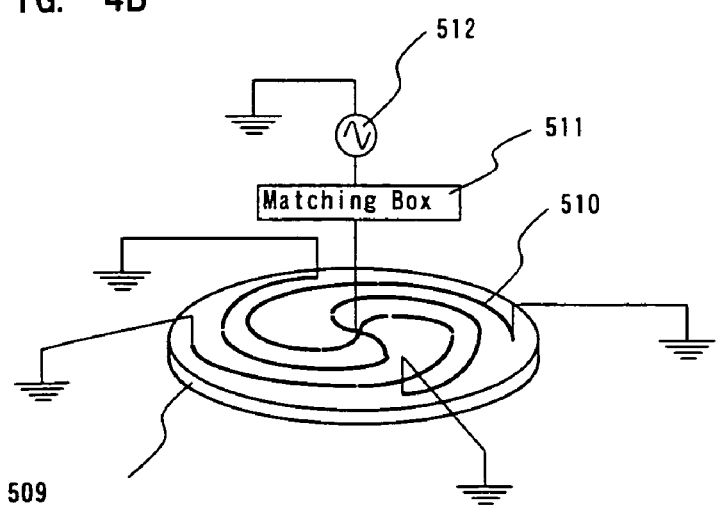
Figure 5A:
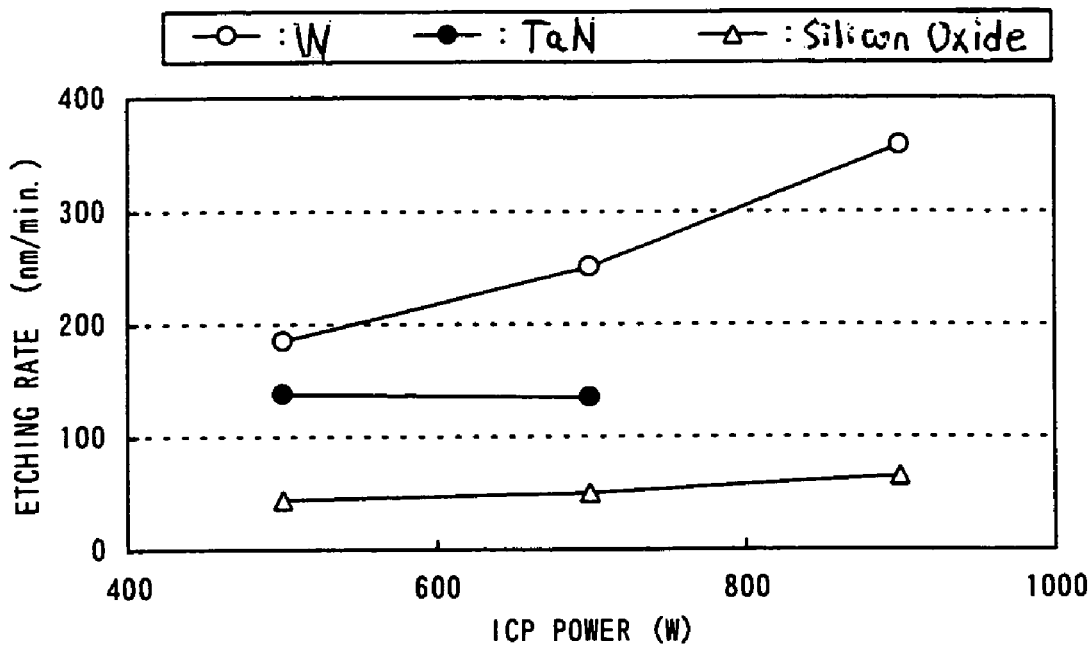
FIGS. 5A and 5B are diagrams showing ICP power dependence of an etching rate and of a selection ratio.
Figure 5B:
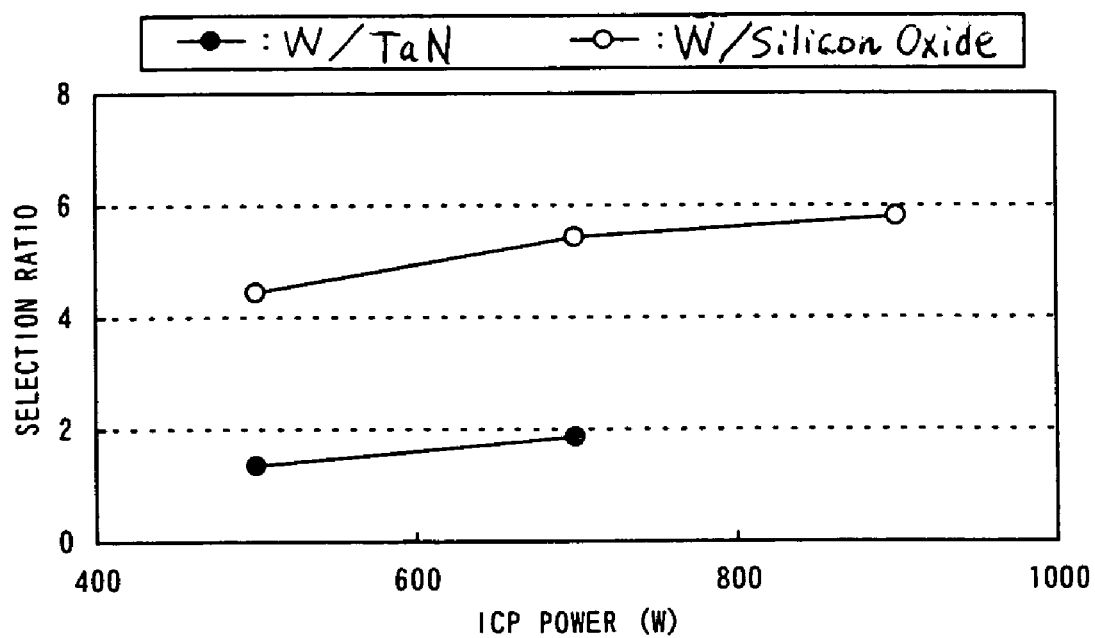
Figure 6A:
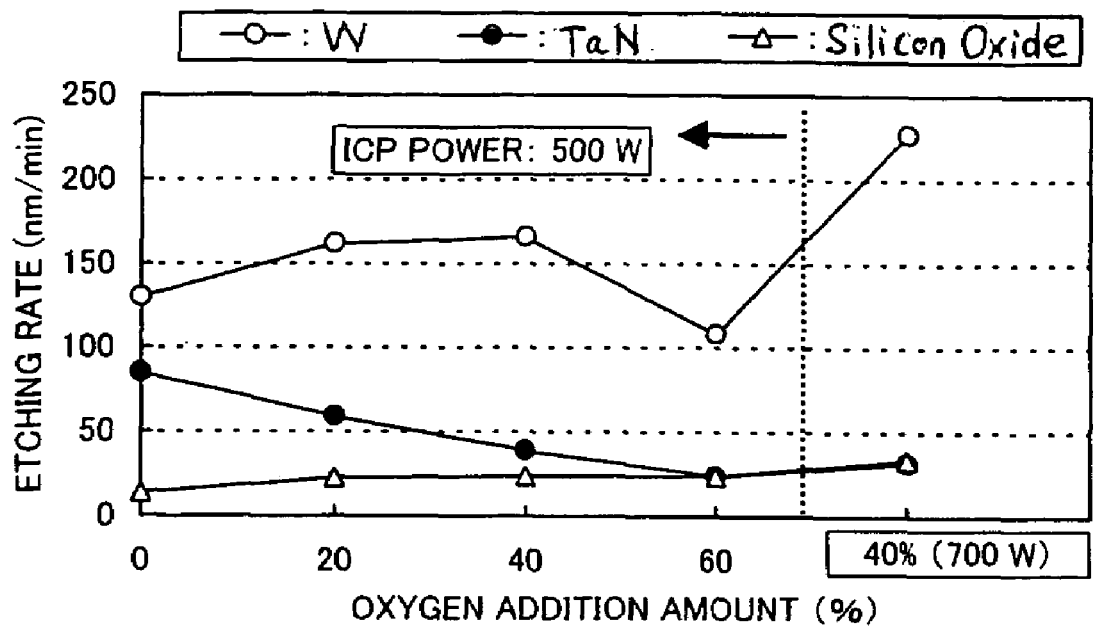
FIGS. 6A and 6B are diagrams showing oxygen addition amount dependence of an etching rate and of a selection ratio.
Figure 6B:
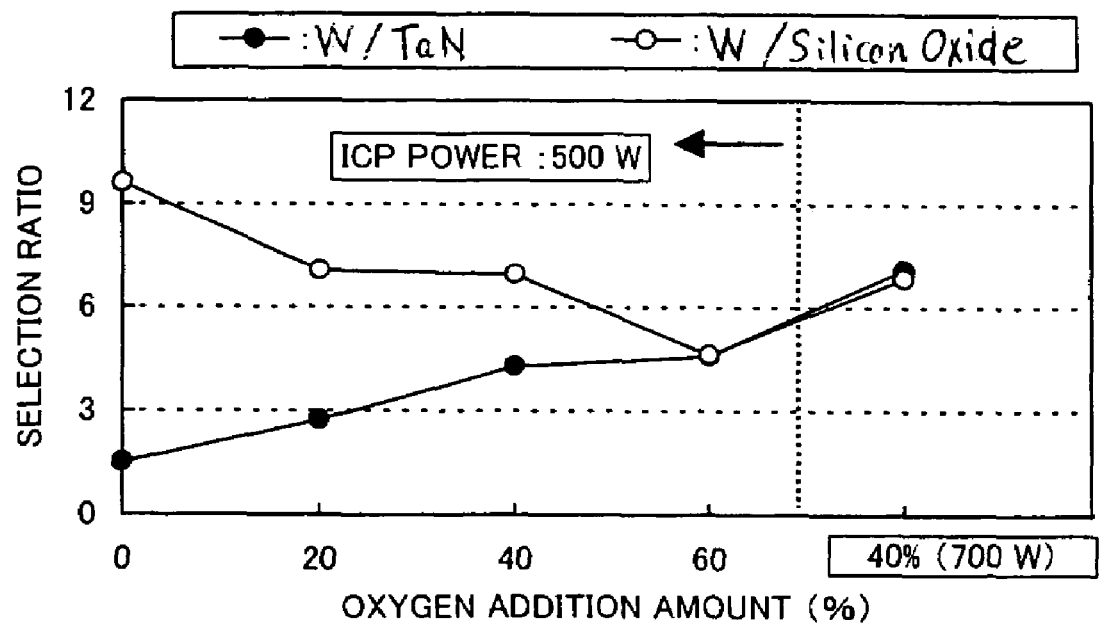
Figure 7A:
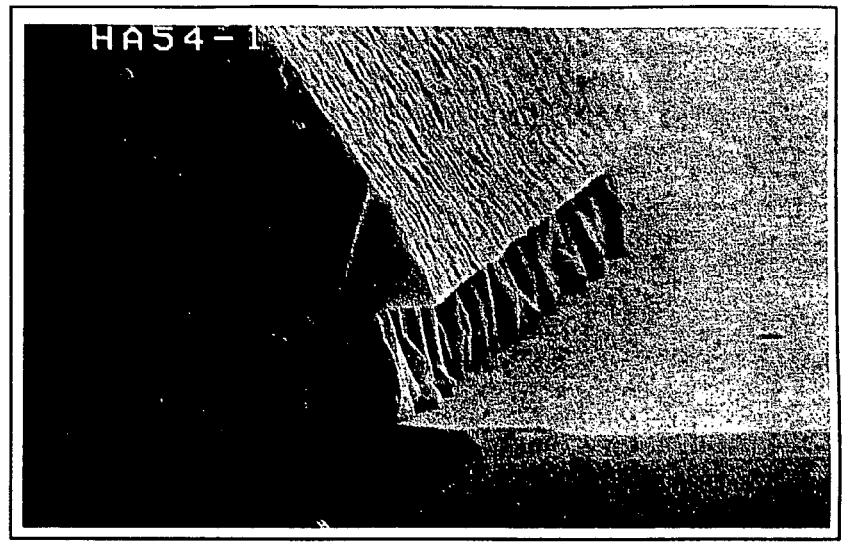
FIGS. 7A to 7C show SEM photographs of the state obtained after a dry etching process.
Figure 7B:
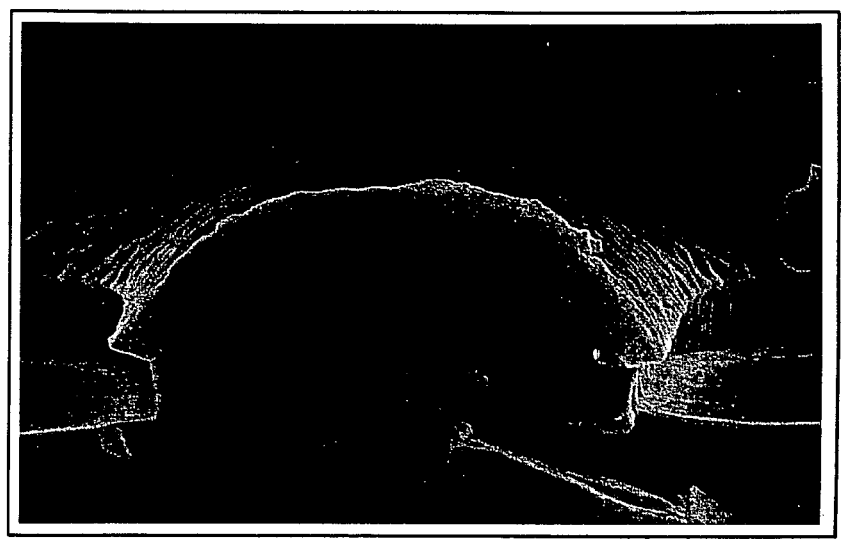
Figure 7C:
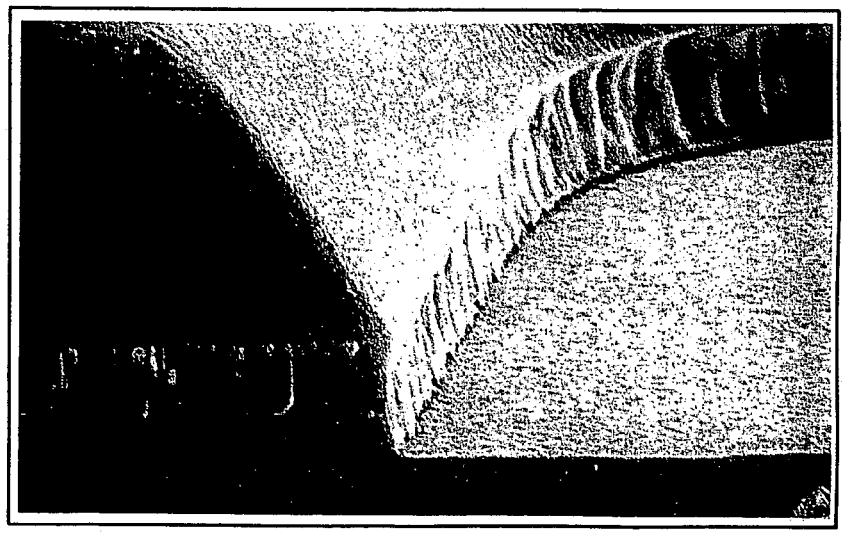
Figure 8A:
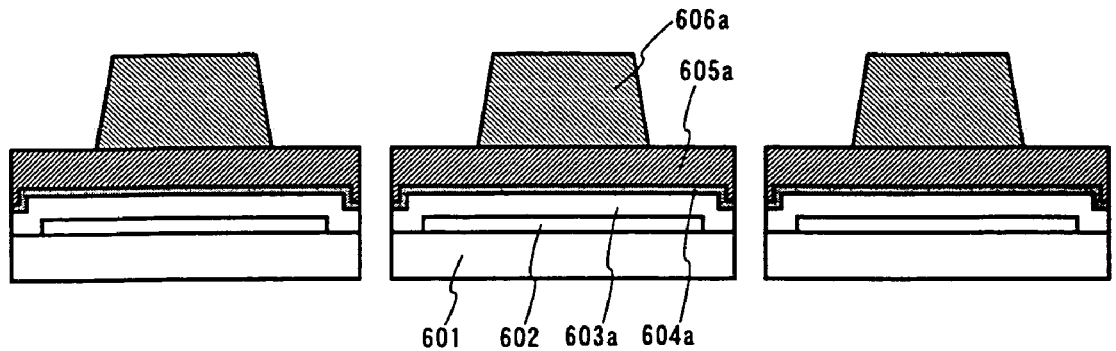
FIGS. 8A to 8D are sectional views showing manufacturing steps of a semiconductor display device having an LDD structure TFT and a GOLD structure TFT.
Figure 8B:
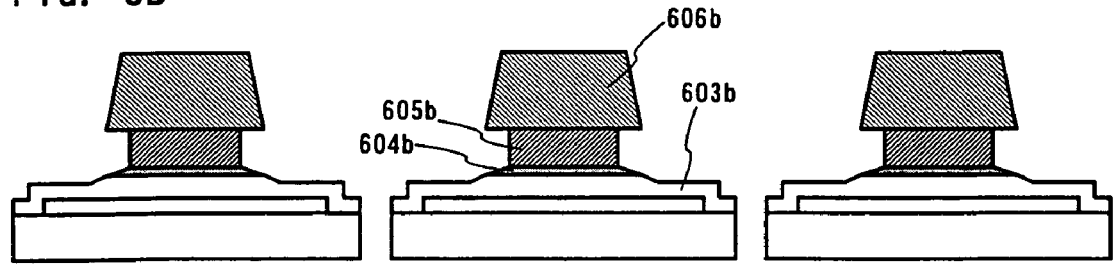
Figure 8C:
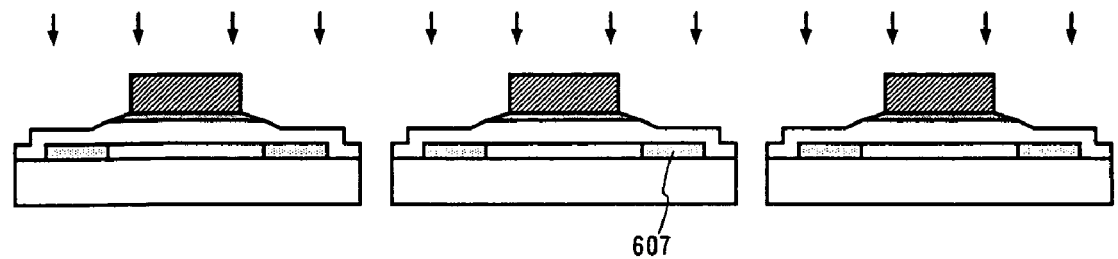
Figure 8D:
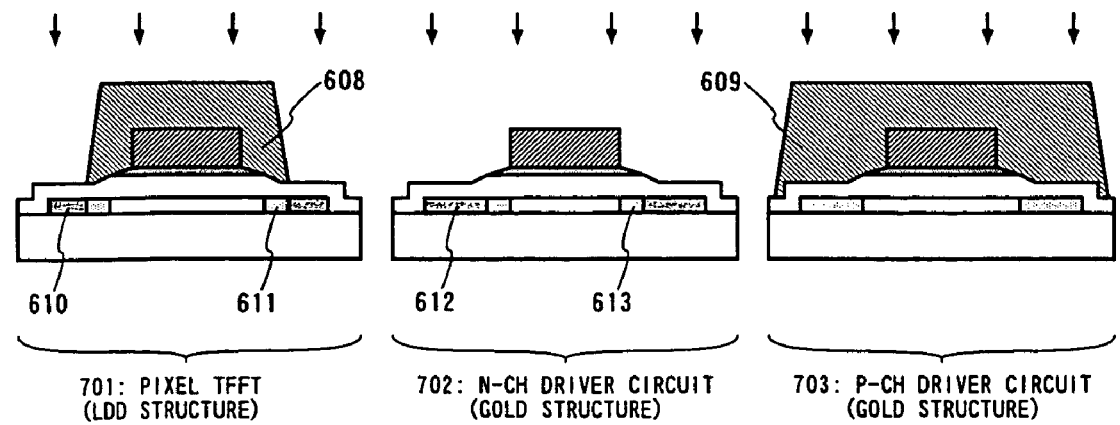

Hereinafter, embodiment modes of the present invention will be specifically described-with reference to FIGS. 8A to 12D. Here, FIGS. 8A to 9B and FIGS. 11A to 12D are sectional views for showing manufacturing steps in accordance with the embodiment modes of the present invention. FIG. 10B is a conceptual view for showing an impurity concentration distribution of a semiconductor layer.

EMBODIMENT MODE 1

In this embodiment mode, a description will be given of manufacturing steps of a semiconductor display device having TFTs of an LDD structure and a GOLD structure on a glass substrate as a transparent insulating substrate with reference to FIGS. 8A to 10B. Note that, a specific circuit configuration is as follows: a pixel TFT is composed using an LDD structure excellent in low OFF current characteristics and an n-channel or a p-channel driver circuit is composed using a GOLD structure high in resistance to hot carriers.

First, on a glass substrate 601 as a transparent insulating substrate which is formed in a square shape with a side being 12.5 cm, an amorphous silicon film having a thickness of 20 to 200 nm, preferably 30 to 70 nm, is deposited by a plasma CVD method or a reduced pressure CVD method. In this embodiment mode, the amorphous silicon film having a thickness of 53 nm is deposited. Thereafter, a polycrystalline silicon film is formed with a thickness of 50 nm through heat treatment. At this time, examples of a heat-treatment method for the amorphous silicon film may include heat treatment at 600° C. for about 24 hours using furnace annealing and laser crystallization at a laser power density of 200 mJ/cm$^2$ or more, and a combination of heat treatment using furnace annealing and laser crystallization. Note that, in this embodiment mode, the polycrystalline silicon film is adapted thereto, but a crystalline silicon film may be adapted thereto, which is subjected to thermal crystallization through addition of a catalytic element having an action of promoting crystallization. Also, after the polycrystalline silicon film or the crystalline silicon film is formed, a channel doping step may be performed in order to control a threshold voltage of the TFT in some cases. The channel doping step concerned is performed using a method of implanting a p-type impurity (specifically, a boron element) into an entire substrate surface at a small dosage in order to make an n-channel TFT an enhancement type (see FIG. 8A).

Next, generally used photolithography and dry etching processes are preformed to form an island-like semiconductor layer 602 through patterning with a predetermined pattern shape and a predetermined size. After pattern formation, a silicon oxide film or a silicon oxynitride film is deposited as a gate insulating film 603a with a thickness of 30 to 200 nm, preferably 80 to 130 nm by a plasma CVD method or a reduced pressure CVD method so as to cover the semiconductor layer 602. In this embodiment mode, the gate insulating film 603a made of a silicon oxide film having a thickness of 100 nm is deposited by a plasma CVD method. Note that, it is known that the gate insulating film 603a is required to have a thickness of 80 nm or more to avoid a stress applied from a gate electrode (gate electrode made of lamination of a W film and a TaN film) located in an upper layer. Thus, it is determined while taking into account this point (see FIG. 8A).

Next, a first-layer gate electrode film 604a made of a TaN film having a thickness of 5 to 50 nm, preferably 20 to 40 nm, is deposited by a sputtering method. In this embodiment mode, the first-layer gate electrode film 604a made of a TaN film having a thickness of 30 nm is deposited. Thereafter, a second-layer gate electrode film 605a made of a W film having a thickness of 200 to 600 nm, preferably 300 to 500 nm, more preferably 350 to 500 nm is deposited by a sputtering method. In this embodiment mode, the second-layer gate electrode film 605a made of a W film having a thickness of 370 nm is deposited. Note that, the thickness of the TaN film is determined while considering both of controllability of a residual film thickness in a taper-shaped region upon dry etching and implantation characteristics upon implantation of an impurity element through the TaN film by a through-doping method. Further, it is known that the W film is required to have a thickness of 340 nm or more in order to prevent channeling phenomenon from occurring in the W film upon the implantation of the impurity element. Thus, it is determined while taking into account this point. In this way, a metallic laminate film having a two-layer structure is deposited, followed by the general photolithography process. Thus, a resist pattern 606a for forming a gate electrode is formed (see FIG. 8A).

Next, a metallic laminate film is subjected to a dry etching process using the resist pattern 606a as a mask, the film including the first-layer gate electrode film 604a made of a TaN film with a thickness of 30 nm and the second-layer gate electrode film 605a made of a W film with a thickness of 370 nm. At this time, a dry etching step of one-step process or two-step process is adapted thereto, so that a gate electrode consisting of the first-layer gate electrode 604b and the second-layer gate electrode 605b is formed. In the dry etching process concerned, since the second-layer gate electrode 605b is formed by isotropic etching, the second-layer gate electrode 605b is decreased in size in a channel direction compared with the first-layer gate electrode 604b. Also, portions of the first-layer gate electrode 604b corresponding to exposed regions that protrude from the second-layer gate electrode 605b are formed by taper etching of the dry etching process concerned, and thus are formed into a tapered shape while being gradually thinned toward end portions. Also, the gate insulating film 603b is subjected to etching in regions at a given distance from the end portions of the first-layer gate electrode 604b due to film reduction in dry etching and is formed into a tapered shape. As the distance from the first-layer gate electrode 604b increases, the film becomes thinner and further, a residual film thickness is maintained as a thickness outside the above regions at the given distance. In addition, after development, the resist pattern 606a is changed into a resist pattern 606b in shape due to film reduction in dry etching (see FIG. 8B).

Here, for the above dry etching process, a dry etching method utilizing high density plasma which can independently control plasma density and a bias voltage applied to a subject substrate is suitable. Our company employs an ICP dry etching apparatus. Specific conditions of dry etching in the ICP dry etching apparatus concerned are as follows. That is, although differing between the dry etching step of one-step process and that of two-step process, the conditions employ dry etching conditions shown in Table 2 in the case of one-step process and employ those shown in Table 3 in the case of two-step process. In other words, in the case of dry etching step of one-step process, processing is performed under the etching conditions of the respective gas flow rates of $SF_6$, $Cl_2$, and $O_2$ as etching gas of 24 sccm, 12 sccm, and 24 sccm (corresponding to the oxygen addition amount of 40%), a chamber pressure of 1.3 Pa, an ICP power of 700 W (ICP power density: 1.427 W/cm$^2$), and a bias power of 10 W (bias power density: 0.064 W/cm$^2$). On the other hand, in the case of dry etching step of two-step process, processing of a first step is performed under the dry etching conditions of the respective gas flow rates of SF$_6$, Cl$_2$, and O$_2$ as etching gas of 24 sccm, 12 sccm, and 30 sccm, a chamber pressure of 1.3 Pa, an ICP power of 700 W (ICP power density: 1.427 W/cm$^2$), and a bias power of 10 W (bias power density: 0.064 W/cm$^2$), and subsequently processing of a second step is performed under the dry etching conditions of the gas flow rate of Cl$_2$ as etching gas of 60 sccm, a chamber pressure of 1.0 Pa, an ICP power of 350 W (ICP power density: 0.713 W/cm$^2$), and a bias power of 20 W (bias power density: 0.128 W/cm$^2$) (see Tables 2 and 3).

Next, through an ashing process and washing with an organic solvent, the resist pattern 606*b* as a mask for dry etching is removed. Thereafter, as a first doping process, an ion doping apparatus is used to implant an n-type impurity including a phosphorus element at a small dosage using the first-layer gate electrode 604*b* as a mask. Through the first doping process concerned, low concentration impurity regions (n$^{--}$ regions) 607 doped with an n-type impurity are formed in portions of the semiconductor layer 602 corresponding to regions positioned outside the first-layer gate electrode 604*b*. In this case, the low concentration impurity regions (n$^{--}$ regions) 607 are formed by implanting an impurity through the gate insulating film 603*b* as an upper-layer film using a so-called through-doping method. Note that, the following doping conditions are conceivable: phosphine (PH$_3$)/hydrogen (H$_2$) with phosphine (PH$_3$) contained at an amount corresponding to a phosphine (PH$_3$) dilution ratio of 3 to 20% is used as an ion source; an acceleration voltage is set to 30 to 90 kV; and a dosage is set to $6\times10^{12}$ to $1.5\times10^{14}$ ions/cm$^2$. In this embodiment mode, implantation is conducted under the following doping conditions: phosphine (PH$_3$)/hydrogen (H$_2$) with phosphine (PH$_3$) contained at an amount corresponding to a phosphine (PH$_3$) dilution ratio of 5% is used; an acceleration voltage is set to 50 kV; and a dosage is set to $3\times10^{13}$ ions/cm$^2$ (see FIG. 8C).

Next, through the general photolithography process, resist patterns 608 and 609 as a mask used for doping the impurity are formed. The above resist patterns 608 and 609 are formed in regions where a pixel TFT 701 of an LDD structure and a p-channel driver circuit 703 of a GOLD structure are formed, and are not formed in a region where an n-channel driver circuit 702 of a GOLD structure is formed. In this case, in the region where the pixel TFT 701 of an LDD structure is formed, the resist pattern 608 is formed such that end portions thereof are positioned inside the semiconductor layer 602 and outside the first-layer gate electrode 604*b* at a predetermined distance therefrom, i.e., such that they are positioned outside the end portions of the first-layer gate electrode 604*b* at a distance corresponding to an Loff region (described in the subsequent steps in detail). Further, in the region where the p-channel driver circuit 703 of a GOLD structure is formed, the resist pattern 609 is formed such that end portions thereof are positioned outside the semiconductor layer 602, i.e., such that the pattern completely covers the semiconductor layer 602 (see FIG. 8D).

Subsequently, as a second doping process, the ion doping apparatus is used to implant an n-type impurity including a phosphorus element at a large dosage. At this time, in the region where the pixel TFT 701 of an LDD structure is formed, through the second doping process concerned, high concentration impurity regions (n$^+$ regions) 610 doped with an n-type impurity are formed in portions of the semiconductor layer 602 corresponding to regions positioned outside the resist pattern 608. In the above semiconductor layer 602, the low concentration impurity regions (n$^{--}$ regions) 607 doped with an n-type impurity have been formed. However, according to the formation of the high concentration impurity regions (n$^+$ regions) 610, the above low concentration impurity regions (n$^{--}$ regions) 607 are divided into the high concentration impurity regions (n$^+$ regions) 610 and low concentration impurity regions (n$^{--}$ regions) 611 formed as a result thereof. The high concentration impurity regions (n$^+$ regions) 610 thus formed function as a source/drain region of an LDD structure. The low concentration impurity regions (n$^{--}$ regions) 611 function as an electric field relaxation region as the Loff region (electric field relaxation region overlapped with no gate electrode) of an LDD structure. On the other hand, in the region where the n-channel driver circuit 702 of a GOLD structure is formed, the low concentration impurity regions (n$^{--}$ regions) 607 doped with an n-type impurity have been formed in portions of the semiconductor layer 602 corresponding to regions positioned outside the first-layer gate electrode 604*b*. Further, high concentration impurity regions (n$^+$ regions) 612 doped with an n-type impurity are formed and at the same time, low concentration impurity regions (n$^-$ regions) 613 doped with an n-type impurity are formed in portions of the semiconductor layer 602 corresponding to exposed regions of the first-layer gate electrode 604*b* that protrude from the second-layer gate electrode 605*b*. The high concentration impurity regions (n$^+$ regions) 612 thus formed function as a source/drain region of a GOLD structure. The low concentration impurity regions (n$^-$ regions) 613 function as an electric field relaxation region as an Lov region (electric field relaxation region overlapped with the gate electrode) of a GOLD structure. Note that, the following doping conditions are conceivable: phosphine (PH$_3$)/hydrogen (H$_2$) with phosphine (PH$_3$) contained at an amount corresponding to a phosphine (PH$_3$) dilution ratio of 3 to 20% is used as an ion source; an acceleration voltage is set to 30 to 90 kV; and a dosage is set to $6\times10^{14}$ to $1.5\times10^{16}$ ions/cm$^2$. In this embodiment mode, implantation is conducted under the following doping conditions: phosphine (PH$_3$)/hydrogen (H$_2$) with phosphine (PH$_3$) contained at an amount corresponding to a phosphine (PH$_3$) dilution ratio of 5% is used; an acceleration voltage is set to 65 kV; and a dosage is set to $3\times10^{15}$ ions/cm$^2$ (see FIG. 8D).

The above high concentration impurity regions (n$^+$ regions) 610, 612 and the low concentration impurity regions (n$^-$ regions) 613 are formed by implanting an impurity through an upper-layer film using a so-called through-doping method. The through-doping method refers to a doping method in which an impurity is implanted into a target substance layer through the upper-layer film, with a characteristic in which an impurity concentration in the target substance layer can be changed depending on a film material and a film thickness of the upper-layer film. Accordingly, in spite of the implantation of the impurity using the same doping condition, it is possible that the high concentration impurity regions (n$^+$ regions) 610, 612 are formed in regions where the gate insulating film 603*b* capable of blocking less ions constitutes an upper-layer film and at the same time, the low concentration impurity regions (n$^-$ regions) 613 are formed in regions where a lamination film consisting of the first-layer gate electrode (TaN film) 604*b* capable of blocking a large amount of ions and the gate insulating film 603*b* constitutes an upper-layer film. Also, in the lamination film consisting of the first-layer gate electrode (TaN film) 604*b* and the gate insulating film 603*b*, which constitutes the upper-layer film of the low concentration impurity regions (n$^-$ regions) 613, the first-layer gate electrode (TaN film) 604*b* is formed into a tapered shape by taper etching. Thus, the lamination film has a concentration gradient in which an impurity concentration becomes gradually higher toward the high concentration impurity regions (n+ regions) 612 from the low concentration impurity regions (n− regions) 613. Similarly, the gate insulating film 603b as an upper-layer film of the high concentration impurity regions (n+ regions) 612 is also formed into a tapered shape in which the film thickness becomes gradually smaller in the regions at the given distance from the end portions of the first-layer gate electrode 604b. Thus, the film has the impurity concentration gradient as well (see FIG. 8D).

Figure 10A:
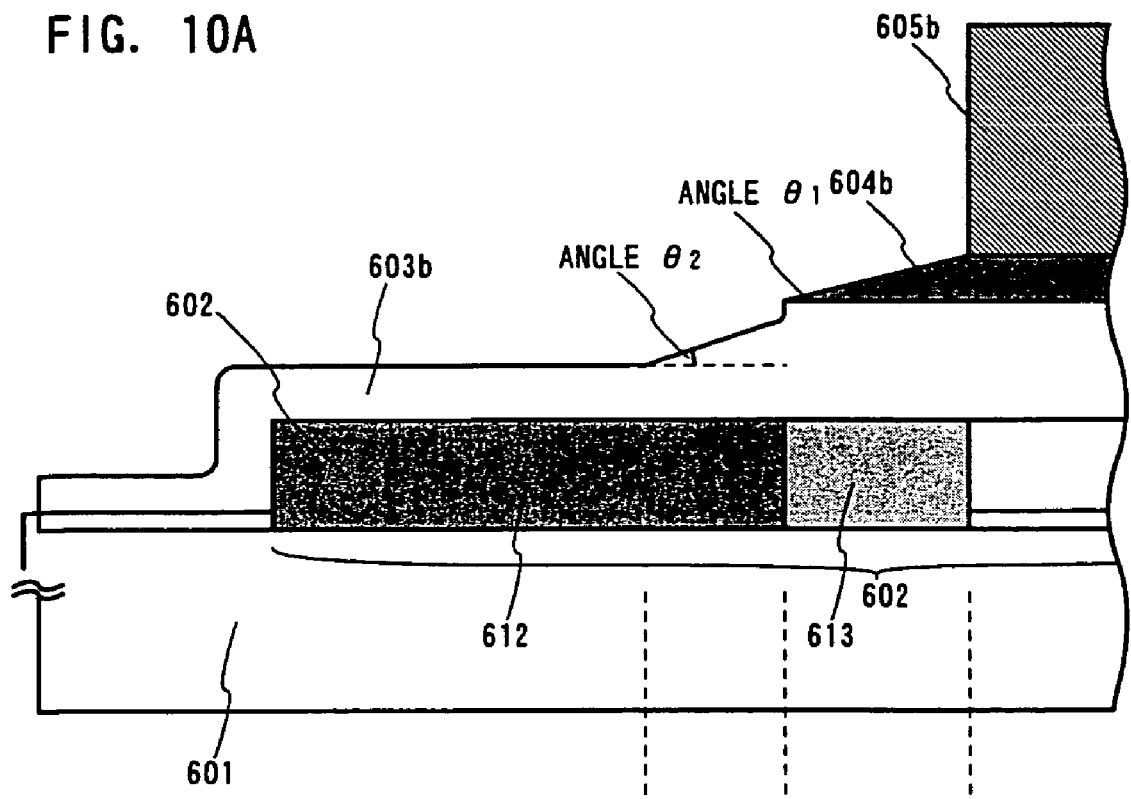
FIGS. 10A and 10B are a partial enlarged view of a step sectional view of a GOLD structure TFT, and a conceptual diagram showing a distribution of an impurity concentration in a semiconductor layer, respectively.

A detailed description will be further made on generation conditions of the above impurity concentration gradient with reference to FIGS. 10A and 10B. FIG. 10A is a partial enlarged view of the sectional view for showing a manufacturing step of the n-channel driver circuit 702 of a GOLD structure shown in FIG. 8D. FIG. 10B is a conceptual view showing an impurity concentration distribution in the semiconductor layer. As apparent from FIG. 10A, the regions corresponding to the exposed regions of the first-layer gate electrode (TaN film) 604b which protrude from the second-layer gate electrode (W film) 605b are formed into a tapered shape at a taper angle $\theta_1$ with the film being thinner toward the end portions due to taper etching. For this reason, when the n-type impurity is implanted by the through-doping method, in the low concentration impurity regions (n− regions) 613 doped with an n-type impurity which are located directly below the first-layer gate electrode 604b, the concentration gradient is obtained such that the impurity concentration becomes gradually higher toward the end portions of the first-layer gate electrode 604b as shown in FIG. 10B. In addition, the high concentration impurity regions (n+ regions) 612 doped with an n-type impurity and covered only with the gate insulating film 603b are formed into a tapered shape at a taper angle $\theta_2$ with the film being gradually thinner in the regions at the given distance from the end portions of the first-layer gate electrode 604b. Thus, the above regions exhibit the impurity concentration gradient. In this case, it is known that the regions at the given distance from the end portions of the first-layer gate electrode 604b are formed into a tapered shape due to retreat phenomenon of the resist pattern as a mask for dry etching. Note that, the above concentration gradient is highly effective in electric field relaxation in a channel horizontal direction and is extremely advantageous in prevention of occurrence of hot carriers as compared with the conventional TFT of a GOLD structure having no concentration gradient.

Next, through an ashing process and washing with an organic solvent, the resist patterns 608 and 609 as masks for the second doping process are removed. Thereafter, the general photolithography process is performed to form a resist pattern 614 as a mask for doping an impurity. In this case, the above resist pattern 614 is formed so as to open on the region where the p-channel driver circuit 703 of a GOLD structure is formed (see FIG. 9A).

Next, as a third doping process, the ion doping apparatus is used to implant a p-type impurity including a boron element at a large dosage by the through-doping method. Through the third doping process concerned, in the region where the p-channel driver circuit 703 of a GOLD structure is formed, high concentration impurity regions (p+ regions) 615 doped with a p-type impurity are formed in portions of the semiconductor layer 602 corresponding to regions positioned outside the first-layer gate electrode 604b. In addition, in portions of the semiconductor layer 602 corresponding to exposed regions of the first-layer gate electrode 604b which protrude from the second-layer gate electrode 605b, low concentration impurity regions (p− regions) 616 doped with a p-type impurity are simultaneously formed. The high concentration impurity regions (p+ regions) 615 thus formed function as a source/drain region of a GOLD structure. The low concentration impurity regions (p− regions) 616 function as an electric field relaxation region as the Lov region (electric field relaxation region overlapped with the gate electrode) of a GOLD structure (see FIG. 9A).

Here, in the high concentration impurity regions (p+ regions) 615 doped with a p-type impurity, the low concentration impurity regions (n−− regions) 607 doped with an n-type impurity have been formed in advance. However, the p-type impurity is implanted at a concentration equal to or higher than that of an n-type impurity, so that the high concentration impurity regions (p+ regions) 615 having a p-type conductivity as a whole are formed. Note that, the high concentration impurity regions (p+ regions) 615 and the low concentration impurity regions (p− regions) 616 which are both doped with a p-type impurity are simultaneously formed by the through-doping method utilizing the difference in film materials or film thicknesses of the upper-layer film in the same manner as in the n-type impurity regions. In this case, the following doping conditions are conceivable: diborane ($B_2H_6$)/hydrogen ($H_2$) with diborane ($B_2H_6$) contained at an amount corresponding to a diborane ($B_2H_6$) dilution ratio of 3 to 20% is used as an ion source; an acceleration voltage is set to 60 to 100 kV; and a dosage is set to $4\times10^{15}$ to $1\times10^{17}$ ions/cm². In this embodiment mode, implantation is conducted under the following doping conditions: diborane ($B_2H_6$)/hydrogen ($H_2$) with diborane ($B_2H_6$) contained at an amount corresponding to a diborane ($B_2H6$) dilution ratio of 5% is used; an acceleration voltage is set to 80 kV; and a dosage is set to $2\times10^{16}$ ions/cm² (see FIG. 9A).

Figure 9A:
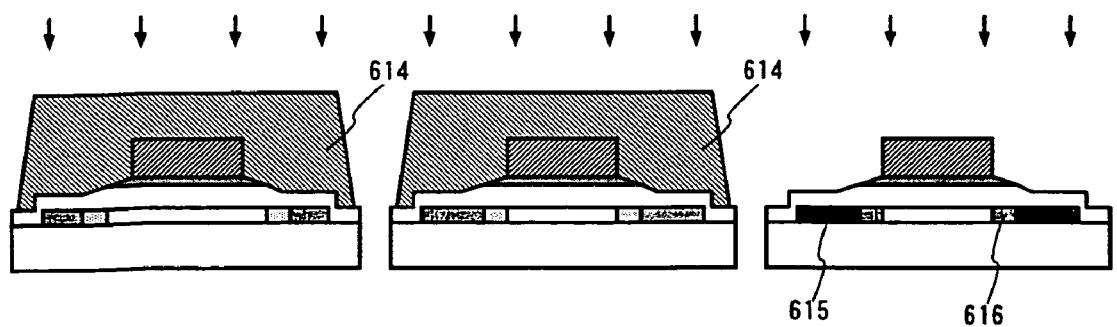
FIGS. 9A and 9B are sectional views showing manufacturing steps of a semiconductor display device having an LDD structure TFT and a GOLD structure TFT.
Figure 9B:
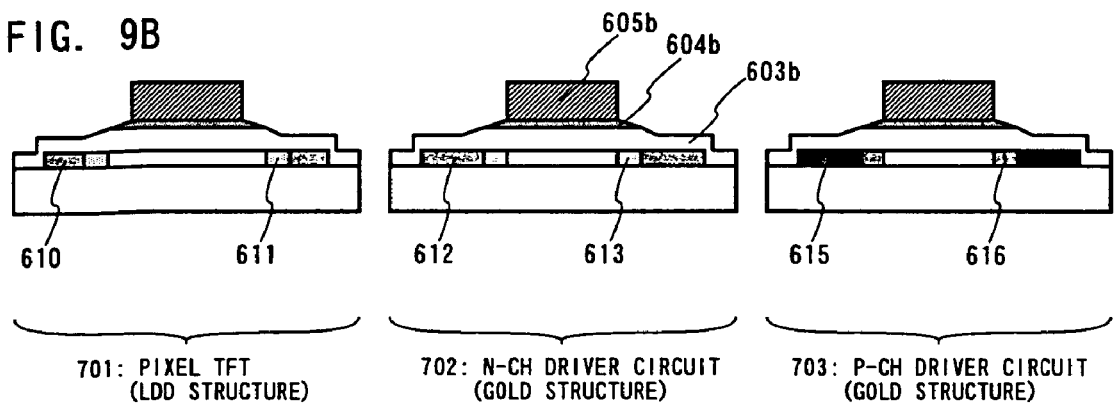
Figure 10B:
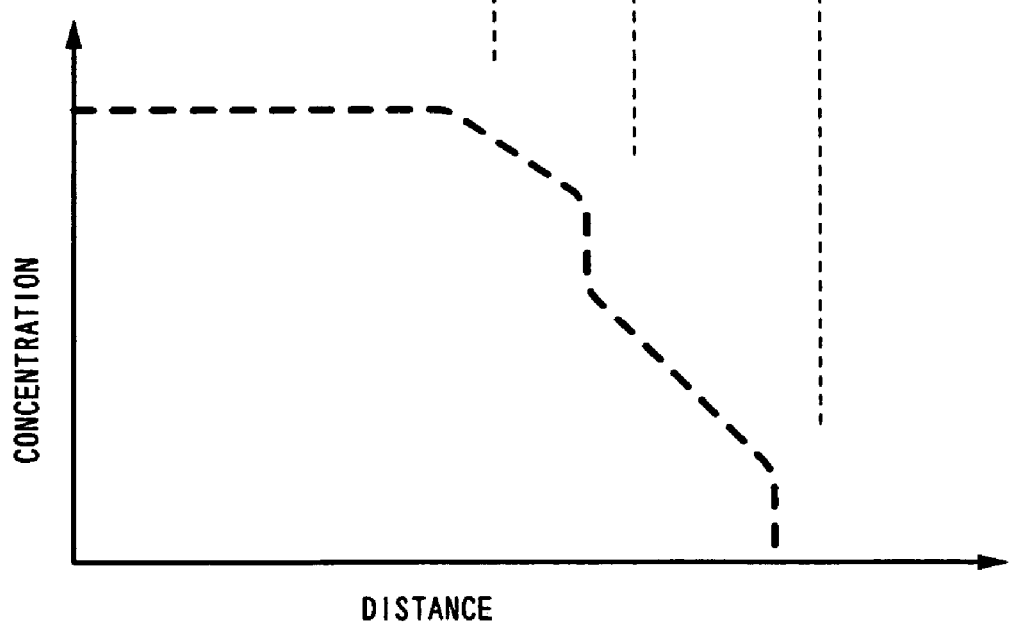

Finally, through the ashing process and washing with the organic solvent, the resist pattern 614 as a mask for the third doping process is removed (see FIG. 9B).

Through the above steps, the semiconductor display device having the pixel TFT 701 of an LDD structure, and the n-channel driver circuit 702 and the p-channel driver circuit 703 of a GOLD structure can be manufactured. In the step of forming the gate electrode in the above semiconductor display device, there is adapted a dry etching step of one-step process or two-step process using an ICP dry etching apparatus. This makes it possible to solve the problems inherent to the prior art in the dry etching step, that is, problems concerning, for example, decrease in throughput in the dry etching step and increase in process cost resulting from consumption amount increase of etching gas, and further decrease in yield of a semiconductor device resulting from the complicated dry etching step.

EMBODIMENT MODE 2

Figure 11A:
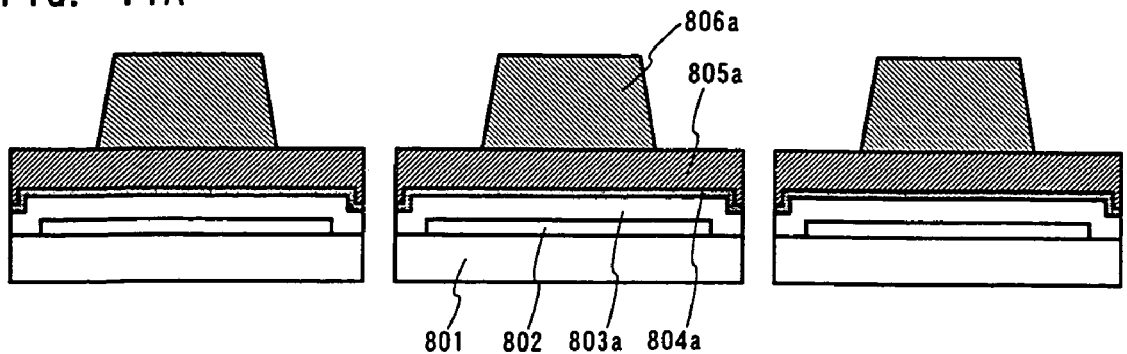
FIGS. 11A to 11D are sectional views showing manufacturing steps of a semiconductor display device having an LDD structure TFT and a GOLD structure TFT.
Figure 11B:
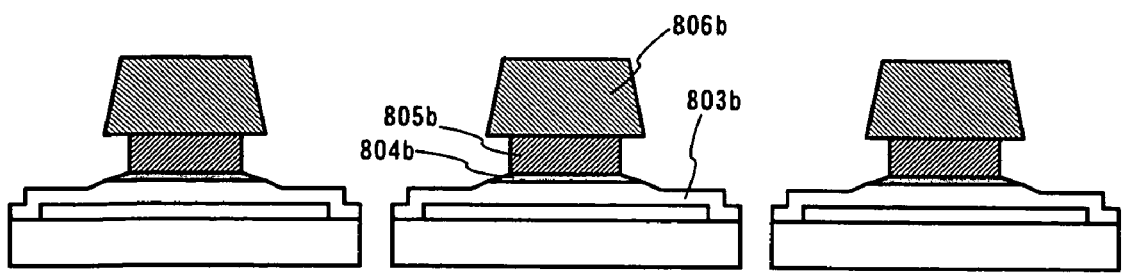
Figure 11C:
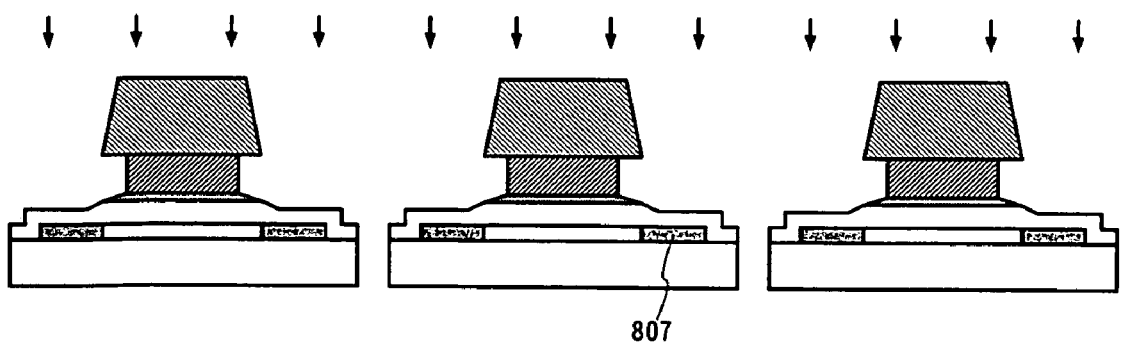
Figure 11D:
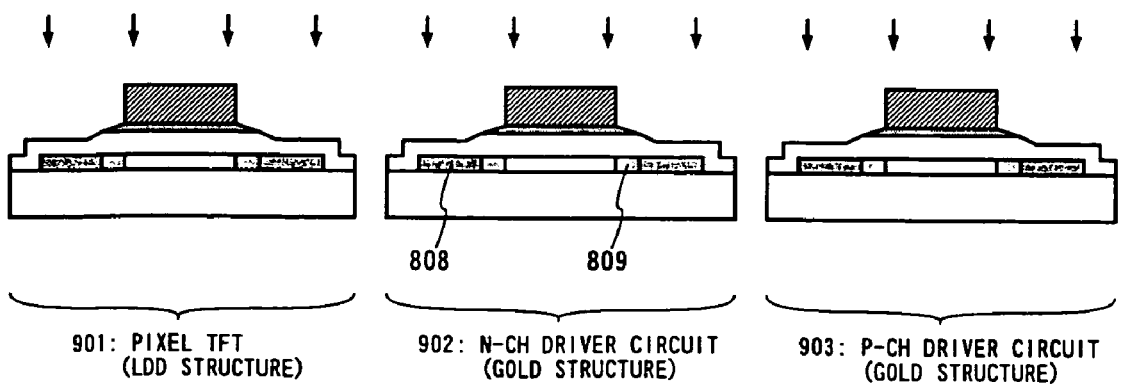

In this embodiment mode, a description will be given of manufacturing steps of a semiconductor display device having TFTs of an LDD structure and a GOLD structure, which are different from Embodiment Mode 1 with reference to FIGS. 11A to 12D. Specific circuit configuration in this case is similar to that in Embodiment Mode 1. Note that, manufacturing steps shown in FIGS. 11A and 11B are basically the same as those in Embodiment Mode 1 (FIGS. 8A and 8B) and thus are shown in a simple manner.

First, on a glass substrate 801 as a transparent insulating substrate which is formed in a square shape with a side being 12.5 cm, an island-like semiconductor layer 802 made of a polycrystalline silicon film (crystalline silicon film being substitutable therefor, which is formed utilizing a catalytic element) having a thickness of 50 nm is formed. A gate insulating film 803a made of a silicon oxide film (silicon oxynitride film being substitutable therefor) having a thickness of 100 nm is then deposited so as to cover the above semiconductor layer 802. Thereafter, a first-layer gate electrode film 804a made of a TaN film having a thickness of 5 to 50 nm, preferably 20 to 40 nm, and a second-layer gate electrode film 805a made of a W film having a thickness of 200 to 600 nm, preferably 300 to 500 nm, more preferably 350 to 500 nm are deposited by a sputtering method. In this embodiment mode, the first-layer gate electrode film 804a made of a TaN film having a thickness of 30 nm and the second-layer gate electrode film 805a made of a W film having a thickness of 370 nm are deposited. The general photolithography process is then performed to form a resist pattern 806a for forming a gate electrode (see FIG. 11A).

Next, a dry etching process is performed on a metallic laminate film using the resist pattern 806a as a mask through a dry etching step of one-step process or two-step process, the film including the first-layer gate electrode film 804a and the second-layer gate electrode film 805a. In the dry etching process concerned, since the second-layer gate electrode 805b is formed by isotropic etching, the second-layer gate electrode 805b is decreased in size in a channel direction as compared with the first-layer gate electrode 804b. Also, portions of the first-layer gate electrode 804b corresponding to exposed regions that protrude from the second-layer gate electrode 805b are formed by taper etching of the dry etching process concerned, and thus are formed into a tapered shape while being gradually thinned toward end portions. Also, the gate insulating film 803b is subjected to etching in regions at a given distance from the end portions of the first-layer gate electrode 804b due to film reduction in dry etching and is formed into a tapered shape. As the distance from the first-layer gate electrode 804b increases, the film becomes thinner and further, a residual film thickness is maintained as a given thickness outside the above regions at the given distance. Note that, it is assumed that the regions at the given distance therefrom are formed into a tapered shape due to retreat phenomenon of the resist pattern (the resist pattern 806a retreating toward the resist pattern 806b) in dry etching (see FIG. 11B).

Here, for the above dry etching step, a dry etching method utilizing high density plasma which can independently control plasma density and a bias voltage applied to a subject substrate is suitable. Our company employs an ICP dry etching apparatus. Specific conditions of dry etching in the ICP dry etching apparatus concerned are as follows. That is, although differing between the dry etching step of one-step process and that of two-step process, the conditions employ dry etching conditions shown in Table 2 in the case of one-step process and employ those shown in Table 3 in the case of two-step process. In other words, in the case of dry etching step of one-step process, processing is performed under the etching conditions of the respective gas flow rates of $SF_6$, $Cl_2$, and $O_2$ as etching gas of 24 sccm, 12 sccm, and 24 sccm (corresponding to the oxygen addition amount of 40%), a chamber pressure of 1.3 Pa, an ICP power of 700 W (ICP power density: 1.427 W/cm$^2$), and a bias power of 10 W (bias power density: 0.064 W/cm$^2$). On the other hand, in the case of dry etching step of two-step process, processing of a first step is performed under the dry etching conditions of the respective gas flow rates of $SF_6$, $Cl_2$, and $O_2$ as etching gas of 24 sccm, 12 sccm, and 30 sccm, a chamber pressure of 1.3 Pa, an ICP power of 700 W (ICP power density: 1.427 W/cm$^2$), and a bias power of 10 W (bias power density: 0.064 W/cm$^2$), and subsequently processing of a second step is performed under the dry etching conditions of the gas flow rate of $Cl_2$ as etching gas of 60 sccm, a chamber pressure of 1.0 Pa, an ICP power of 350 W (ICP power density: 0.713 W/cm$^2$), and a bias power of 20 W (bias power density: 0.128 W/cm$^2$) (see Tables 2 and 3).

Next, as a first doping process, an ion doping apparatus is used to implant an n-type impurity including a phosphorus element at a large dosage. Through the first doping process concerned, high concentration impurity regions (n$^+$ regions) 807 doped with an n-type impurity are formed by the through-doping method in portions of the semiconductor layer 802 corresponding to regions positioned outside the resist pattern 806b, i.e., outside the first-layer gate electrode 804b. In this case, the following doping conditions are conceivable: phosphine ($PH_3$)/hydrogen ($H_2$) with phosphine ($PH_3$) contained at an amount corresponding to a phosphine ($PH_3$) dilution ratio of 3 to 20% is used as an ion source; an acceleration voltage is set to 60 to 100 kV; and a dosage is set to $2\times10^{14}$ to $5\times10^{15}$ ions/cm$^2$. In this embodiment mode, implantation is conducted under the following doping conditions: phosphine ($PH_3$)/hydrogen ($H_2$) with phosphine ($PH_3$) contained at an amount corresponding to a phosphine ($PH_3$) dilution ratio of 5% is used; an acceleration voltage is set to 80 kV; and a dosage is set to $1\times10^{15}$ ions/cm$^2$ (see FIG. 11C).

Next, through an ashing process and washing with an organic solvent, the resist pattern 806b as a mask for the dry etching process and the first doping process is removed. Thereafter, as a second doping process, the ion doping apparatus is used to implant an n-type impurity including a phosphorus element at a small dosage using the second-layer gate electrode 805b as a mask. Through the second doping process concerned, low concentration impurity regions (n$^-$ regions) 809 doped with an n-type impurity are formed by the through-doping method in portions of the semiconductor layer 802 corresponding to exposed regions of the first-layer gate electrode 804b which protrude from the second-layer gate electrode 805b. Also, in portions of the semiconductor layer 802 corresponding to regions positioned outside the first-layer gate electrode 804b, the high concentration impurity regions (n$^+$ regions) 807 doped with an n-type impurity have been formed. However, since an n-type impurity is implanted into the above regions at a small dosage, high concentration impurity regions (n$^+$ regions) 808 are formed with a concentration of the n-type impurity further increased. Note that, the following doping conditions are conceivable: phosphine ($PH_3$)/hydrogen ($H_2$) with phosphine ($PH_3$) contained at an amount corresponding to a phosphine ($PH_3$) dilution ratio of 3 to 20% is used as an ion source; an acceleration voltage is set to 60 to 100 kV; and a dosage is set to $3\times10^{13}$ to $7.5\times10^{14}$ ions/cm$^2$. In this embodiment mode, implantation is conducted under the following doping conditions: phosphine ($PH_3$)/hydrogen ($H_2$) with phosphine ($PH_3$) contained at an amount corresponding to a phosphine ($PH_3$) dilution ratio of 5% is used; an acceleration voltage is set to 90 kV; and a dosage is set to $1.5\times10^{14}$ ions/cm$^2$ (see FIG. 11D).

Through the steps up to this step, in a region where an n-channel driver circuit 902 of a GOLD structure is manufactured, there is completed the formation of the high concentration impurity regions (n$^+$ regions) 808 doped with an n-type impurity which function as a source/drain region and the low concentration impurity regions (n$^-$ regions) 809 doped with an n-type impurity which function as an electric field relaxation region as an Lov region (electric field relaxation region overlapped with the gate electrode).

Next, the general photolithography process is performed to form a resist pattern 810 serving as a mask for a dry etching process. In this case, the above resist pattern 810 is formed so as to open on a region where a pixel TFT 901 of an LDD structure is formed. Subsequently, in the above opening, the second-layer gate electrode 805*b* made of a W film is used as a mask to remove the first-layer gate electrode 804*b* made of a TaN film by the dry etching process. The ICP dry etching apparatus is adapted for the above dry etching process so that there are employed dry etching conditions under which the film reduction of the W film is suppressed. As specific conditions of dry etching, the same conditions as those in the second step among the dry etching conditions shown in Table 3 can be employed for processing. That is, the dry etching process is conducted for a predetermined period of time under the dry etching conditions of the gas flow rate of $Cl_2$ as etching gas of 60 sccm, a chamber pressure of 1.0 Pa, an ICP power of 350 W (ICP power density: 0.713 $W/cm^2$), and a bias power of 20 W (bias power density: 0.128 $W/cm^2$) (see FIG. 12A and Table 3).

Through the steps up to this step, in a region where the pixel TFT 901 of an LDD structure is formed, there is completed the formation of the high concentration impurity regions ($n^+$ regions) 808 doped with an n-type impurity which function as a source/drain region and the low concentration impurity regions ($n^-$ regions) 809 doped with an n-type impurity which function as an electric field relaxation region as an Loff region (electric field relaxation region overlapped with no gate electrode).

Next, through the ashing process and washing with an organic solvent, the resist pattern 810 used as the mask for the dry etching process is removed. Thereafter, a generally used RIE system dry etching apparatus is used to perform a dry etching process for a predetermined period of time, so that the entire exposed regions of the gate insulating film 803*b* made of a silicon oxide film are etched back (thinned through etching). Through the above etch-back process, in the region where the pixel TFT 901 of an LDD structure is formed, the gate insulating film is etched back into a shape of a gate insulating film 812, and in the region where the n-channel driver circuit 902 of a GOLD structure is formed or in a region where a p-channel driver circuit 903 of a GOLD structure is formed, the gate insulating film is etched back into a shape of a gate insulating film 813. Note that, the above etch-back process is performed in order to increase implantation efficiency in implanting a boron element at a large dosage in the subsequent steps for doping process of a p-type impurity. Specific conditions of dry etching are as follows: a gas flow rate of $CHF_3$ as etching gas is 35 sccm; a chamber pressure is 7.3 Pa; and an RF power is 800 W (RF power density: 1.28 $W/cm^2$). Under these conditions, the dry etching process is performed for a predetermined period of time. In addition, the above etch-back process is conducted according to not an end point detection method but a time-based etching method, so that it is required to monitor an etching rate under control. Note that, as for the dry etching apparatus used for the above etch-back process, a batch process for four subject substrates (square substrates with a side being 12.5 cm) is employed, so that the RF power density is calculated through division of the RF power (80 W) by a total area of the four subject substrates ($4 \times 12.5 \times 12.5$ $cm^2$) (see FIG. 12B).

Next, the general photolithography process is performed to form a resist pattern 814 serving as a mask for doping an impurity. In this case, the above resist pattern 814 is formed so as to open on the region where the p-channel driver circuit 903 of a GOLD structure is formed. Thereafter, as a third doping process, the ion doping apparatus is used to implant a p-type impurity including a boron element by the through-doping method. In the above third doping process, the doping process is performed in two stages. In this case, a doping process at a low acceleration and a large dosage and a doping process at a high acceleration and a small dosage are performed. The doping process is performed in two stages because the preceding etch-back process of the gate insulating film 803*b* makes larger a difference in an ion blocking ability of the upper-layer film between the region where the high concentration impurity region is formed and the region where the low concentration impurity region is formed, which makes it difficult to simultaneously form the high concentration impurity region ($p^+$ region) and the low concentration impurity region ($p^-$ region) at one doping process. Through such a doping process at a low acceleration and a large dosage, in a region where the p-channel driver circuit 903 is formed, high concentration impurity regions ($p^+$ regions) 815 are formed in portions of the semiconductor layer 802 corresponding to regions positioned outside the first-layer gate electrode 804*b*. Also, through the doping process at a high acceleration and a small dosage, low concentration impurity regions ($p^-$ regions) 816 doped with a p-type impurity are formed in portions of the semiconductor layer 802 corresponding to exposed regions of the first-layer gate electrode 804*b* which protrude from the second-layer gate electrode 805*b*. Note that, the above high concentration impurity regions ($p^+$ regions) 815 are formed so as to function as a source/drain region of a GOLD structure. The above low concentration impurity regions ($p^-$ regions) 816 are formed so as to function as an electric field relaxation region as the Lov region (electric field relaxation region overlapped with the gate electrode) of a GOLD structure (see FIG. 12C).

Here, in the high concentration impurity regions ($p^+$ regions) 815 and the low concentration impurity regions ($p^-$ regions) 816 which are both doped with a p-type impurity, the high concentration impurity regions ($n^+$ regions) 808 and the low concentration impurity regions ($n^-$ regions) 809 which are both doped with an n-type impurity are respectively formed. However, the p-type impurity is implanted into the respective impurity regions at an impurity concentration twice or more the n-type impurity concentration, so that the high concentration impurity regions ($p^+$ regions) 815 and the low concentration impurity regions ($p^-$ regions) 816 are formed having a p-type conductivity as a whole. Note that, as the doping conditions at a low acceleration and a large dosage, the following are conceivable: diborane ($B_2H_6$)/hydrogen ($H_2$) with diborane ($B_2H_6$) contained at an amount corresponding to a diborane ($B_2H_6$) dilution ratio of 3 to 20% is used as an ion source; an acceleration voltage is set to 20 to 50 kV; and a dosage is set to $4 \times 10^{14}$ to $1 \times 10^{16}$ $ions/cm^2$. In this embodiment mode, implantation is conducted under the following doping conditions: diborane ($B_2H_6$)/hydrogen ($H_2$) with diborane ($B_2H_6$) contained at an amount corresponding to a diborane ($B_2H_6$) dilution ratio of 5% is used; an acceleration voltage is set to 30 kV; and a dosage is set to $2 \times 10^{15}$ $ions/cm^2$. Also, as the doping conditions at a high acceleration and a small dosage, the following are conceivable without changing the ion source: an acceleration voltage is set to 60 to 100 kV; and a dosage is set to $1.8 \times 10^{14}$ to $4.5 \times 10^{15}$ $ions/cm^2$. In this embodiment mode, implantation is conducted under the following doping conditions: diborane ($B_2H_6$)/hydrogen ($H_2$) with diborane ($B_2H_6$) contained at an amount corresponding to a diborane ($B_2H_6$) dilution ratio of 5% is used; an acceleration voltage is set to 80 kV; and a dosage is set to $9 \times 10^{14}$ $ions/cm^2$ (see FIG. 12C).

Figure 12A:
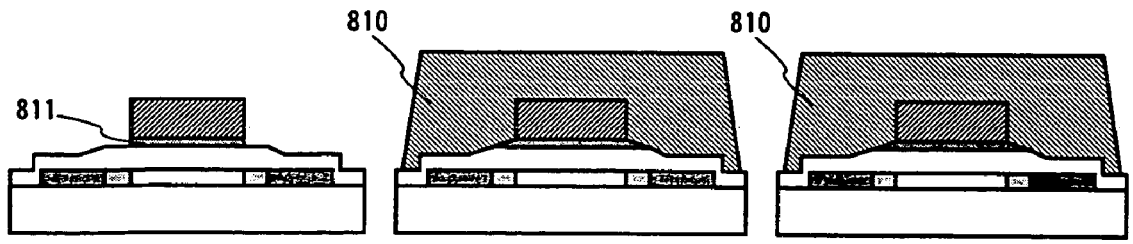
FIGS. 12A to 12D are sectional views showing manufacturing steps of a semiconductor display device having an LDD structure TFT and a GOLD structure TFT.
Figure 12B:
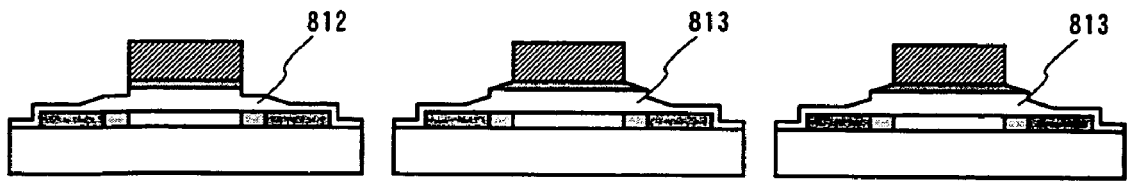
Figure 12C:
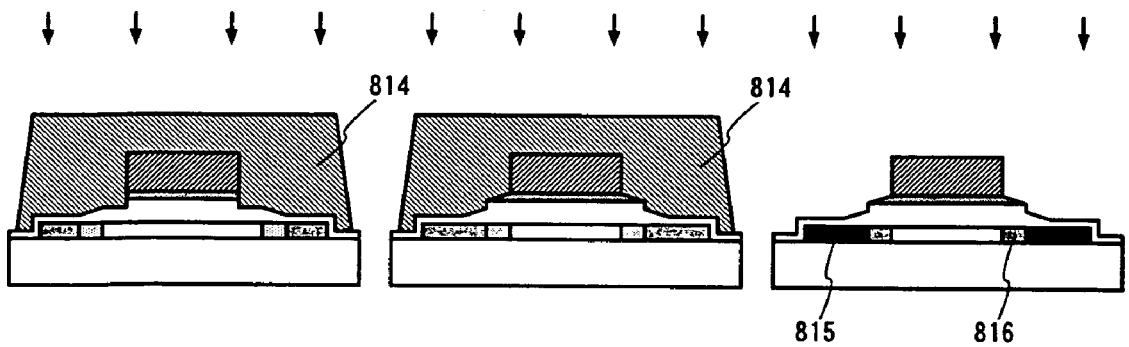
Figure 12D:
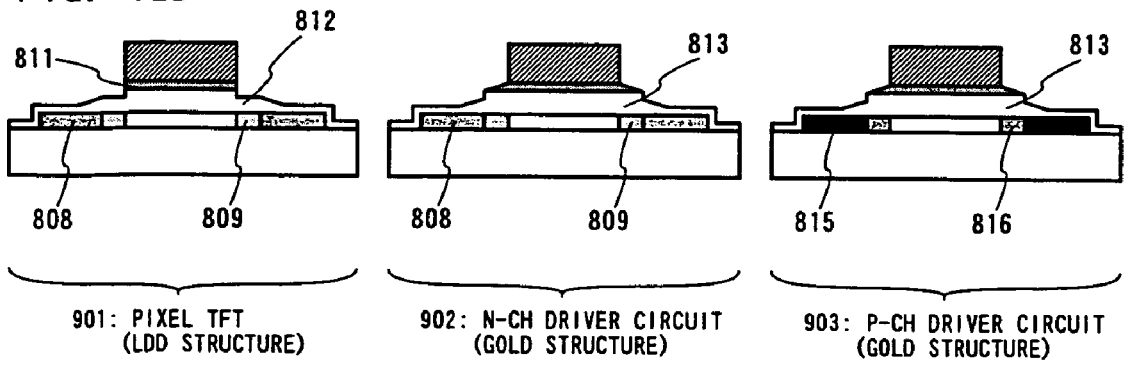

Finally, through the ashing process and washing with the organic solvent, the resist pattern 814 as a mask for the third doping process is removed (see FIG. 12D).

Through the above steps, the semiconductor display device having the pixel TFT 901 of an LDD structure, and the n-channel driver circuit 902 and the p-channel driver circuit 903 of a GOLD structure can be manufactured. In the step of forming the gate electrode in the above semiconductor display device, there is adapted a dry etching step of one-step process or two-step process using an ICP dry etching apparatus. This makes it possible to solve the problems inherent to the prior art in the dry etching step, that is, problems concerning, for example, decrease in throughput in the dry etching step and increase in process cost resulting from consumption amount increase of etching gas, and further decrease in yield of a semiconductor device resulting from the complicated dry etching step.

EMBODIMENT 1

In this embodiment, a specific description will be given of a manufacturing method for an active matrix liquid crystal display device using the present invention with reference to FIGS. 13A to 18B. Note that this embodiment basically employs the same manufacturing method as in Embodiment Mode 1 except that a crystalline silicon film crystallized using a catalytic element is adapted for the semiconductor layer as an active layer of the TFT instead of using the general polycrystalline silicon film.

First, on a glass substrate 1001 are deposited by a plasma CVD method silicon oxynitride films 1002a and 1002b as a first layer with a thickness of 50 nm and a second layer with a thickness of 100 nm, respectively, with different composition ratios, so as to constitute a base film 1002. Note that, the glass substrate 1001 used in this case may be made of quartz glass, barium borosilicate glass, aluminoborosilicate glass, etc. Next, on the base film 1002 (1002a and 1002b), an amorphous silicon film 1003a having a thickness of 20 to 200 nm, preferably 30 to 70 nm, is deposited by a plasma CVD method or a reduced pressure CVD method. In this embodiment, the amorphous silicon film 1003a having a thickness of 53 nm is deposited by the plasma CVD method. In this case, on a surface of the amorphous silicon film 1003a, an extremely thin natural oxide film (not shown) is formed due to oxygen in the air mixed into a process atmosphere. Note that, in this embodiment, the amorphous silicon film 1003a is deposited by the plasma CVD method, but it may be deposited by the reduced pressure CVD method (see FIG. 13A).

Here, upon the deposition of the amorphous silicon film 1003a, there is a possibility that carbon, oxygen, and nitrogen in the air are mixed therein. It is experientially known that these impurity gases mixed therein cause characteristic deterioration of TFTs finally obtained and they supposedly act as a factor for inhibiting crystallization. Accordingly, it is required to completely prevent the impurity gas from mixing therein. Specifically, in the case of the carbon and the nitrogen, both are preferably controlled to $5 \times 10^{17}$ atoms/cm$^3$ or less and in the case of oxygen, it is preferably controlled to $1 \times 10^{18}$ atoms/cm$^3$ or less (see FIG. 13A).

Next, the above substrate is washed with a diluted hydrofluoric acid for a predetermined period of time to remove the natural oxide film (not shown) formed on the surface of the amorphous silicon film 1003a. Following this, treatment with ozone water is performed for a predetermined period of time to lightly oxidize the surface of the amorphous silicon film 1003a. A clean and extremely thin silicon oxide film (not shown) is formed on the surface of the amorphous silicon film 1003a by the above light oxidization process. Also, the extremely thin silicon oxide film (not shown) may be formed by treatment with a hydrogen peroxide solution. Note that, the extremely thin silicon oxide film (not shown) is formed for the purpose of improving a wettability with respect to the amorphous silicon film 1003a such that, when a nitrogen element solution as a solution containing a catalytic element (hereinafter, abbreviated to catalytic element solution) is applied thereto by a spin-coating method later, the nitrogen element is uniformly attached thereto (see FIG. 13A).

Next, onto the entire surface of the amorphous silicon film 1003a (more precisely, the extremely thin silicon oxide film), the catalytic element solution including a nitrogen element solution having an action of promoting crystallization is applied by a spin-coating method. In this embodiment, a nickel acetate salt as a nickel compound is dissolved into pure water to be adjusted into a concentration of 10 ppm in terms of weight, and the resultant is used as a nickel element solution. The nickel containing layer (not shown) is uniformly attached onto the entire surface of the amorphous silicon film 1003a (more precisely, the extremely thin silicon oxide film) (see FIG. 13A).

Next, in order to control the hydrogen content in the amorphous silicon film 1003a to 5 atoms % or less, a dehydrogenation process is performed on hydrogen contained in the amorphous silicon film 1003a. The above dehydrogenation process is achieved by heat treatment using an annealing furnace in a nitrogen atmosphere at 450° C. for 1 hour. Thereafter, heat treatment in the annealing furnace at 550° C. for 4 hours is performed to promote crystallization of the amorphous silicon film 1003a to form a crystalline silicon film 1003b having a thickness of 50 nm. Subsequently, in order to further improve the crystallinity of the obtained crystalline silicon film 1003b, a KrF excimer laser of pulse oscillation (wavelength: 248 nm) is irradiated to crystallize the film. Note that, in this specification, in order to distinguish a polycrystalline silicon film crystallized using a nickel element as a catalytic element from the general polycrystalline silicon film, the film is called the crystalline silicon film. Here, the reason for employing the term crystalline instead of the term polycrystalline is that, in the film of the present invention, since crystal grains are oriented substantially in the same direction with high field effect mobility as characteristics thereof as compared with the general polycrystalline silicon film, the film is distinguished from the general polycrystalline silicon film (see FIG. 13A).

Next, washing prior to channel doping is performed by washing with a diluted hydrofluoric acid and ozone water for a predetermined period of time to form an extremely thin silicon oxide film (not shown) on the surface of the crystalline silicon film 1003b. The above extremely thin silicon oxide film (not shown) is formed for the purpose of preventing the crystalline silicon film 1003b from being etched due to hydrogen ions (generated from a mixed gas of diborane (B$_2$H$_6$) and hydrogen as an ion source) in the channel doping process. In order to control the threshold voltage of the n-channel and p-channel TFTs, the channel doping process as a first doping process is then conducted using an ion doping apparatus. The channel doping process is performed by implanting a p-type impurity (specifically, boron element) into the entire substrate surface at a small dosage. In this case, the following doping conditions are conceivable: diborane (B$_2$H$_6$)/hydrogen (H$_2$) with diborane (B$_2$H$_6$) contained at an amount corresponding to a diborane (B$_2$H$_6$) dilution ratio of 0.01 to 1% is used as an ion source; an acceleration voltage is set to 5 to 30 kV; and a dosage is set to $8 \times 10^{13}$ to $2 \times 10^{15}$ ions/cm$^2$. In this embodiment, in order to set a boron concentration in the crystalline silicon film 1003b to about $1 \times 10^{17}$ atoms/cm$^3$, implantation of the boron element is conducted under the following doping conditions: diborane (B$_2$H$_6$)/hydrogen (H$_2$) with diborane (B$_2$H$_6$) contained at an amount corresponding to a diborane (B$_2$H$_6$) dilution ratio of 0.1% is used; an acceleration voltage is set to 15 kV; and a dosage is set to $4 \times 10^{14}$ ions/cm$^2$ (see FIG. 13B).

Next, generally used photolithography and dry etching processes are preformed to conduct the pattern formation on the crystalline silicon film 1003b to thereby form island-like semiconductor layers 1004 to 1008 with a predetermined pattern shape and a predetermined size. Note that, the above semiconductor layers 1004 to 1008 are used to form a source/drain region and a channel region of the TFT in the subsequent steps (see FIG. 13B).

Next, a silicon oxide film or a silicon oxynitride film is deposited as a gate insulating film 1009 with a thickness of 30 to 200 nm, preferably 80 to 130 nm by a plasma CVD method or a reduced pressure CVD method so as to cover the semiconductor layers 1004 to 1008. In this embodiment, the gate insulating film 1009 made of a silicon oxide film having a thickness of 100 nm is deposited by a plasma CVD method. Note that, it is known that the gate insulating film 1009 is required to have a thickness of 80 nm or more to avoid a stress applied from a gate electrode (gate electrode made of lamination of a W film and a TaN film) located in an upper layer. Thus, it is determined while taking into account this point (see FIG. 14A).

Next, in order to deposit a metallic laminate film for a gate electrode, a first-layer gate electrode film 1010 and a second-layer gate electrode film 1011 are continuously deposited by a sputtering method. The first-layer gate electrode film 1010 can be made of a TaN film with a thickness of 5 to 50 nm, preferably 20 to 40 nm. In this embodiment, the TaN film having a thickness of 30 nm is deposited. The second-layer gate electrode film 1011 can be made of a W film with a thickness of 200 to 600 nm, preferably 300 to 500 nm, more preferably 350 to 500 nm. In this embodiment, the W film having a thickness of 370 nm is deposited. Note that, the thickness of the TaN film is determined while considering both of controllability of a residual film thickness in a taper-shaped region upon dry etching and implantation characteristics upon implantation of an impurity element through the TaN film by a through-doping method. Further, it is known that the W film is required to have a thickness of 340 nm or more in order to prevent channeling phenomenon from occurring in the W film upon the implantation of the impurity element. Thus, it is determined while taking into account this point (see FIG. 14A).

Next, the general photolithography process is conducted to form resist patterns 1012a to 1017a having a predetermined size on the metallic laminate film. Note that, the resist patterns 1012a to 1017a are used for forming a gate electrode, an electrode for a storage capacitor, a source wiring, and the like (see FIG. 14B).

The dry etching process is performed on the metallic laminate film consisting of the first-layer gate electrode film 1010 made of a TaN film with a thickness of 30 nm and the second-layer gate electrode film 1011 made of a W film with a thickness of 370 nm using the resist patterns 1012a to 1017a as masks. At this time, a dry etching step of one-step process or two-step process is adapted to the above dry etching process. Gate electrodes consisting of first-layer gate electrodes 1012d to 1015d and second-layer gate electrodes 1012c to 1015c with a predetermined size are formed. At the same time, there are formed a storage capacitor electrode with a predetermined size consisting of a first-layer storage capacitor electrode 1016d and a second-layer storage capacitor electrode 1016c, and a source wiring electrode with a predetermined size consisting of a first-layer source wiring electrode 1017d and a second-layer source wiring electrode 1017c. In the dry etching process concerned, since second-layer electrodes 1012c to 1017c (generic term for the electrodes consisting of the second-layer gate electrodes 1012c to 1015c, the second-layer storage capacitor electrode 1016c, and the second-layer source wiring electrode 1017c) are formed by isotropic etching, so that the second-layer electrodes 1012c to 1017c are decreased in size in a channel direction compared with first-layer electrodes 1012d to 1017d (generic term for the electrodes consisting of the first-layer gate electrodes 1012d to 1015d, the first-layer storage capacitor electrode 1016d, and the first-layer source wiring electrode 1017d). Also, portions of the first-layer electrodes 1012d to 1017d corresponding to exposed regions that protrude from the second-layer electrodes 1012c to 1017c are formed by taper etching of the dry etching process concerned, and thus are formed into a tapered shape while being gradually thinned toward the end portions. Also, the gate insulating film 1018 is subjected to etching in regions at a given distance from the end portions of the first-layer electrodes 1012d to 1017d due to film reduction in dry etching and is formed into a tapered shape. As the distance from the first-layer electrodes 1012d to 1017d increases, the film becomes thinner and further, a residual film thickness is maintained as a given thickness outside the above regions at the given distance. In addition, after development, the resist patterns 1012a to 1017a are changed into resist patterns 1012b to 1017b in shape due to film reduction in dry etching (see FIG. 15A).

Here, for the above dry etching step, a dry etching method utilizing high density plasma which can independently control plasma density and a bias voltage applied to a subject substrate is suitable. Our company employs an ICP dry etching apparatus. Specific conditions of dry etching in the ICP dry etching apparatus concerned are as follows. That is, although differing between the dry etching step of one-step process and that of two-step process, the conditions employ dry etching conditions shown in Table 2 in the case of one-step process and employ those shown in Table 3 in the case of two-step process. In other words, in the case of dry etching step of one-step process, processing is performed under the etching conditions of the respective gas flow rates of $SF_6$, $Cl_2$, and $O_2$ as etching gas of 24 sccm, 12 sccm, and 24 sccm (corresponding to the oxygen addition amount of 40%), a chamber pressure of 1.3 Pa, an ICP power of 700 W (ICP power density: 1.427 W/cm$^2$), and a bias power of 10 W (bias power density: 0.064 W/cm$^2$). On the other hand, in the case of dry etching step of two-step process, processing of a first step is performed under the dry etching conditions of the respective gas flow rates of $SF_6$, $Cl_2$, and $O_2$ as etching gas of 24 sccm, 12 sccm, and 30 sccm, a chamber pressure of 1.3 Pa, an ICP power of 700 W (ICP power density: 1.427 W/cm$^2$), and a bias power of 10 W (bias power density: 0.064 W/cm$^2$), and subsequently processing of a second step is performed under the dry etching conditions of the gas flow rate of $Cl_2$ as etching gas of 60 sccm, a chamber pressure of 1.0 Pa, an ICP power of 350 W (ICP power density: 0.713 W/cm$^2$), and a bias power of 20 W (bias power density: 0.128 W/cm$^2$) (see Tables 2 and 3).

Next, through an ashing process and washing with an organic solvent, the resist patterns 1012b to 1017b as a mask for dry etching are removed. Thereafter, as a second doping process, an ion doping apparatus is used to implant an n-type impurity including a phosphorus element at a small dosage using the first-layer electrodes 1012d to 1016d as a mask. Through the second doping process concerned, low concentration impurity regions (n$^{--}$ regions) 1019 to 1023 doped with an n-type impurity are formed in portions of the semiconductor layers 1004 to 1008 corresponding to regions positioned outside the first-layer electrodes 1012d to 1016d. In this case, the low concentration impurity regions (n$^{--}$ regions) 1019 to 1023 are formed by implanting an impurity through the gate insulating film 1018 as an upper-layer film using a so-called through-doping method. Note that, the following doping conditions are conceivable: phosphine ($PH_3$)/ hydrogen ($H_2$) with phosphine ($PH_3$) contained at an amount corresponding to a phosphine ($PH_3$) dilution ratio of 3 to 20% is used as an ion source; an acceleration voltage is set to 30 to 90 kV; and a dosage is set to $6\times10^{12}$ to $1.5\times10^{14}$ ions/cm². In this embodiment, implantation is conducted under the following doping conditions: phosphine ($PH_3$)/hydrogen ($H_2$) with phosphine ($PH_3$) contained at an amount corresponding to a phosphine ($PH_3$) dilution ratio of 5% is used; an acceleration voltage is set to 50 kV; and a dosage is set to $3\times10^{13}$ ions/cm² (see FIG. 15B).

Next, through the general photolithography process, resist patterns 1024 and 1025 as a mask used for doping the impurity are formed. The above resist patterns 1024 and 1025 are formed in regions where a p-channel TFT 1102 constituting a driver circuit 1106 of a GOLD structure and a pixel TFT 1104 of an LDD structure are formed, and are not formed in regions where n-channel TFTs 1101 and 1103 constituting the driver circuit 1106 of a GOLD structure and a storage capacitor 1105 are formed. In this case, in the region where the p-channel TFT 1102 of a GOLD structure is formed, the resist pattern 1024 is formed such that end portions thereof are positioned outside the semiconductor layer 1005, i.e., such that the pattern completely covers the semiconductor layer 1005. In addition, in the region where the pixel TFT 1104 of an LDD structure is formed, the resist pattern 1025 is formed such that end portions thereof are positioned inside the semiconductor layer 1007 and outside the first-layer gate electrode 1015*d* at a given distance therefrom, i.e. such that they are positioned outside end portions of the first-layer gate electrode 1015*d* at a distance corresponding to an Loff region (described in the subsequent steps in detail) (see FIG. 16A).

Subsequently, as a third doping process, the ion doping apparatus is used to implant an n-type impurity including a phosphorus element at a large dosage. At this time, in the regions where the n-channel TFTs 1101 and 1103 constituting the driver circuit 1106 of a GOLD structure are formed, in portions of the semiconductor layers 1004 and 1006 corresponding to regions positioned outside the first-layer gate electrodes 1012*d* and 1014*d*, the low concentration impurity regions (n⁻⁻ regions) 1019 and 1021 doped with an n-type impurity have been formed. Further, high concentration impurity regions (n⁺ regions) 1026 and 1028 doped with an n-type impurity are formed and at the same time, low concentration impurity regions (n⁻ regions) 1027 and 1029 doped with an n-type impurity are formed in portions of the semiconductor layers 1004 and 1006 corresponding to exposed regions of the first-layer gate electrodes 1012*d* and 1014*d* that protrude from the second-layer gate electrodes 1012*c* and 1014*c*. The high concentration impurity regions (n⁺ regions) 1026 and 1028 thus formed function as a source/drain region of a GOLD structure. The low concentration impurity regions (n⁻ regions) 1027 and 1029 function as an electric field relaxation region as an Lov region (electric field relaxation region overlapped with the gate electrode) of a GOLD structure. Also in the region where the storage capacitor 1105 is formed, high concentration impurity regions (n⁺ regions)

1032 and low concentration impurity regions (n⁻ regions) 1033 which are both doped with an n-type impurity are similarly formed. The thus formed high concentration impurity regions (n⁺ regions) 1032 and low concentration impurity regions (n⁻ regions) 1033 which are both doped with an n-type impurity function as one electrode for forming a capacitor because the above regions are regions where the storage capacitor 1105 is formed instead of the TFT (see FIG. 16A).

On the other hand, in the region where the pixel TFT 1104 of an LDD structure is formed, through the above third doping process, high concentration impurity regions (n⁺ regions) 1030 doped with an n-type impurity are formed in portions of the semiconductor layer 1007 corresponding to regions positioned outside the resist pattern 1025. In the above semiconductor layer 1007, the low concentration impurity regions (n⁻⁻ regions) 1022 doped with an n-type impurity have been formed. However, according to the formation of the high concentration impurity regions (n⁺ regions) 1030, the above low concentration impurity regions (n⁻⁻ regions) 1022 are divided into the high concentration impurity regions (n⁺ regions) 1030 and low concentration impurity regions (n⁻⁻ regions) 1031 formed as a result thereof. The high concentration impurity regions (n⁺ regions) 1030 thus formed function as a source/drain region of an LDD structure. The low concentration impurity regions (n⁻⁻ regions) 1031 function as an electric field relaxation region as the Loff region (electric field relaxation region overlapped with no gate electrode) of an LDD structure. Note that, the following doping conditions are conceivable: phosphine ($PH_3$)/hydrogen ($H_2$) with phosphine ($PH_3$) contained at an amount corresponding to a phosphine ($PH_3$) dilution ratio of 3 to 20% is used as an ion source; an acceleration voltage is set to 30 to 90 kV; and a dosage is set to $6\times10^{14}$ to $1.5\times10^{16}$ ions/cm². In this embodiment, implantation is conducted under the following doping conditions: phosphine ($PH_3$)/hydrogen ($H_2$) with phosphine ($PH_3$) contained at an amount corresponding to a phosphine ($PH_3$) dilution ratio of 5% is used; an acceleration voltage is set to 65 kV; and a dosage is set to $3\times10^{15}$ ions/cm² (see FIG. 16A).

The above high concentration impurity regions (n⁺ regions) 1026, 1028, 1030, and 1032 and low concentration impurity regions (n⁻ regions) 1027, 1029, and 1033 are formed by implanting an impurity through an upper-layer film using a so-called through-doping method. The through-doping method refers to a doping method in which an impurity is implanted into a target substance layer through the upper-layer film, with a characteristic in which an impurity concentration in the target substance layer can be changed depending on a material and a thickness of the upper-layer film. Accordingly, in spite of the implantation of the impurity using the same doping conditions, it is possible that the high concentration impurity regions (n⁺ regions) 1026, 1028, 1030, and 1032 are formed in regions where the gate insulating film 1018 capable of blocking less ions constitutes an upper-layer film and at the same time, the low concentration impurity regions (n⁻ regions) 1027, 1029, and 1033 are formed in regions where a lamination film consisting of the first-layer electrodes (TaN films) 1012*d*, 1014*d*, and 1016*d* capable of blocking a large amount of ions and the gate insulating film 1018 constitutes an upper-layer film. Also, in the lamination film consisting of the first-layer electrodes (TaN films) 1012*d*, 1014*d*, and 1016*d* and the gate insulating film 1018, which constitutes the upper-layer film of the low concentration impurity regions (n⁻ regions) 1027, 1029, and 1033, the first-layer electrodes (TaN films) 1012*d*, 1014*d*, and 1016*d* are formed into a tapered shape by taper etching. Thus, the lamination film has a concentration gradient in which an impurity concentration becomes gradually higher toward the high concentration impurity regions (n⁺ regions) 1026, 1028, and 1032 from the low concentration impurity regions (n⁻ regions) 1027, 1029, and 1033. Similarly, the gate insulating film 1018 as an upper-layer film of the high concentration impurity regions (n⁺ regions) 1026, 1028, and 1032 is also formed into a tapered shape in which the film thickness becomes gradually smaller in the regions at the given distance from the end portions of the first-layer electrodes 1012d, 1014d, and 1016d. Thus, the film has the impurity concentration gradient as well (see FIG. 16A).

Note that, in the regions where the n-channel TFTs 1101 and 1103 constituting the driver circuit 1106 of a GOLD structure are formed, in association with the formation of the above high concentration impurity regions (n+ regions) 1026, 1028 and the low concentration impurity regions (n− regions) 1027, 1029, regions of the semiconductor layers 1004 and 1006 overlapped with the second-layer gate electrodes 1012c and 1014c are defined as channel regions of the TFTs. Also, in the region where the pixel TFT 1104 of an LDD structure is formed, a region of the semiconductor layer 1007 overlapped with the first-layer gate electrode 1015d is defined as a channel region of the TFT in the same manner.

Next, through an ashing process and washing with an organic solvent, the resist patterns 1024 and 1025 as masks for the third doping process are removed. Thereafter, the general photolithography process is performed to form resist patterns 1034 to 1036 as a mask for doping an impurity. In this case, the above resist patterns 1034 to 1036 are formed so as to open on the regions where the p-channel TFT 1102 constituting the driver circuit 1106 of a GOLD structure and the storage capacitor 1105 are formed (see FIG. 16B).

Next, as a fourth doping process, the ion doping apparatus is used to implant a p-type impurity including a boron element at a large dosage by the through-doping method. Through the fourth doping process concerned, in the region where the p-channel TFT 1102 constituting the driver circuit 1106 of a GOLD structure is formed, high concentration impurity regions (p+ regions) 1037 doped with a p-type impurity are formed in portions of the semiconductor layer 1005 corresponding to regions positioned outside the first-layer gate electrode 1013d. In addition, in portions of the semiconductor layer 1005 corresponding to exposed regions of the first-layer gate electrode 1013d which protrude from the second-layer gate electrode 1013c, low concentration impurity regions (p− regions) 1038 doped with a p-type impurity are simultaneously formed. The high concentration impurity regions (p+ regions) 1037 thus formed function as a source/drain region of a GOLD structure. The low concentration impurity regions (p− regions) 1038 function as an electric field relaxation region as the Lov region (electric field relaxation region overlapped with the gate electrode) of a GOLD structure. On the other hand, also in the region where the storage capacitor 1105 is formed, high concentration impurity regions (p+ regions) 1039 and low concentration impurity regions (p− regions) 1040 are formed, which function as one electrode for forming a capacitor in the same manner (see FIG. 16B).

Here, in the high concentration impurity regions (p+ regions) 1037 doped with a p-type impurity in the region where the p-channel TFT 1102 is formed, the low concentration impurity regions (n−− regions) 1020 doped with an n-type impurity have been formed. However, the p-type impurity is implanted at a concentration equal to or higher than that of an n-type impurity, so that the high concentration impurity regions (p+ regions) 1037 having a p-type conductivity as a whole are formed. Also, the high concentration impurity regions (n+ regions) 1032 and the low concentration impurity regions (n− regions) 1033 which are both doped with a n-type impurity have been formed also in the region where the storage capacitor 1105 is formed. However, the p-type impurity is implanted at a concentration equal to or higher than that of an n-type impurity, so that the high concentration impurity regions (p+ regions) 1039 and the low concentration impurity regions (p− regions) 1040 having a p-type conductivity as a whole are formed. Note that, the high concentration impurity regions (p+ regions) 1037, 1039 and the low concentration impurity regions (p− regions) 1038, 1040 which are both doped with a p-type impurity are simultaneously formed by the through-doping method utilizing the difference in film material or film thickness of the upper-layer film in the same manner as in the n-type impurity regions. In this case, the following doping conditions are conceivable: diborane $(B_2H_6)$/hydrogen $(H_2)$ with diborane $(B_2H_6)$ contained at an amount corresponding to a diborane $(B_2H_6)$ dilution ratio of 3 to 20% is used as an ion source; an acceleration voltage is set to 60 to 100 kV; and a dosage is set to $4 \times 10^{15}$ to $1 \times 10^{17}$ ions/cm². In this embodiment, implantation is conducted under the following doping conditions: diborane $(B_2H_6)$/hydrogen $(H_2)$ with diborane $(B_2H_6)$ contained at an amount corresponding to a diborane $(B_2H_6)$ dilution ratio of 5% is used; an acceleration voltage is set to 80 kV; and a dosage is set to $2 \times 10^{16}$ ions/cm² (see FIG. 16B).

Next, through the ashing process and washing with the organic solvent, the resist patterns 1034 to 1036 as a mask for the fourth doping process are removed. A first interlayer insulating film 1041 made of a silicon oxynitride film having a thickness of 150 nm is then deposited by a plasma CVD method. Following this, for thermal activation of an n-type impurity (phosphorous element) or a p-type impurity (boron element) doped into the semiconductor layers 1004 to 1008, heat treatment is conducted in an annealing furnace at 600° C. for 12 hours. The heat treatment concerned is performed for a thermal activation process of the n-type or p-type impurity. In addition, it is performed in order to getter the catalytic element (nickel element) existing in the channel region directly below the gate electrode by the above impurity as well. Here, the above thermal activation process may be performed before the deposition of the first interlayer insulating film 1041, but when a wiring material for the gate electrode etc. is low in heat resistance, it is preferable to perform the process after the deposition of the first interlayer insulating film 1041. Subsequently to the above heat treatment, in order to terminate dangling bonds in the semiconductor layers 1004 to 1008, a hydrogenation process is performed at 410° C. for 1 hour in a nitrogen atmosphere containing 3% of hydrogen (see FIG. 17A).

Next, on the first interlayer insulating film 1041, a second interlayer insulating film 1042 made of an acrylic resin film having a thickness of 1.6 μm is formed. The above acrylic resin film can be formed by applying it by a spin-coating method, followed by heat treatment in an oven-baking furnace. Subsequently, through the generally used photolithography and dry etching processes, contact holes 1043 with a predetermined size are formed so as to pass through the second interlayer insulating film 1042 and the first interlayer insulating film 1041, and further the gate insulating film 1018 made of a silicon oxide film as a lower-layer film. Note that, the contact holes 1043 are formed so as to connect with the high concentration impurity regions (n+ regions) 1026, 1028, and 1030 doped with an n-type impurity and the high concentration impurity regions (p+ regions) 1037 and 1039 doped with a p-type impurity, and further a source wiring electrode 1017cd (consisting of the first-layer source wiring electrode 1017d and the second-layer source wiring electrode 1017c) functioning as a source wiring (see FIG. 17B).

Next, conductive metallic wirings 1044 to 1049 are formed so as to achieve an electrical connection with the high concentration impurity regions (n+ regions) 1026, 1028 and the high concentration impurity regions (p+ regions) 1037 of the driver circuit 1106. Also, connection electrodes 1050, 1052, and 1053 and a gate wiring 1051 in a pixel region 1107 are formed using the same conductive material. In this embodiment, as a material for forming the metallic wirings 1044 to 1049, the connection electrodes 1050, 1052, and 1053, and the gate wiring 1051, a lamination film of a Ti film having a thickness of 50 nm and an Al—Ti alloy film having a thickness of 500 nm is employed. The connection electrode 1050 is formed so as to electrically connect the high concentration impurity regions ($n^+$ regions) 1030 and the second-layer source wiring electrode 1017c serving as a source wiring. The connection electrode 1052 is formed so as to electrically connect with the high concentration impurity regions ($n^+$ regions) 1030 in the pixel TFT 1104 and the connection electrode 1053 is formed so as to electrically connect with the high concentration impurity regions ($p^+$ regions) 1039 of the storage capacitor 1105. Also, the gate wiring 1051 is formed so as to electrically connect the plural second-layer gate electrodes 1015c of the pixel TFT 1104 with each other (see FIG. 18A).

Next, a transparent conductive film made of an ITO (indium-tin-oxide) film etc. having a thickness of 80 to 120 nm is deposited and then, a pixel electrode 1054 is formed through photolithography and wet etching processes. The pixel electrode 1054 is electrically connected with the high concentration impurity region ($n^+$ region) 1030 functioning as a source/drain region of the pixel TFT 1104 through the connection electrode 1052 and further electrically connected with the high concentration impurity region ($p^+$ region) 1039 of the storage capacitor 1105 through the connection electrode 1053 as well (see FIG. 18B).

Through the above steps, an active matrix liquid crystal display device having the n-channel TFTs 1101, 1103 and the p-channel TFT 1102 of a GOLD structure, and the pixel TFT 1104 of an LDD structure can be manufactured. In the steps of forming the gate electrode, the storage capacitor electrode, and the source wiring electrode of the above active matrix liquid crystal display device, there is adapted a dry etching step of one-step process or two-step process using an ICP dry etching apparatus. This makes it possible to solve the problems inherent to the prior art in the dry etching step, that is, problems concerning, for example, decrease in throughput in the dry etching step and increase in process cost resulting from consumption amount increase of etching gas, and further decrease in yield of a semiconductor device resulting from the complicated dry etching step.

As described above, the manufacturing method for the active matrix liquid crystal display device including a semiconductor device having the TFT of a GOLD structure has been specifically described, but the present invention can be modified in various manners without departing from the gist thereof. Needless to say, the present invention is applicable to, for example, a manufacturing method for an active matrix organic EL display device including a semiconductor device having a TFT of a GOLD structure.

EMBODIMENT 2

In this embodiment, a description will be made on a specific example of an electronic device incorporating the semiconductor display device manufactured by applying a dry etching method less in process steps to processing on the gate electrode of the semiconductor device including the TFT of a GOLD structure. As the above semiconductor display device, there are an active matrix liquid crystal display device, an EL display device, and the like. The semiconductor display device is applied to a display portion of the various types of electronic devices. Here, specific examples of the electronic device in which the semiconductor display device is applied to its display portion are described with reference to FIGS. 19A to 21C.

Note that, examples of the electronic device in which the semiconductor display device is applied to its display portion include a video camera, a digital camera, a projector (rear type or front type), a head mounted display (goggle type display), a game machine, a car navigation system, a personal computer, and a portable digital assistant (mobile computer, cellular phone, electronic dictionary, or the like).

Figure 19A:
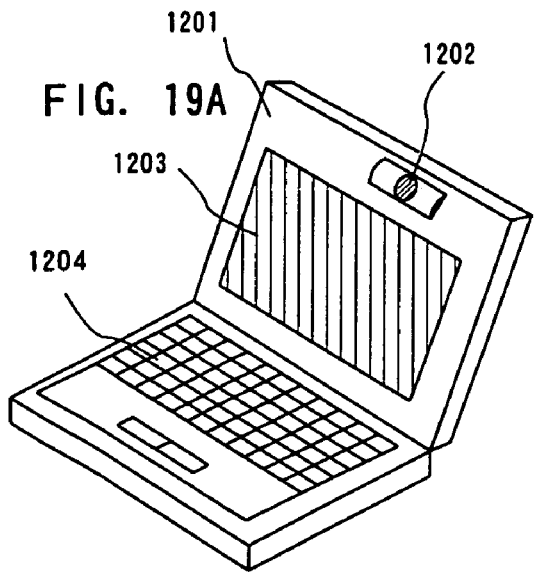
FIGS. 19A to 19F are schematic diagrams showing examples of electronic devices each of which is incorporated with a semiconductor display device.

FIG. 19A shows a personal computer composed of a main body 1201, a video input portion 1202, a display device 1203, and a keyboard 1204. The semiconductor display device of the present invention is applicable to the above display device 1203 and other circuits.

Figure 19B:
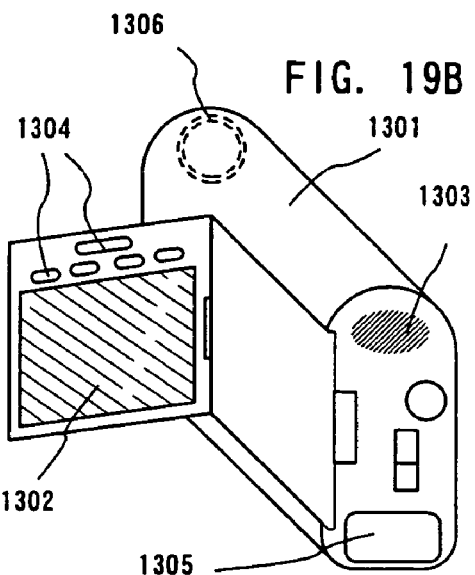

FIG. 19B shows a video camera composed of a main body 1301, a display device 1302, a voice input portion 1303, operation switches 1304, a battery 1305, and an image receiving portion 1306. The semiconductor display device of the present invention is applicable to the above display device 1302 and other circuits.

Figure 19C:
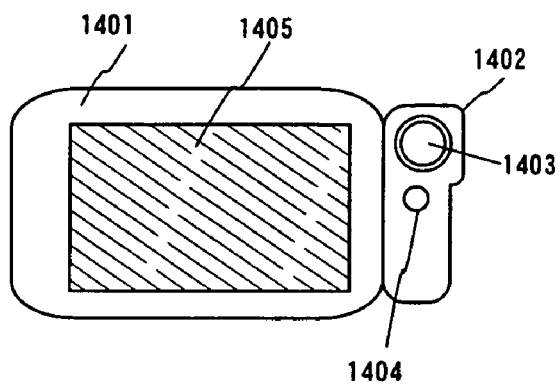

FIG. 19C shows a mobile computer composed of a main body 1401, a camera portion 1402, an image receiving portion 1403, an operation switch 1404, and a display device 1405. The semiconductor display device of the present invention is applicable to the above display device 1405 and other circuits.

Figure 19D:
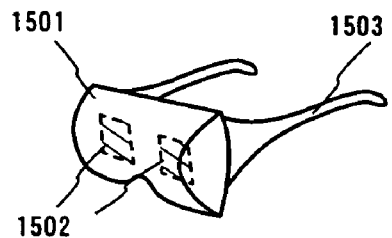

FIG. 19D shows a goggle type display composed of a main body 1501, display devices 1502, and arm portions 1503. The semiconductor display device of the present invention is applicable to the above display devices 1502 and other circuits.

Figure 19E:
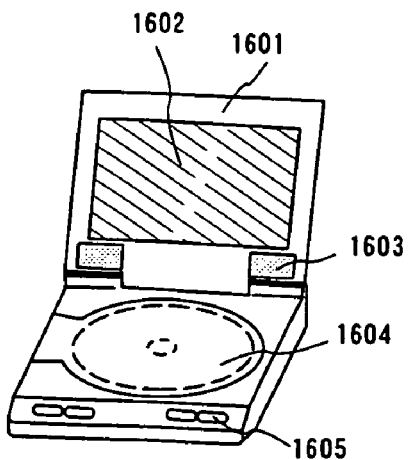

FIG. 19E shows a player for a recording medium having a program recorded therein (hereinafter, simply referred to as recording medium), which is composed of a main body 1601, a display device 1602, speaker portions 1603, a recording medium 1604, and operation switches 1605. Note that, this device employs a DVD, a CD, etc., as a recording medium, which can be used for music appreciation, a game, or Internet. The semiconductor display device of the present invention is applicable to the above display device 1602 and other circuits.

Figure 19F:
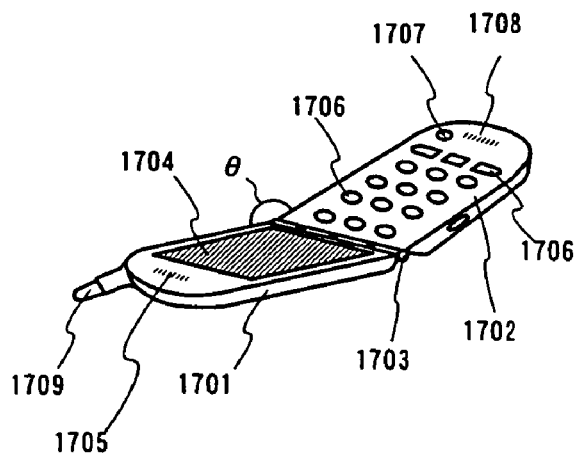

FIG. 19F shows a cellular phone composed of a display panel 1701, an operation panel 1702, a connecting portion 1703, a display portion 1704, a voice output portion 1705, operation keys 1706, a power switch 1707, a voice input portion 1708, and an antenna 1709. The display panel 1701 and the operation panel 1702 are connected with each other in the connecting portion 1703. The angle θ made by a plane where the display portion 1704 of the display panel 1701 is positioned and a plane where the operation keys 1706 of the operation panel 1702 are positioned can be arbitrarily changed in the connecting portion 1703. Note that, the semiconductor display device of the present invention is applicable to the above display portion 1704 and other circuits.

FIG. 20A shows a front-type projector composed of light source optical system and display device 1801 and a screen 1802. The semiconductor display device of the present invention is applicable to the above display device 1801 and other circuits.

FIG. 20B shows a rear-type projector composed of a main body 1901, light source optical system and display device 1902, mirrors 1903 and 1904, and a screen 1905. The semiconductor display device of the present invention is applicable to the above display device 1902 and other circuits.

Further, FIG. 20C shows an example of a structure of the light source optical system and display device 1801 shown in FIG. 20A and the light source optical system and display device 1902 shown in FIG. 20B. The light source optical system and display device 1801 and the light source optical system and display device 1902 are each composed of a light source optical system 2001, mirrors 2002 and 2004 to 2006, a dichroic mirror 2003, an optical system 2007, a display device 2008, a retardation plate 2009, and a projection optical system 2010. The projection optical system 2010 is composed of a plurality of optical lenses provided with the projection lens. This structure is called a 3-CCD system because the three display devices 2008 are used. It is possible to appropriately arrange an optical lens and a film having a polarization function, a film for adjusting a phase difference, an IR film, or the like in some midpoint of an optical path indicated by the arrow of FIG. 20C.

FIG. 20D shows an example of a structure of the light source optical system 2001 shown in FIG. 20C. In this embodiment, the light source optical system 2001 is composed of a reflector 2011, a light source 2012, lens arrays 2013, 2014, a polarization conversion element 2015, and a condensing lens 2016. Note that, the light source optical system 2001 shown in the figure is only employed as an example. Needless to say, the system is not limited to the above structure. For example, it is possible to additionally provide for the light source optical system 2001 the optical lens and the film having a polarization function, the film for adjusting a phase difference, the IR film, or the like as appropriate (see FIGS. 20A to 20D).

Figure 21A:
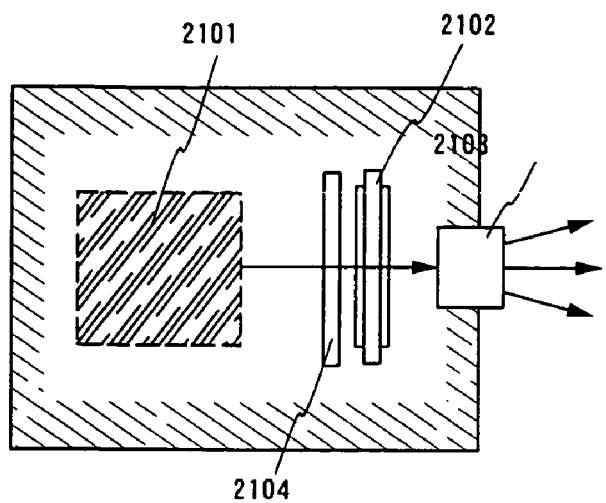
FIGS. 21A to 21C are schematic diagrams showing examples of electronic devices each of which is incorporated with a semiconductor display device.

FIG. 21A shows an example of a single CCD system. Light source optical system and display device shown in FIG. 21A is composed of a light source optical system 2101, a display device 2102, a projection optical system 2103, and a retardation plate 2104. The projection optical system 2103 is composed of a plurality of optical lenses provided with a projection lens. The light source optical system and display device shown in the figure is applicable to the light source optical system and display device 1801 of FIG. 20A and the light source optical system and display device 1902 of FIG. 20B. Also, the light source optical system of FIG. 20D may be used for the light source optical system 2101. Further, the display device 2102 is additionally provided with a color filter (not shown), which enables a color video display.

Figure 21B:
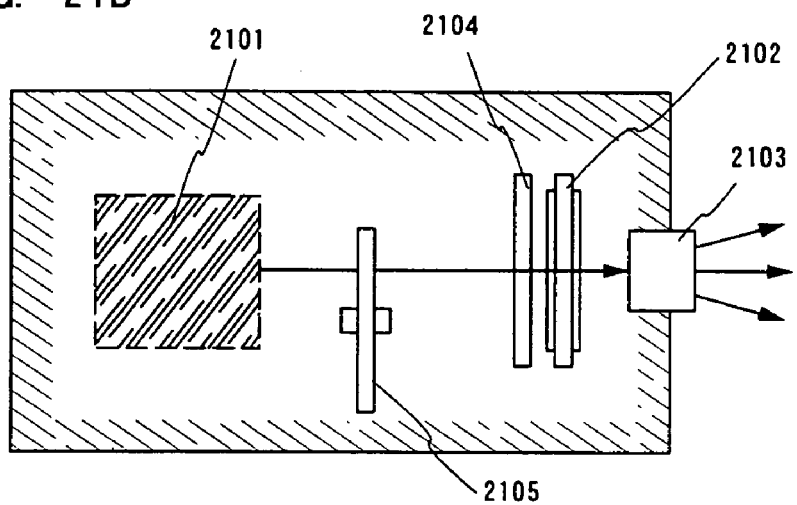

Light source optical system and display device shown in FIG. 21B is an application of that shown in FIG. 21A, to which a rotation color filter disc 2105 of RGB is applied to achieve the color video display instead of additionally arranging the color filter. The light source optical system and display device shown in the figure is applicable to the light source optical system and display device 1801 of FIG. 20A and the light source optical system and display device 1902 of FIG. 20B.

Figure 21C:
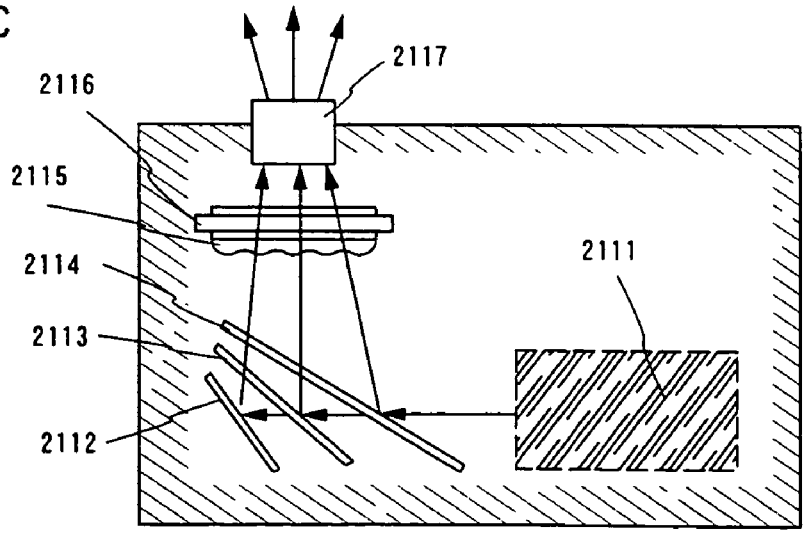

Light source optical system and display device shown in FIG. 21C is called a color-filterless single CCD system. In this system, a microlens array 2115 is additionally provided in a display device 2116, to which a dichroic mirror (green) 2112, a dichroic mirror (red) 2113, and a dichroic mirror (blue) 2114 are applied to achieve the color video display. A projection optical system 2117 is composed of a plurality of optical lenses provided with a projection lens. The light source optical system and display device shown in the figure is applicable to the light source optical system and display device 1801 of FIG. 20A and the light source optical system and display device 1902 of FIG. 20B. Also, an optical system using a coupling lens and a collimator lens in addition to the light source may be applied to a light source optical system 2111 (see FIGS. 21A to 21C).

As described above, the present invention can be implemented in an extremely wide application range thereof and applied to various electronic devices incorporating the semiconductor display device such as an active matrix liquid crystal display device or an EL display device.

Effects of the present invention will be cited below.

As a first effect of the present invention, the invention is effective in improvement of the throughput in the dry etching step.

As a second effect of the present invention, the invention is effective in reduction of a consumption amount of the etching gas.

As a third effect of the present invention, the invention is effective also in improvement of the yield of the semiconductor device by suppressing defects and troubles in association with a simplified dry etching step.

What is claimed is:

1. A method of manufacturing a semiconductor device, comprising:
   forming a semiconductor film over an insulating substrate;
   forming an insulating film over the semiconductor film;
   forming a first conductive film over the insulating film;
   forming a second conductive film over the first conductive film;
   forming a mask over the second conductive film; and
   performing an Inductively-Coupled-Plasma etching process to etch the second conductive film and the first conductive film and thereby exposing a portion of the insulating film such that the second conductive film is shorter in one direction than the first conductive film,
   wherein an exposed portion of the first conductive film and an exposed portion of the second conductive film by the Inductively-Coupled-Plasma etching are used as a part of an electrode.

2. A method according to claim 1, wherein an Inductively-Coupled-Plasma etching process is performed using etching gases containing fluorine gas, chlorine gas, and oxygen.

3. A method according to claim 2, wherein the fluorine gas is $SF_6$, and the chlorine gas is $Cl_2$.

4. A method according to claim 1, wherein the insulating film comprises silicon oxide.

5. A method according to claim 1, wherein the first conductive film has a thickness of 5 to 50 nm.

6. A method according to claim 1, wherein the second conductive film has a thickness of 200 to 600 nm.

7. A method according to claim 1, wherein a chamber pressure during the Inductively-Coupled-Plasma etching process is in a range of 1.0 to 1.6 Pa.

8. A method according to claim 1, wherein an ICP power during the Inductively-Coupled-Plasma etching process is in a range of 1.02 to 2.04 W/cm$^2$.

9. A method according to claim 1, wherein a bias power density during the Inductively-Coupled-Plasma etching process is in a range of 0.03 to 0.19 W/cm$^2$.

10. A method according to claim 1, wherein the electrode is a gate electrode.

11. A method of manufacturing a semiconductor device, comprising:
    forming a first conductive film comprising tantalum over an insulating film;
    forming a second conductive film comprising tungsten over the first conductive film;
    forming a mask over the second conductive film; and
    performing an Inductively-Coupled-Plasma etching process to etch the second conductive film and the first conductive film and thereby exposing a portion of the insulating film such that the second conductive film is shorter in one direction than the first conductive film, wherein an exposed portion of the first conductive film and an exposed portion of the second conductive film by the Inductively-Coupled-Plasma etching are used as a part of an electrode.

12. A method according to claim 11, wherein an Inductively-Coupled-Plasma etching process is performed using etching gases containing fluorine gas, chlorine gas, and oxygen.

13. A method according to claim 12, wherein the fluorine gas is $SF_6$, and the chlorine gas is $Cl_2$.

14. A method according to claim 11, wherein the insulating film comprises silicon oxide.

15. A method according to claim 11, wherein the first conductive film has a thickness of 5 to 50 nm.

16. A method according to claim 11, wherein the second conductive film has a thickness of 200 to 600 nm.

17. A method according to claim 11, wherein a chamber pressure during the Inductively-Coupled-Plasma etching process is in a range of 1.0 to 1.6 Pa.

18. A method according to claim 11, wherein an ICP power density during the Inductively-Coupled-Plasma etching process is in a range of 1.02 to 2.04 $W/cm^2$.

19. A method according to claim 11, wherein a bias power density during the Inductively-Coupled-Plasma etching process is in a range of 0.03 to 0.19 $W/cm^2$.

20. A method according to claim 11, wherein the electrode is a gate electrode.

21. A method of manufacturing a semiconductor device, comprising:
    forming a semiconductor film over an insulating substrate;
    forming an insulating film over the semiconductor film;
    forming a first conductive film over the insulating film;
    forming a second conductive film over the first conductive film;
    forming a mask over the second conductive film; and
    performing an Inductively-Coupled-Plasma etching process to etch the second conductive film and the first conductive film and thereby exposing a portion of the insulating film such that the second conductive film is shorter in one direction than the first conductive film,
    wherein an exposed portion of the first conductive film and an exposed portion of the second conductive film by the Inductively-Coupled-Plasma etching are used as a part of an electrode.

22. A method according to claim 21, wherein an Inductively-Coupled-Plasma etching process is performed using etching gases containing fluorine gas, chlorine gas, and oxygen.

23. A method according to claim 22, wherein the fluorine gas is $SF_6$, and the chlorine gas is $Cl_2$.

24. A method according to claim 21, wherein the insulating film comprises silicon oxide.

25. A method according to claim 21, wherein the first conductive film has a thickness of 5 to 50 nm.

26. A method according to claim 21, wherein the first conductive film comprises one of tantalum nitride and tantalum.

27. A method according to claim 21, wherein the second conductive film has a thickness of 200 to 600 nm.

28. A method according to claim 21, wherein the second conductive film comprises one of tungsten, tungsten nitride, and a compound containing tungsten as a main constituent.

29. A method according to claim 21, wherein a chamber pressure during the Inductively-Coupled-Plasma etching process is in a range of 1.0 to 1.6 Pa.

30. A method according to claim 21, wherein an ICP power density during the Inductively-Coupled-Plasma etching process is in a range of 1.02 to 2.04 $W/cm^2$.

31. A method according to claim 21, wherein a bias power density during the Inductively-Coupled-Plasma etching process is in a range of 0.03 to 0.19 $W/cm^2$.

32. A method according to claim 21, wherein the electrode is a gate electrode.

33. A method of manufacturing a semiconductor device, comprising:
    forming a semiconductor film over an insulating substrate;
    forming an insulating film over the semiconductor film;
    forming a first conductive film comprising tantalum over the insulating film;
    forming a second conductive film comprising tungsten over the first conductive film;
    forming a mask over the second conductive film; and
    performing an Inductively-Coupled-Plasma etching process to etch the second conductive film and the first conductive film and thereby exposing a portion of the insulating film such that the second conductive film is shorter in one direction than the first conductive film,
    wherein an exposed portion of the first conductive film and an exposed portion of the second conductive film by the Inductively-Coupled-Plasma etching are used as a part of an electrode.

34. A method according to claim 33, wherein an Inductively-Coupled-Plasma etching process is performed using etching gases containing fluorine gas, chlorine gas, and oxygen.

35. A method according to claim 34, wherein the fluorine gas is $SF_6$, and the chlorine gas is $Cl_2$.

36. A method according to claim 33, wherein the insulating film comprises silicon oxide.

37. A method according to claim 33, wherein the first conductive film has a thickness of 5 to 50 nm.

38. A method according to claim 33, wherein the second conductive film has a thickness of 200 to 600 nm.

39. A method according to claim 33, wherein a chamber pressure during the Inductively-Coupled-Plasma etching process is in a range of 1.0 to 1.6 Pa.

40. A method according to claim 33, wherein an ICP power density during the Inductively-Coupled-Plasma etching process is in a range of 1.02 to 2.04 $W/cm^2$.

41. A method according to claim 33, wherein a bias power density during the Inductively-Coupled-Plasma etching process is in a range of 0.03 to 0.19 $W/cm^2$.

42. A method according to claim 33, wherein the electrode is a gate electrode.

* * * * *